(12) United States Patent
Chiba et al.

(10) Patent No.: US 8,335,144 B2
(45) Date of Patent: Dec. 18, 2012

(54) LASER DRIVING APPARATUS, LASER DRIVING METHOD, OPTICAL APPARATUS, OPTICAL UNIT AND PULSE CURRENT GENERATION CIRCUIT

(75) Inventors: Hiroyuki Chiba, Kanagawa (JP); Motoi Kimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 331 days.

(21) Appl. No.: 12/662,034

(22) Filed: Mar. 29, 2010

(65) Prior Publication Data
US 2010/0272138 A1   Oct. 28, 2010

(30) Foreign Application Priority Data

Apr. 27, 2009   (JP) .................................. 2009-107524

(51) Int. Cl.
G11B 7/00   (2006.01)
(52) U.S. Cl. ...................... 369/59.11; 369/116; 369/47.5
(58) Field of Classification Search .................. 369/116, 369/59.11, 59.12, 47.5, 47.53, 47.51
See application file for complete search history.

(56) References Cited

U.S. PATENT DOCUMENTS

| | | | | |
|---|---|---|---|---|
| 2004/0013068 A1* | 1/2004 | Kato et al. | ................. | 369/59.11 |
| 2004/0095853 A1* | 5/2004 | Masui et al. | ................ | 369/13.24 |
| 2004/0252614 A1* | 12/2004 | Kato et al. | ................. | 369/59.11 |
| 2005/0069002 A1* | 3/2005 | Senga et al. | ................ | 372/38.01 |
| 2005/0243879 A1* | 11/2005 | Horiuchi et al. | ............ | 372/38.02 |

FOREIGN PATENT DOCUMENTS

| | | |
|---|---|---|
| JP | 2005-340774 | 12/2005 |
| JP | 4008748 | 9/2007 |

* cited by examiner

*Primary Examiner* — Thang Tran
(74) *Attorney, Agent, or Firm* — Rader Fishman & Grauer, PLLC

(57) ABSTRACT

Disclosed herein is a laser driving apparatus, including: a driving unit adapted to current drive a laser device with a current value in accordance with a level of a signal supplied thereto; and an emission light waveform correction unit adapted to receive supply of a pulsed reference signal and generate, based on a correction timing pulse interlocked with a rising edge and/or a falling edge of a pulse, a correction signal having a level different from that of the reference signal and then supply the correction signal to the driving unit so that the shape of the emission light waveform of the laser device becomes close to that of a rectangular wave.

18 Claims, 42 Drawing Sheets

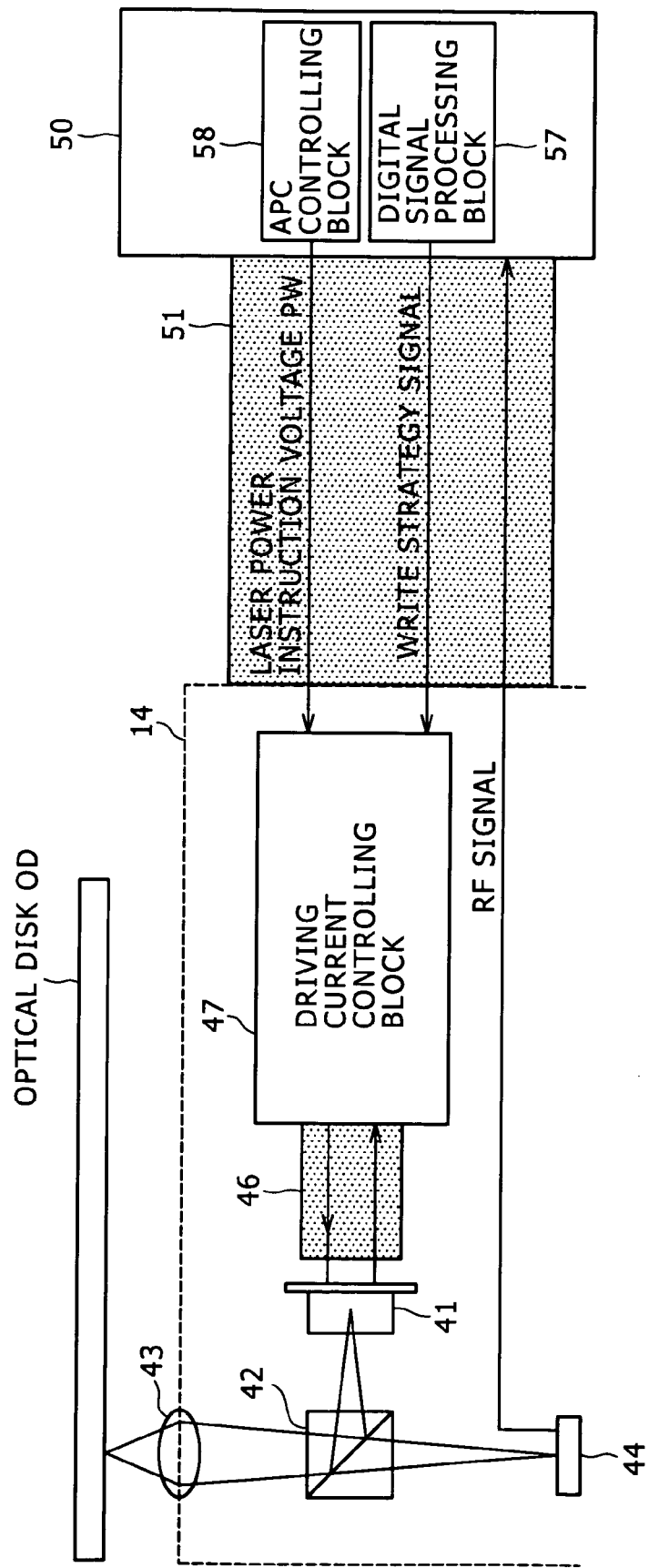

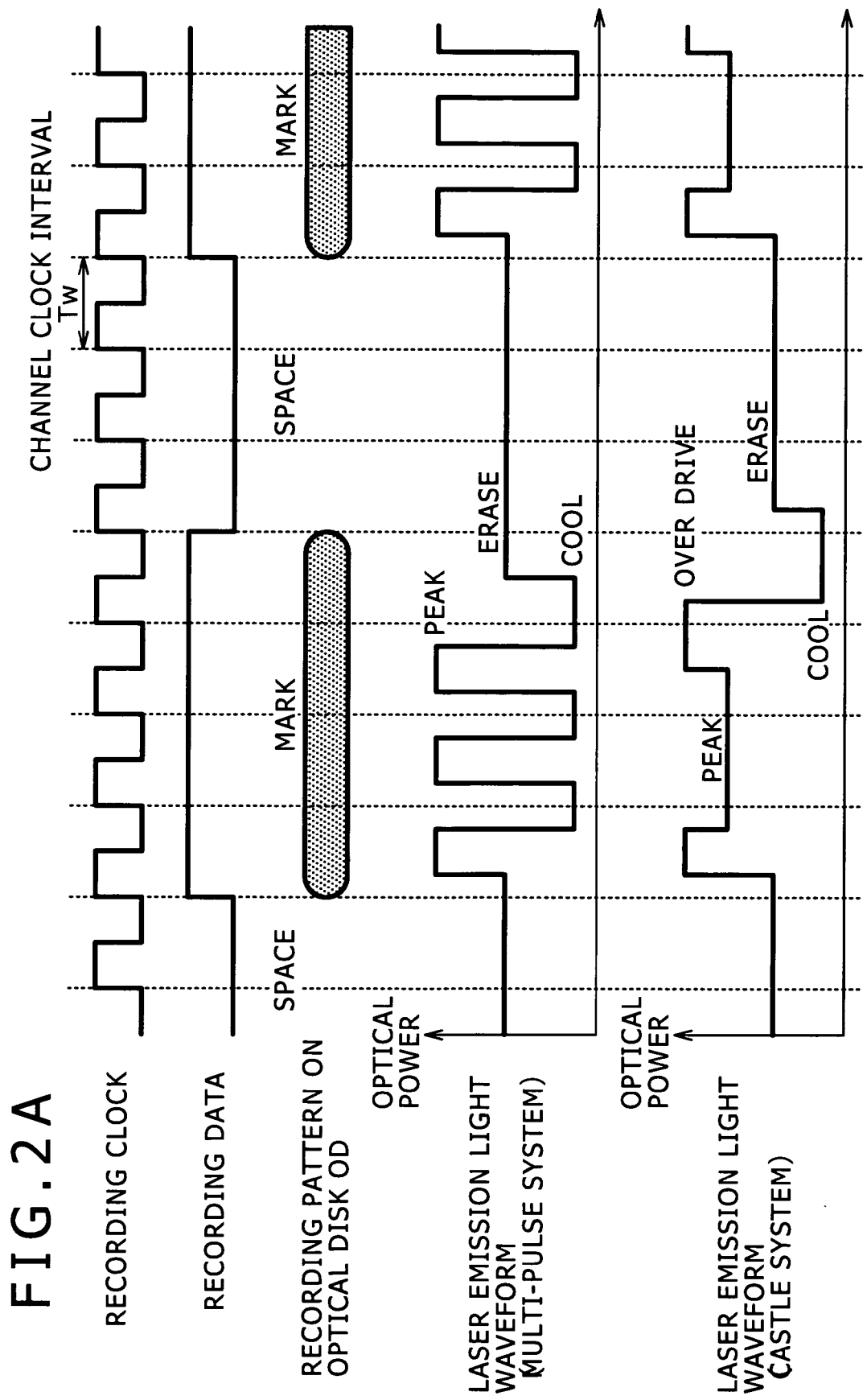

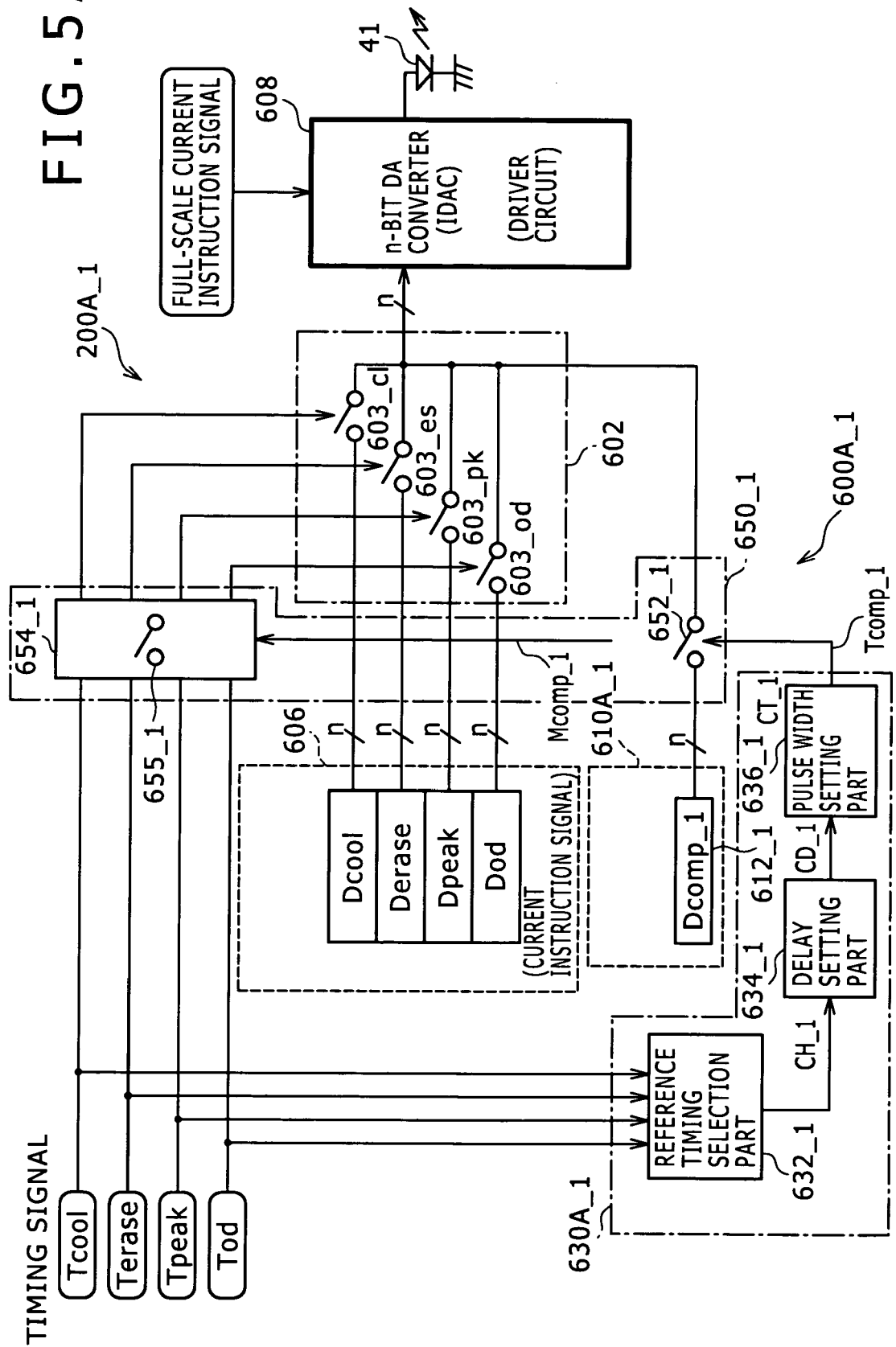

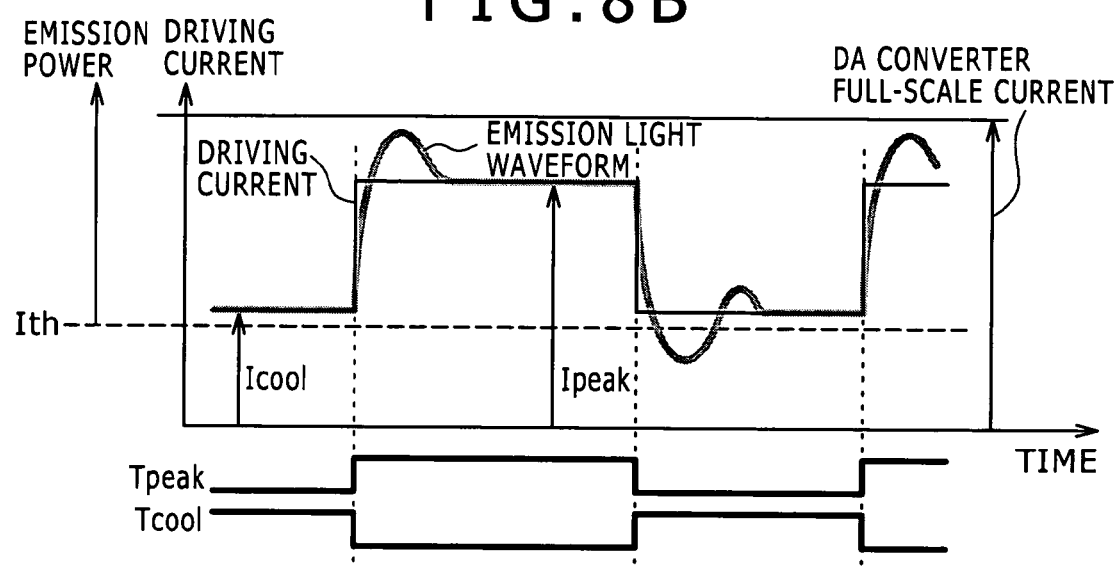
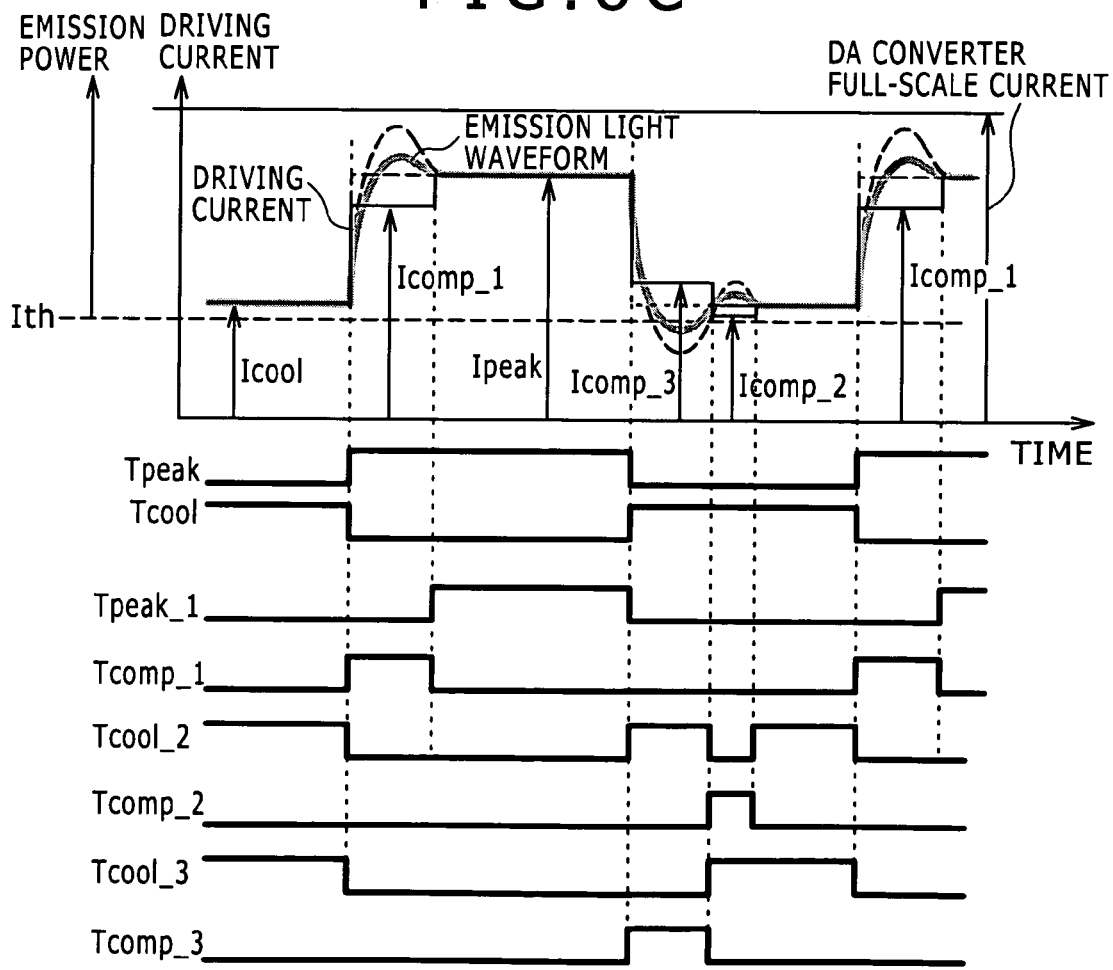

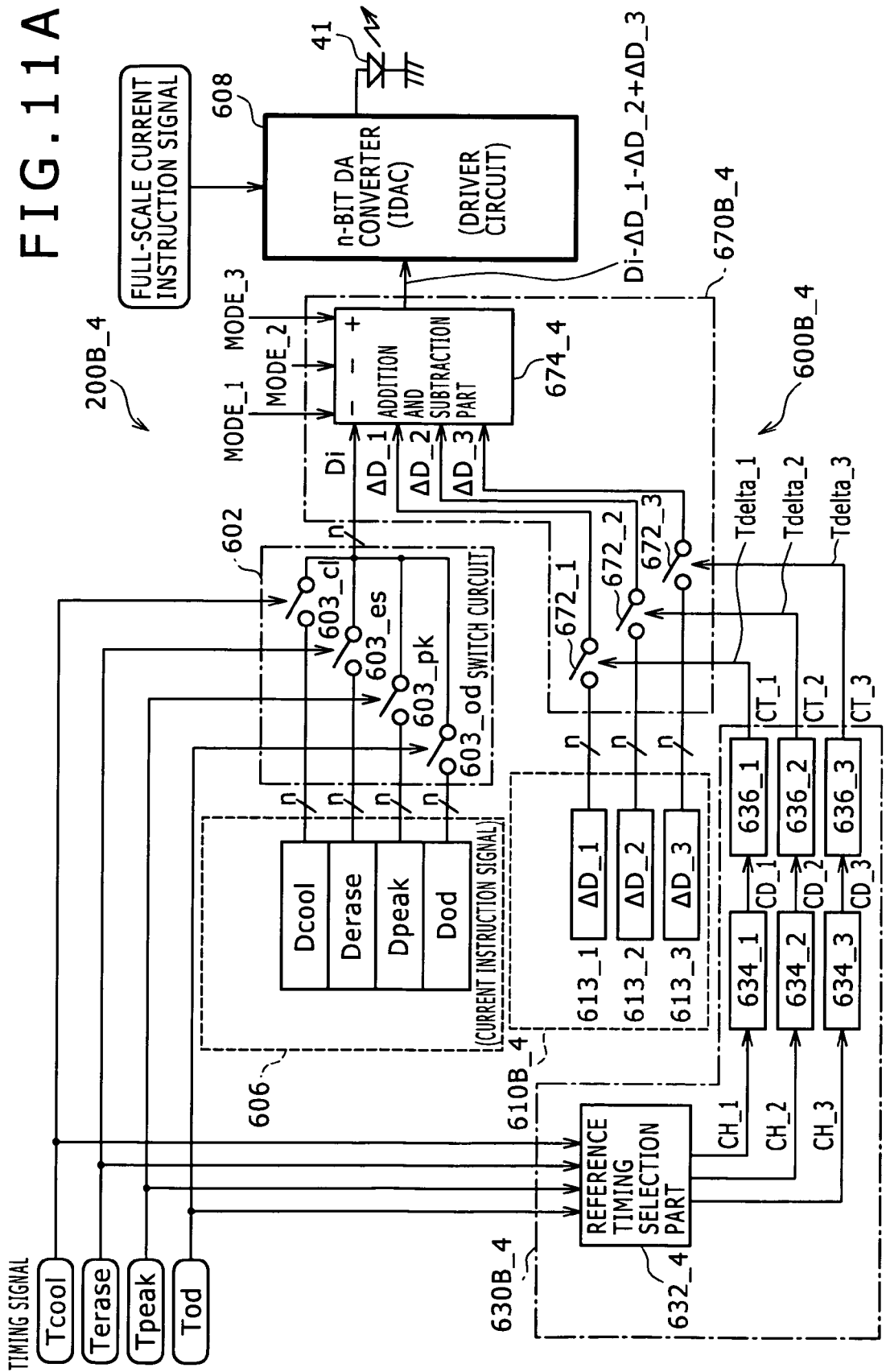

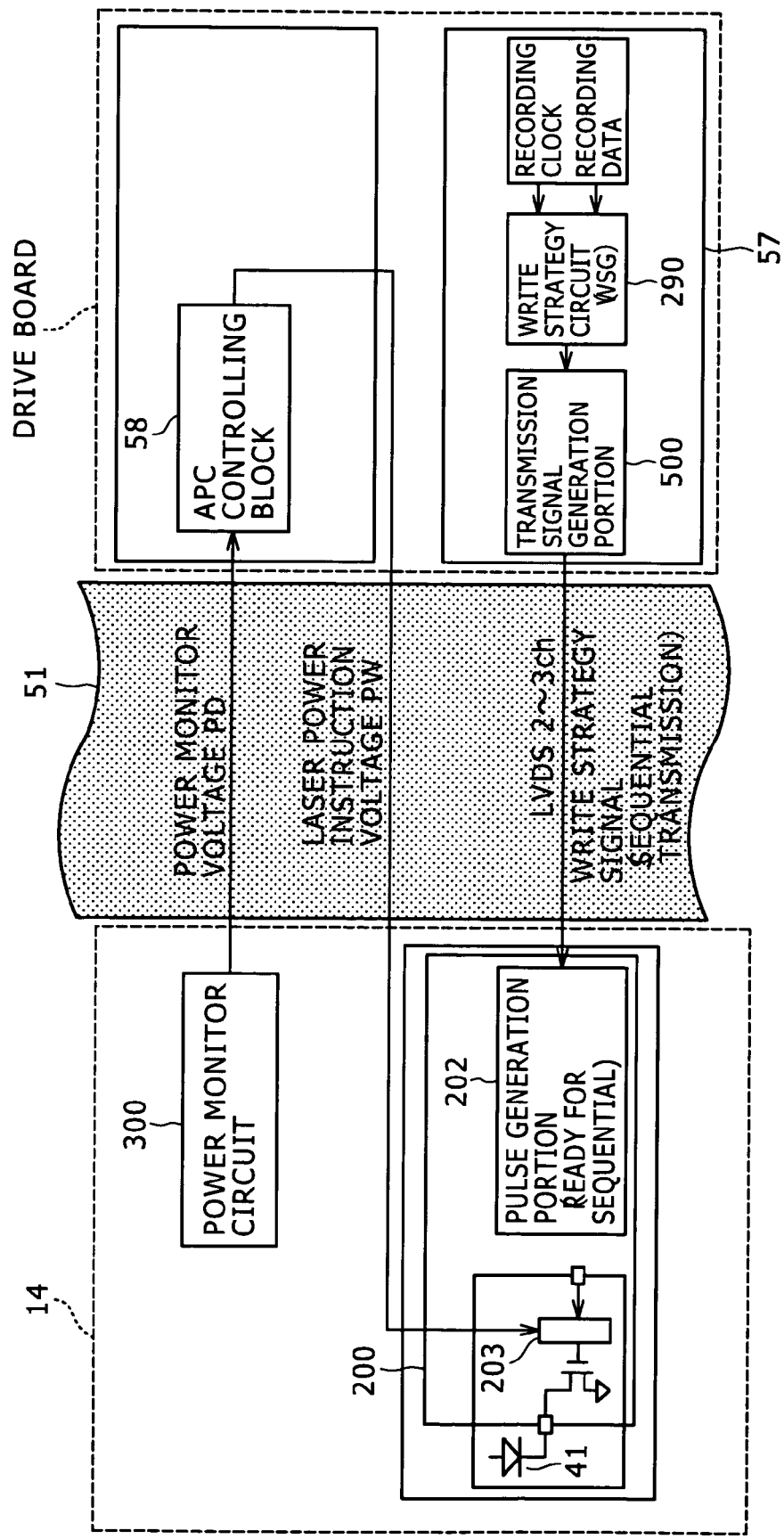

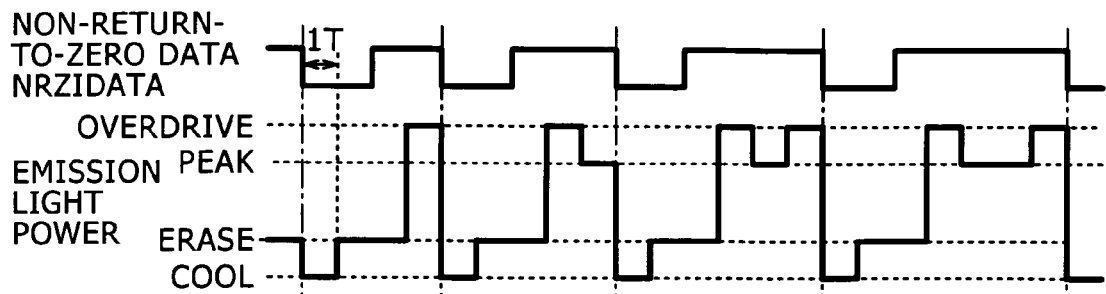
FIG. 14B
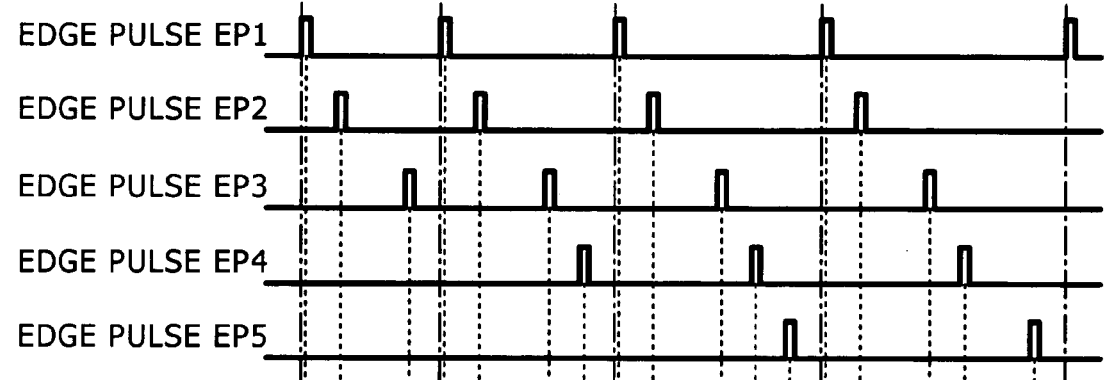
FIG. 14C
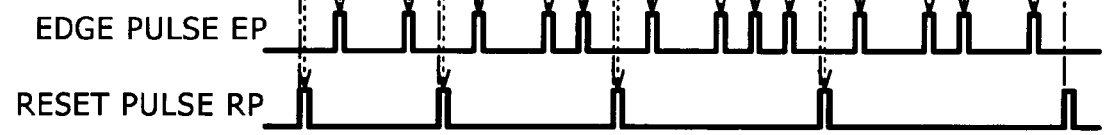
FIG. 14D
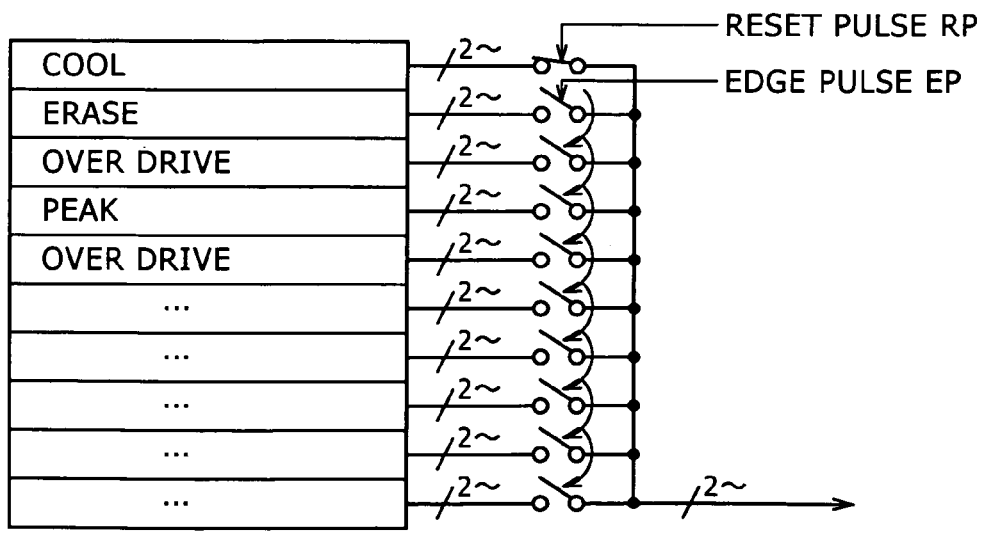

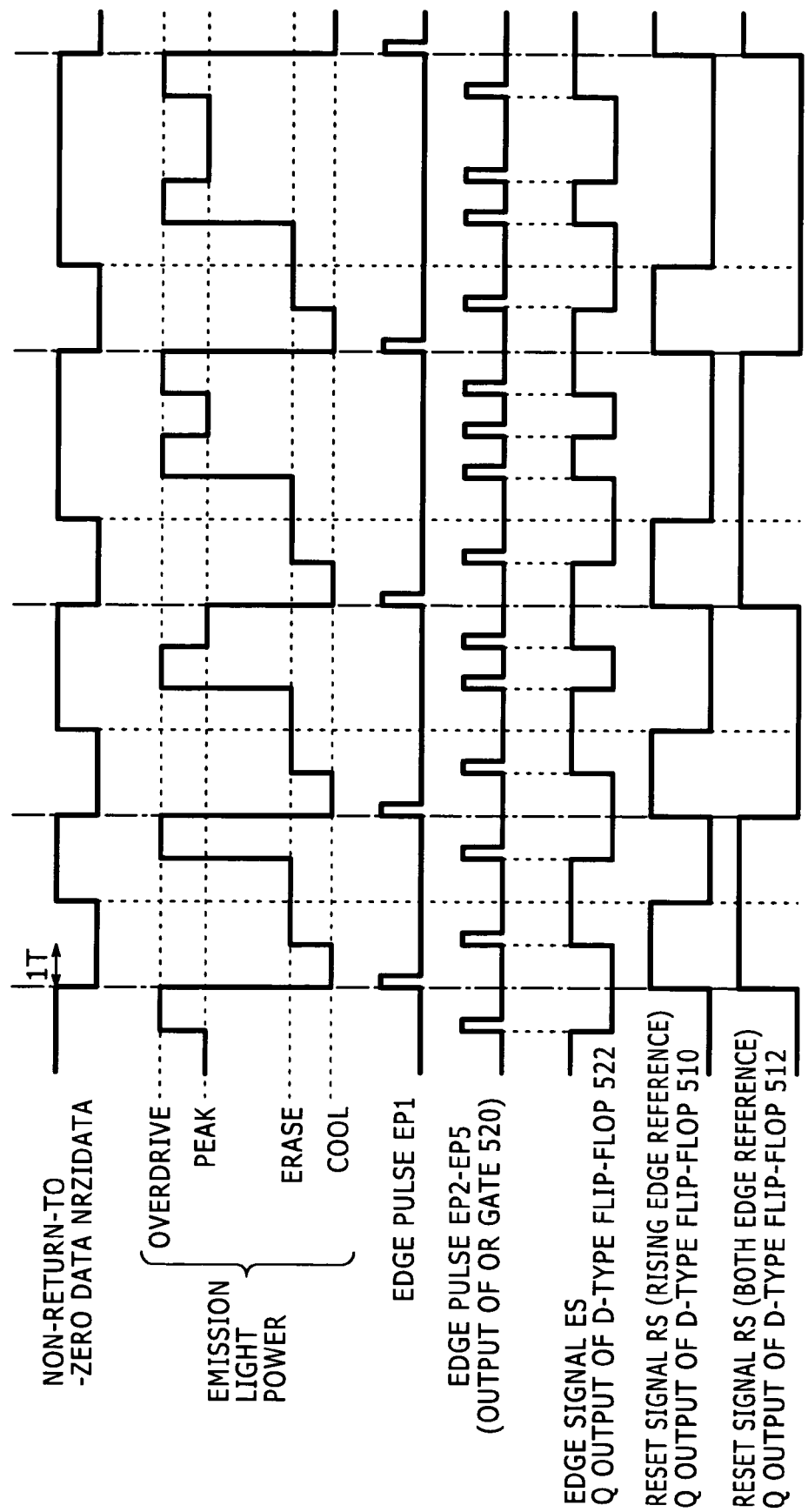

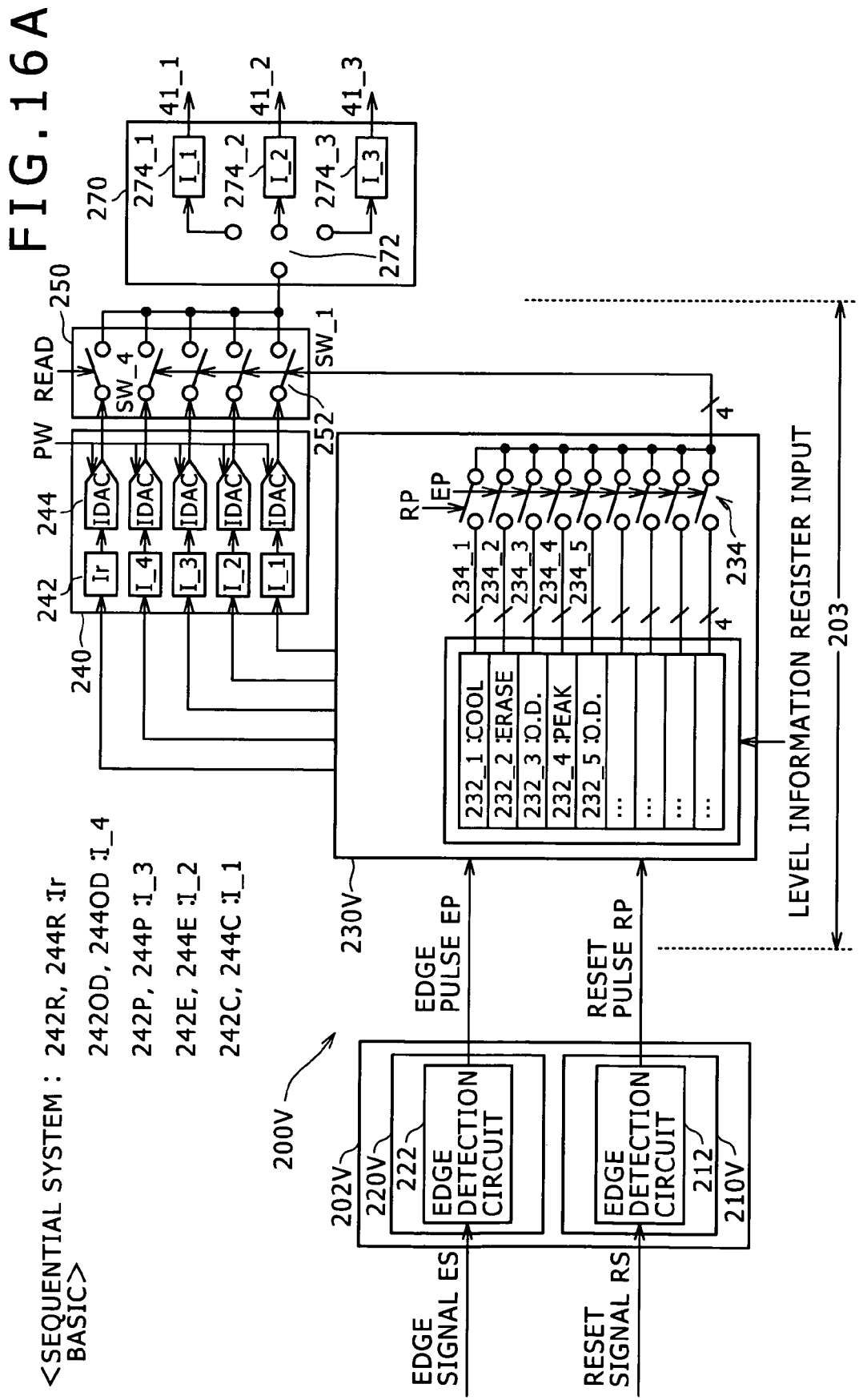

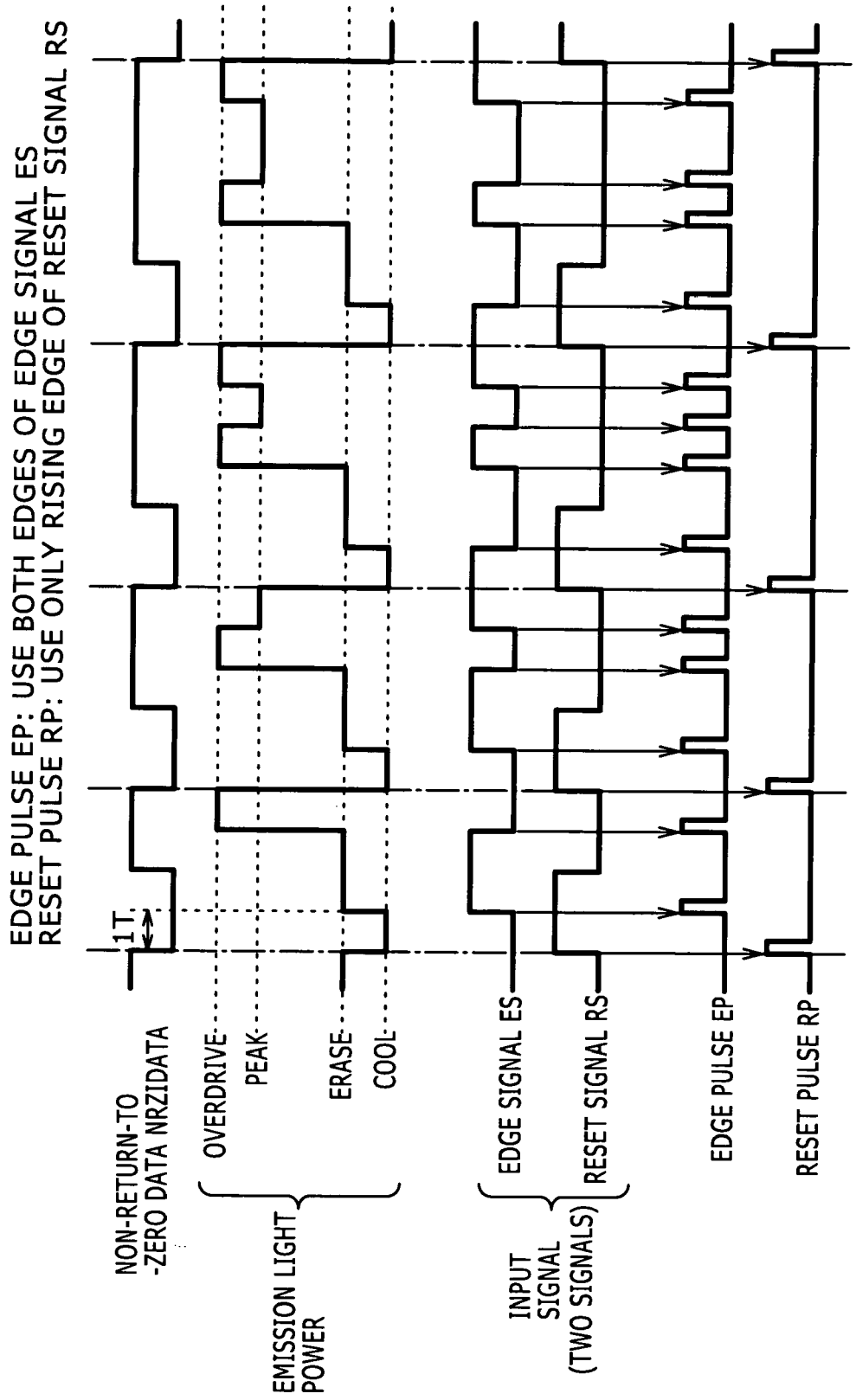

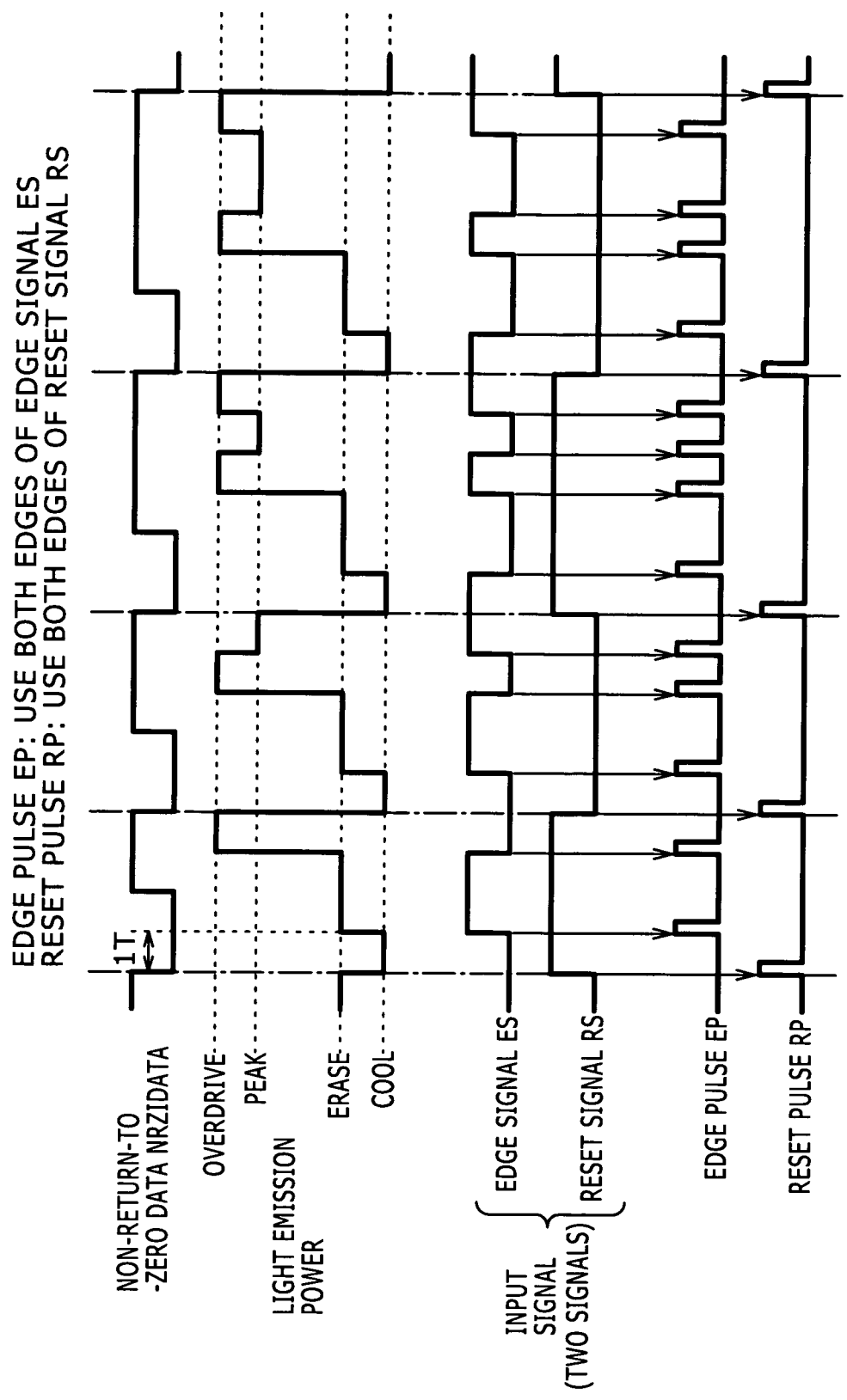

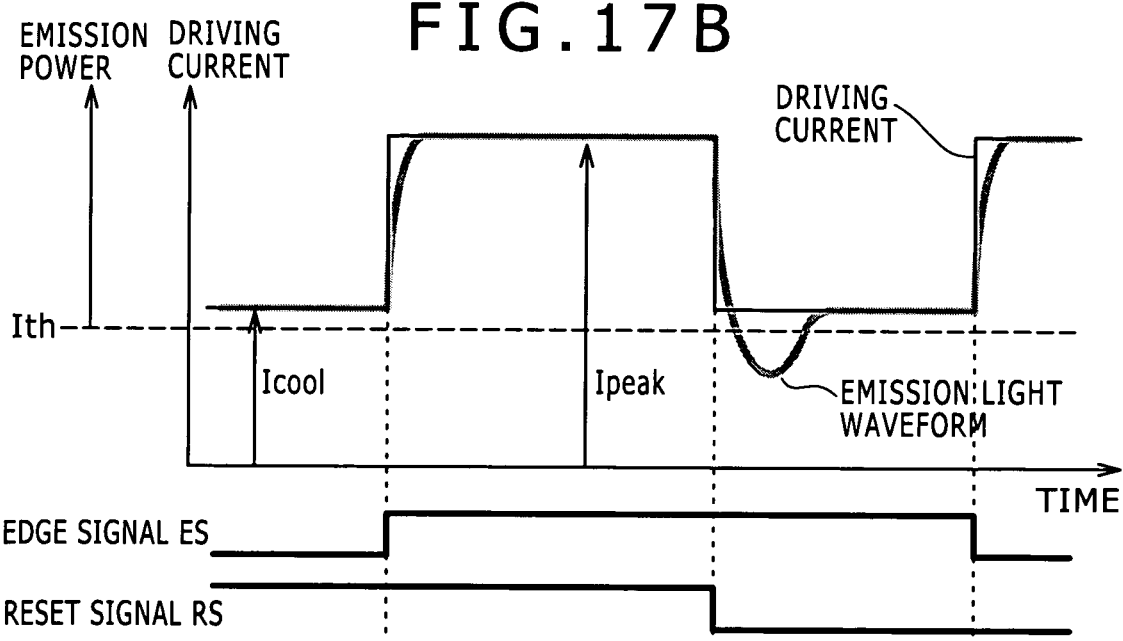
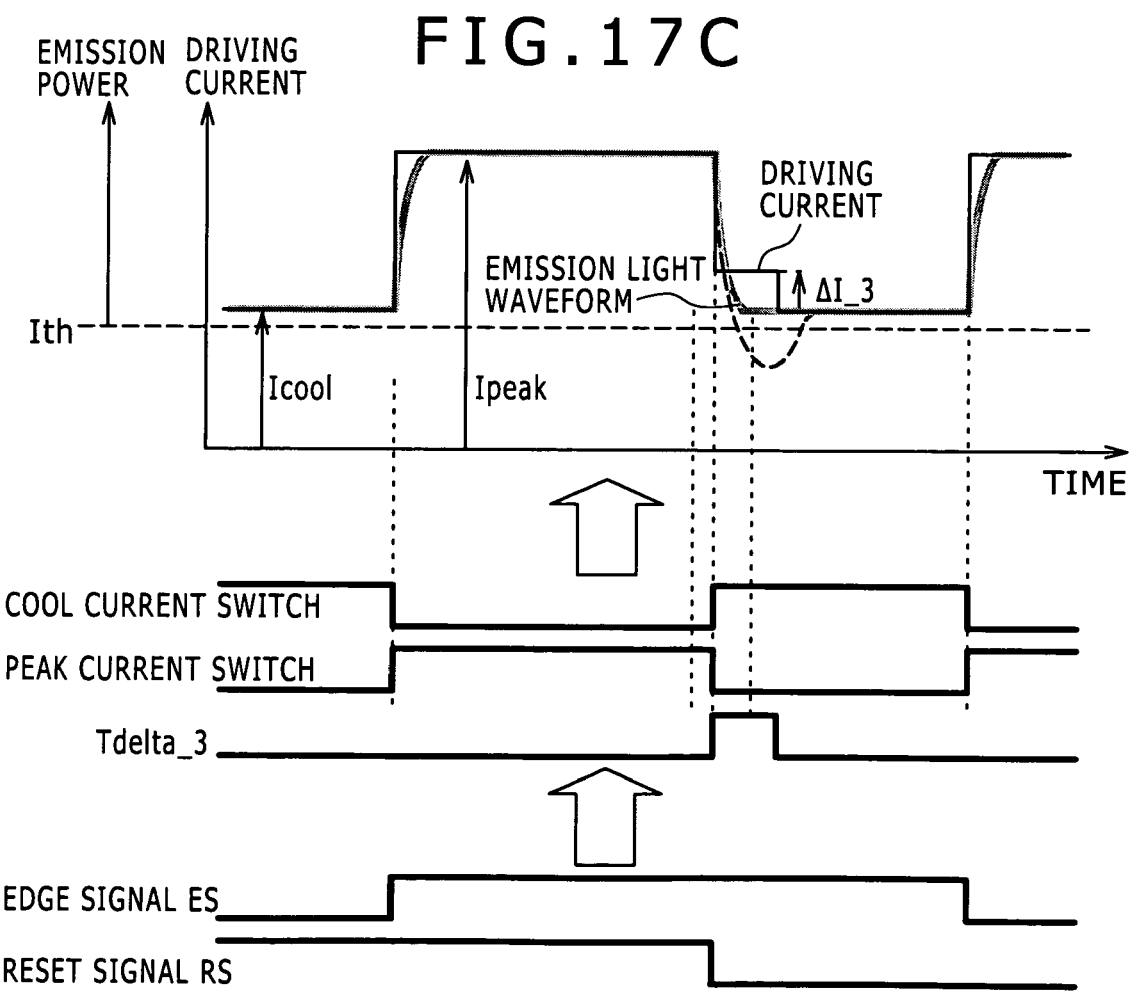

LASER DRIVING APPARATUS, LASER DRIVING METHOD, OPTICAL APPARATUS, OPTICAL UNIT AND PULSE CURRENT GENERATION CIRCUIT

BACKGROUND OF THE INVENTION

1. Field of the Invention

This invention relates to a laser driving apparatus, a laser driving method, an optical apparatus, an optical unit and a pulse current generation circuit, and more particularly to a correction technique for a load response waveform such as a laser emission light waveform.

2. Description of the Related Art

In an optical apparatus such as, for example, an optical disk apparatus or a light emitting apparatus which uses an optical cable or optical fiber, a system for pulse-driving a laser device is sometimes adopted. However, with this system, since the laser device is changed over at a high rate between light emission and no-light emission states, an overshoot, an undershoot, ringing, a response delay and so forth appear. Therefore, the system described is disadvantageous in that light emitted from the laser device does not exhibit a rectangular waveform.

Thus, a countermeasure for correcting, where a laser device is driven by pulses, the shape of the emission light waveform thereof so that driving current for the laser device may have a waveform as close as possible to a rectangular waveform has been proposed. Such a countermeasure as just described is disclosed, for example, in Japanese Patent Laid-Open No. 2005-340774 (hereinafter referred to as Patent Document 1) and Japanese Patent No. 4008748 (hereinafter referred to as Patent Document 2).

In Patent Document 1, a suppression current supplying circuit for supplying suppression current for moderating decrease of driving current after an overshoot which appears at a rising edge of driving current to be supplied from a driving current supplying circuit to a laser device is provided. The suppression current supplying circuit adds such current as to correct the shape of an emission light waveform and implements an appropriate shape of an emission light waveform by adjusting the timing and current value of the correction current. Patent Document 2 discloses a mechanism similar to that disclosed in Patent Document 1 but adapted to generate a timing signal, which defines a timing at which correction current is to be applied, based on a driving pulse.

SUMMARY OF THE INVENTION

However, the mechanisms of Patent Documents 1 and 2 add such current as to correct the shape of an emission light waveform to laser driving current and require an outputting stage for correction for supplying correction current to a laser device in addition to an existing outputting stage for driving the laser device with pulses. Therefore, the mechanisms are disadvantageous in that an increased number of outputting stages are required.

Therefore, it is desirable to provide a mechanism which can correct an emission light waveform so as to have a rectangular waveform without increasing the number of devices for driving a load such as a laser device.

According to the present invention, there is provide a laser driving apparatus including a driving unit adapted to current drive a laser device with a current value in accordance with a level of a signal supplied thereto, and an emission light waveform correction unit adapted to receive supply of a pulsed reference signal and generate, based on a correction timing pulse interlocked with a rising edge and/or a falling edge of a pulse, a correction signal having a level different from that of the reference signal and then supply the correction signal to the driving unit so that the shape of the emission light waveform of the laser device becomes close to that of a rectangular wave.

In short, the emission light waveform correction unit which serves as a driving signal correction unit which corrects a driving signal in advance is provided at a preceding stage to the driving unit serving as an outputting circuit for driving a load to pulse current such as a laser device. In other words, driving current is supplied to the outputting circuit after a driving signal for the driving current is corrected in advance.

Since the correction function for the emission light waveform is complete at the preceding stage to the outputting circuit, an existing outputting circuit can be used as the outputting circuit, and an additional device for driving the load such as the laser device, for example, a driving transistor or a DA converter of the current outputting type, is not required at all.

In summary, with the laser driving apparatus, the emission light waveform can be corrected without increasing the number of devices for driving a load such as a laser device, and waveform correction over a wide range similar to that achieved by a method of adding a specific outputting stage for waveform correction can be achieved.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 1B is a schematic view showing an example of a configuration of an optical pickup;

FIG. 2A is a waveform diagram illustrating a basis of a write strategy technique;

FIG. 5A is a block diagram showing a configuration of a first example of a first mode of emission light waveform correction;

FIGS. 8B and 8C are waveform diagrams illustrating operation of the configuration shown in FIG. 8A;

FIG. 11A is a block diagram showing a configuration of a second example of the second mode of emission light waveform correction;

FIG. 14A is a block diagram showing a system configuration of a second embodiment of the present invention;

FIGS. 14B to 14D illustrate a basic principle of the laser driving system of the second embodiment;

FIG. 15C is a waveform diagram illustrating operation of the transmission signal generation portion of FIGS. 15A and 15B;

FIG. 16A is a block diagram showing a laser driving circuit of the sequential system;

FIGS. 16C and 16D are waveform diagrams illustrating first and second examples of operation of the laser driving circuit of FIG. 16A;

FIGS. 17B and 17C are waveform diagrams illustrating operation of the configuration of FIG. 17A;

DETAILED DESCRIPTION OF THE PREFERRED EMBODIMENTS

Figure 1A:
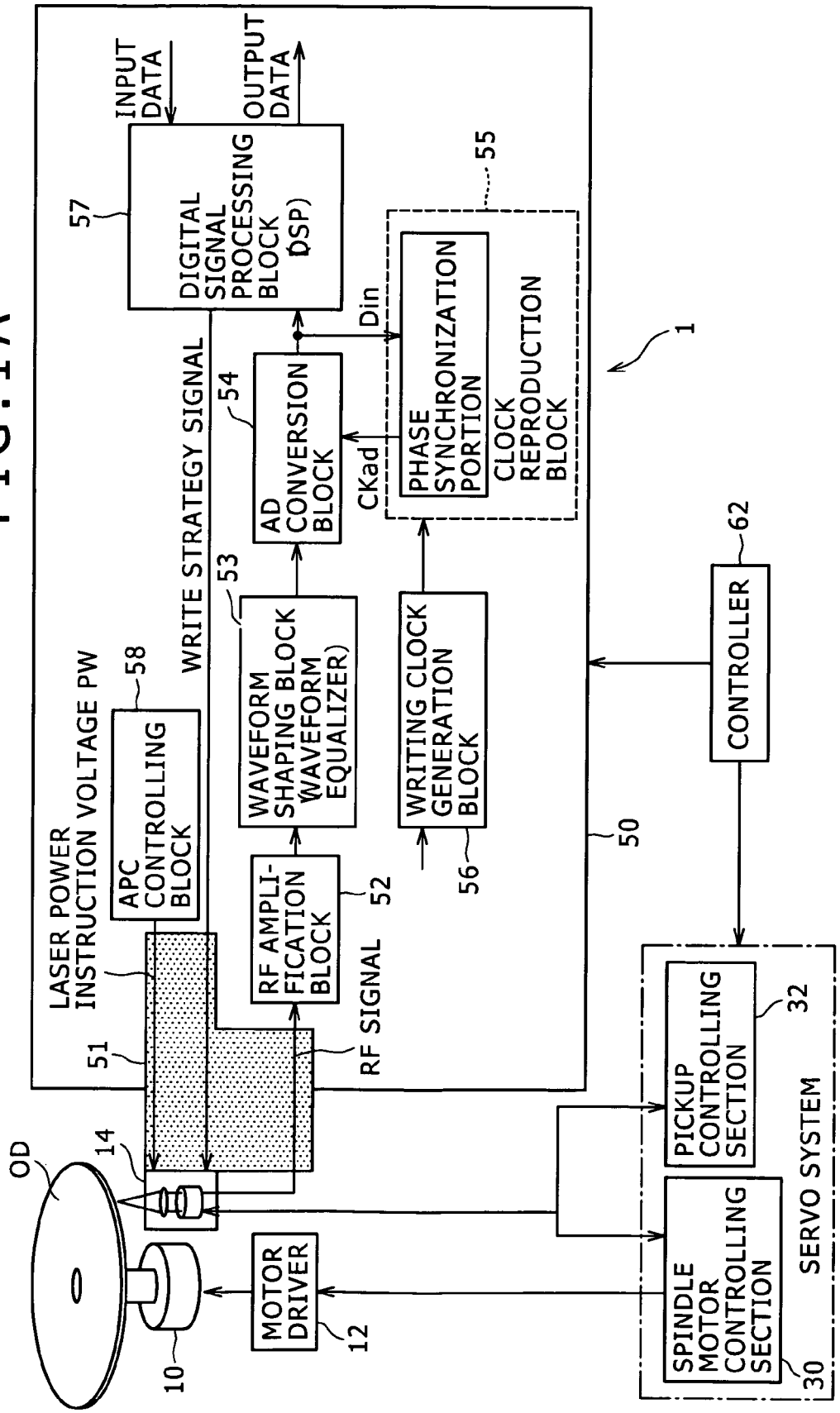
FIG. 1A is a block diagram showing an example of a configuration of a recording and reproduction apparatus which is an example of an optical apparatus.

In the following, embodiments of the present invention are described with reference to accompanying drawings. Where each functional element is to be distinguished among different embodiments, a capital letter of the alphabet like A, B, C, . . . is annexed as a suffix to a reference character, but where each functional element is not to be distinguished among different embodiments, the reference character is used without such a suffix as given above. This similarly applies also to the drawings. It is to be noted that the description is given in the following manner.

1. General Configuration of the Recording and Reproduction Apparatus
2. Optical Disk Recording Method: write strategy technique
3. Problems of Laser Driving and Principle of a Countermeasure Technique
4. System Configuration: first embodiment (channel timing transmission system)
5. Waveform Correction: first mode (DA system+correction level)
6. Waveform Correction: second mode (DA system+correction amount)
7. Waveform Correction: third mode (CONV system+correction amount)
8. System Configuration: second embodiment (sequential transmission system)
9. Waveform Correction: fourth mode
10. Waveform Correction: fifth mode
11. System Configuration: third embodiment (application to optical communication)

<General Configuration of the Recording and Reproduction Apparatus>

FIG. 1A shows an example of a configuration of a recording and reproduction apparatus in the form of an optical disk apparatus which is an example of an optical apparatus, and FIG. 1B shows an example of a configuration of an optical pickup.

Referring first to FIG. 1A, an optical disk OD is any of an optical disk of the CD (Compact Disk) type including a CD-ROM, a CD-R and a CD-RW, an MO (magneto-optical disk), an optical disk of the DVD (Digital Video or Versatile Disk) type and so forth. The optical disk of the DVD type may be an ordinary DVD such as a DVD-RAM, a DVD-R, a DVD+R, a DVD-RW or a DVD+WR or a next-generation DVD which utilizes, for example, a blue laser which emits light of a wavelength of approximately 405 nm.

The recording and reproduction apparatus 1 includes an optical pickup 14 and a pickup controlling section 32. The optical pickup 14 carries out recording or reproduction of information on or from the optical disk OD. The optical pickup 14 is controlled by the pickup controlling section 32 and controls a position in a radial direction (tracking servo) and a position in a focusing direction (focusing serve) at which a laser beam emitted from the optical pickup 14 is to be irradiated on the optical disk OD.

The recording and reproduction apparatus 1 includes, as a rotation controlling section, that is, a rotary servo system, a spindle motor 10, a motor driver 12 and a spindle motor driving section 30. The spindle motor 10 rotates the optical disk OD. The speed of rotation of the optical disk OD is controlled by the spindle motor driving section 30.

The recording and reproduction apparatus 1 includes, as a recording and reproduction system, a recording and reproduction signal processing section 50 which is an example of an information recording section for recording information through the optical pickup 14 and an information reproduction section for reproducing information recorded on the optical disk OD. The recording and reproduction signal processing section 50 and the optical pickup 14 are connected to each other by signal lines formed in a pattern on a flexible board 51 as an example of a transmission member for transmitting a signal.

The recording and reproduction apparatus 1 includes, as a controller system, a controller 62, an interface section not shown for an interface function, and so forth. The controller 62 is formed from a microprocessor (MPU: Micro Processor Unit) and controls operation of servo systems including the spindle motor driving section 30 and the pickup controlling section 32, and the recording and reproduction signal processing section 50. The interface section achieves an interface or connection function to and from a personal computer which is an example of an information processing apparatus (host apparatus) which carries out various information processes utilizing the recording and reproduction apparatus 1. The interface section includes a host IF (interface) controller. The recording and reproduction apparatus 1 and the personal computer cooperate to form an information recording and reproduction system or optical disk system.

Optical Pickup

Referring now to FIG. 1B, the optical pickup 14 includes a semiconductor laser 41, a prism 42, a lens 43, a photodetector 44 and a driving current controlling block 47. The driving current controlling block 47 is an example of a laser driving apparatus or laser driving circuit and is provided, for example, as a laser driving IC (Integrated Circuit). The semiconductor laser 41 and the driving current controlling block 47 are connected to each other by signal lines formed in a pattern on a flexible board 46 as an example. The semiconductor laser 41 emits laser light for recording additional information on the optical disk OD or reading information recorded on the optical disk OD. The prism 42 reflects the laser light from the semiconductor laser 41 toward the lens 43 side and introduces reading light or reflected light from the lens 43 to the photodetector 44. The lens 43 condenses the laser beam reflected from the prism 42 on the optical disk OD and introduces the reading light from the optical disk OD to the prism 42. The photodetector 44 converts the reading light into an electric signal. The driving current controlling block 47 is formed typically from a laser driving IC.

Recording and Reproduction Signal Processing Section

The recording and reproduction signal processing section 50 includes a RF amplification block 52, a waveform shaping block 53 in the form of a waveform equalizer, and an AD conversion block 54 (ADC: Analog to Digital Converter). The recording and reproduction signal processing section 50 further includes a clock reproduction block 55, a writing clock generation block 56, a digital signal processing block 57 formed from a DSP (Digital Signal Processor), and an APC (Automatic Power Control) controlling block 58.

The RF amplification block 52 amplifies a low-level RF (Radio Frequency) signal read by the optical pickup 14, that is, a reproduction RF signal, to a predetermined level. The waveform shaping block 53 shapes the waveform of the reproduction RF signal outputted from the RF amplification block 52. The AD conversion block 54 converts the reproduction RF signal in the form of an analog signal outputted from the waveform shaping block 53 into digital reproduction RF data Din.

The clock reproduction block 55 includes a phase synchronizing circuit in the form of a PLL (Phase Locked Loop) circuit of the data recovery type for generating a clock signal synchronized with the reproduction RF data Din outputted from the AD conversion block 54. The clock reproduction block 55 supplies the reproduced clock signal as an AD clock CKad, that is, as a sampling clock, to the AD conversion block 54 and further supplies the clock signal to other functioning blocks.

The digital signal processing block 57 includes, for example, as a functioning portion for reproduction, a data detection portion and a demodulation processing portion. The data detection portion carries out a PRML (Partial Response Maximum Likelihood) process and so forth to detect digital data from the reproduction RF data Din.

The demodulation processing portion carries out digital signal processing such as to demodulate a digital data string and decode audio data, video data and so forth. For example, the demodulation processing portion includes a demodulation part, an error correction code (ECC) correction part, an address decoding part and so forth and carries out demodulation, ECC correction and address decoding. Data after the demodulation is transferred to a host apparatus through the interface section.

The writing clock generation block 56 generates a writing clock to be used for modulation of data upon recording on the optical disk OD based on a reference clock supplied thereto from a crystal oscillator or the like. The digital signal processing block 57 includes, as a functioning portion for recording, an ECC encoding portion and a modulation processing portion. The digital signal processing block 57 generates recording data and generates light emission timing signals of different power levels in accordance with a write strategy.

The recording and reproduction apparatus 1 records digital data outputted from an information source on the optical disk OD and reproduces recorded information of the optical disk OD using a laser beam irradiated from the semiconductor laser 41. The driving current controlling block 47 supplies driving current in accordance with the write strategy to the semiconductor laser 41. The APC controlling block 58 has a function of controlling the light emission power of the semiconductor laser 41 to a fixed level based on a power monitor voltage PD and supplies a laser power instruction voltage PW to the driving current controlling block 47 of the optical pickup 14.

<Optical Disk Recording Method: Write Strategy Technique>

Figure 2B:
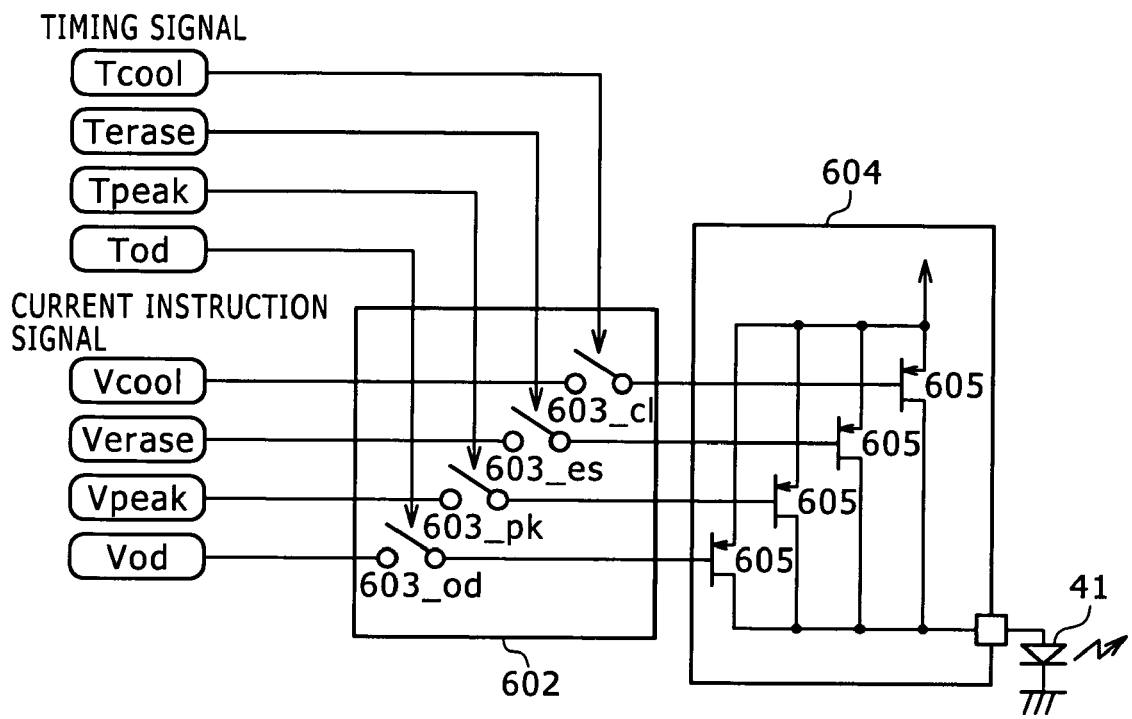
FIGS. 2B and 2C are a block diagram and a waveform diagram illustrating a first example of laser driving current generation.

FIG. 2A illustrates a basic write strategy technique, and FIGS. 2B and 2C, and 2D and 2E illustrate first and second examples of laser driving current generation.

Basis

As writable optical disks, a phase change disk, a magneto-optical disk and so forth are widely known. Except some magneto-optical disks, in order to record information on such optical disks as mentioned above, a light intensity modulation system of forming marks and spaces on a recording medium by intensity changes of a laser beam is used. In the light intensity modulation system, at a portion at which a recording mark is to be formed, a laser beam of such a high intensity as, for example, 30 mW or more is irradiated upon the optical disk. On the other hand, upon reproduction for reading out information, a laser beam of a lower intensity than that upon recording such as, for example, 1 mW is irradiated upon the optical disk so that the recording mark may not be destroyed.

As a data format for recording on an optical disk, mark edge recording which is superior in higher density recording has become the main current in recent years. The mark edge recording applies information to the opposite end positions of a recording mark, and a data error is caused by shape distortion of a mark. Therefore, in order to suppress shape distortion of a mark to achieve recording with reduced errors, for the strength variation of the optical power, not recording data itself but, for example, such waveforms as shown in FIG. 2A are used.

A multi-path system divides a recording clock to carry out pulse light emission. Such pulse light emission suppresses accumulation of heat and reduces shape distortion of marks. The example illustrated in FIG. 2A has three power levels or channels of cool, erase and peak.

A castle system is used principally in high speed recording but does not use pulse light emission in a unit of a recording clock. However, the castle method lowers the laser power at a central portion of a mark or sets the power at a rear end portion of a mark particularly to a low level to suppress accumulation of heat and reduce shape distortion of marks. The example shown in FIG. 2A uses four power levels or channels including cool, erase, peak and overdrive (OD) levels and thus uses an increased number of power levels in comparison with the multi-path method.

Further, all systems described above vary the laser power among multiple values. Further, the timing of each edge is adjusted in a unit smaller than the channel clock interval Tw. For example, the timing of each edge is adjusted in a unit of Tw/40, Tw/32 or Tw/16. The laser power or the timing of each edge is set appropriately in response to the recording material of the optical disk or the recording speed.

The scheme of a light emission pattern is called recording compensation (write strategy technique), and a timing of each edge in accordance with recording data is generated by a recording compensation circuit or write strategy circuit. Representative methods for generating multi-value laser driving current based on the write strategy technique are a conventional system and a DA converter system.

Conventional System

A first example illustrated in FIG. 2B includes an outputting circuit or channel corresponding to each power level provided in a driver circuit 604 and is used widely as a conventional system. In particular, the driver circuit 604 includes a number of outputting transistors 605 equal to the number of channels corresponding to the required number of levels. A switch circuit 602 for switching supply of a current instruction signal on and off is provided on the input side of the driver circuit 604. The switch circuit 602 includes a switch 603 for each of the channels. For each of the corresponding channels of a write strategy signal, a timing signal is supplied to a control input terminal of the switch 603, and a current instruction signal is supplied to an input terminal of the switch 603 while an output terminal of the switch 603 is connected to a control input terminal, that is, the gate, of one of the outputting transistors 605.

Switching on/off for the channels and output current for driving the semiconductor laser 41 are controlled independently of each other by current changeover pulses SW. Four channels of cool, erase, peak and overdrive are provided, and switching on/off of the channels is controlled with timing signals Tcool, Terase, Tpeak and Tod while the output current of the channels is controlled with current instruction signals Vcool, Verase, Vpeak and Vod.

Figure 2C:
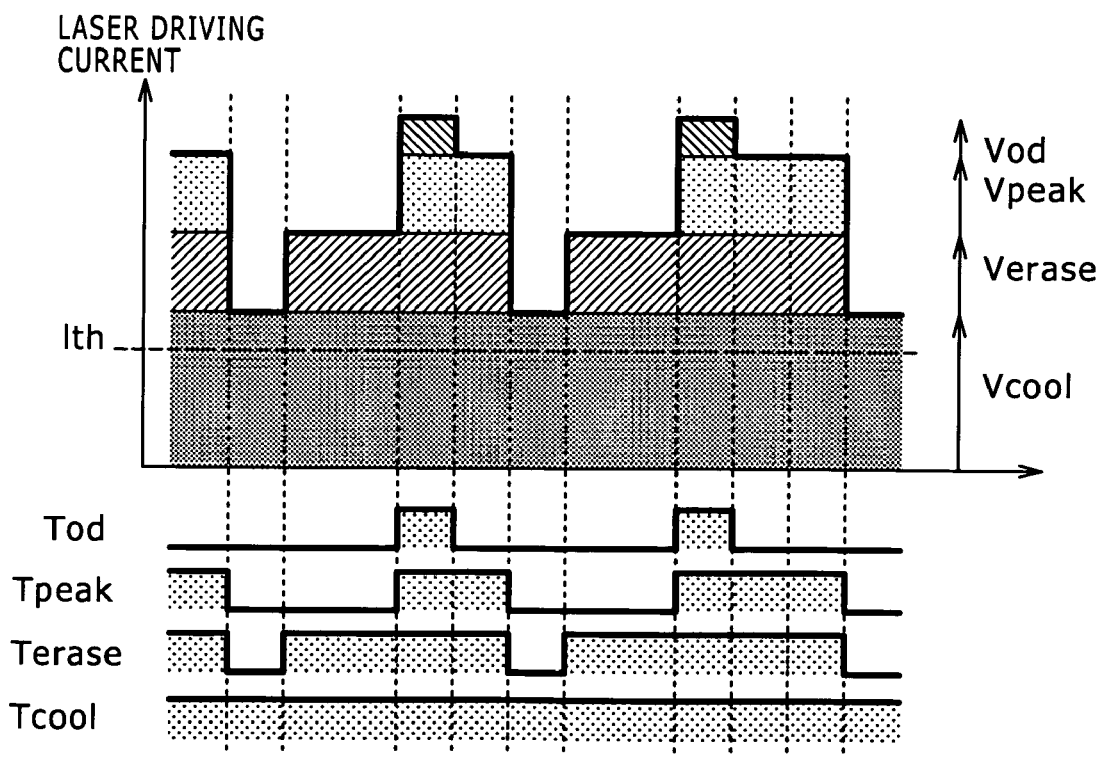

Multi-value driving current can be generated, for example, by a combination of the channels as seen in FIG. 2C. Since the conventional system provides the current instruction signal as an analog amount, it is advantageous in that the output current can be controlled continuously. It is to be noted that, while the maximum driving current of the present circuit is the sum total of maximum driving current of the channels, since the maximum driving current is restricted for each channel, a multi-value waveform which can be implemented is restricted.

DA Converter System

Figure 2D:
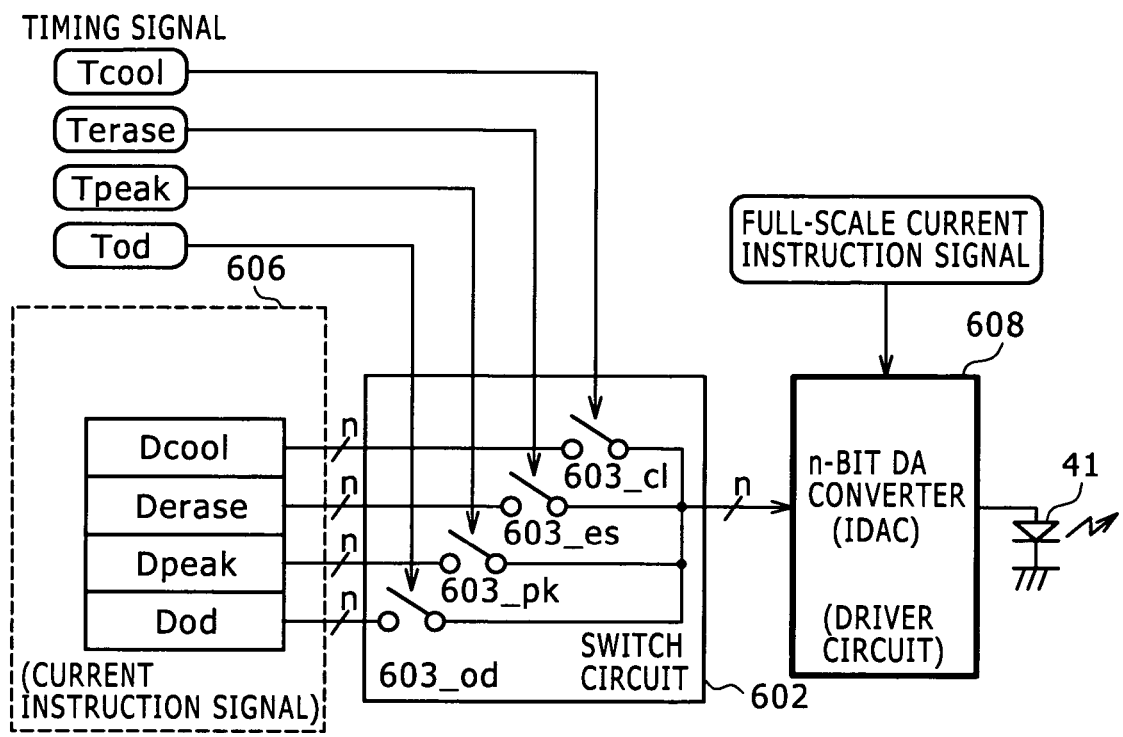
FIGS. 2D and 2E are a block diagram and a waveform diagram illustrating a second example of laser driving current generation.

A second example shown in FIG. 2D uses a reference level information storage portion 606 and a DA converter 608. The reference level information storage portion 606 stores digital data, that is, current level data Di, indicative of a current level with respect to the full scale. The switch circuit 602 for switching selection of the current level data Di between on and off is provided on the output side of the reference level information storage portion 606. The switch circuit 602 includes a switch 603 for each of the channels. For each of the corresponding channels of the write strategy signal, a timing signal is supplied to a control input terminal of the switch 603, and current level data Di from the reference level information storage portion 606 is supplied to an input terminal of the switch 603. The switches 603 are connected commonly at an output terminal thereof to the input side of the DA converter 608.

Figure 2E:
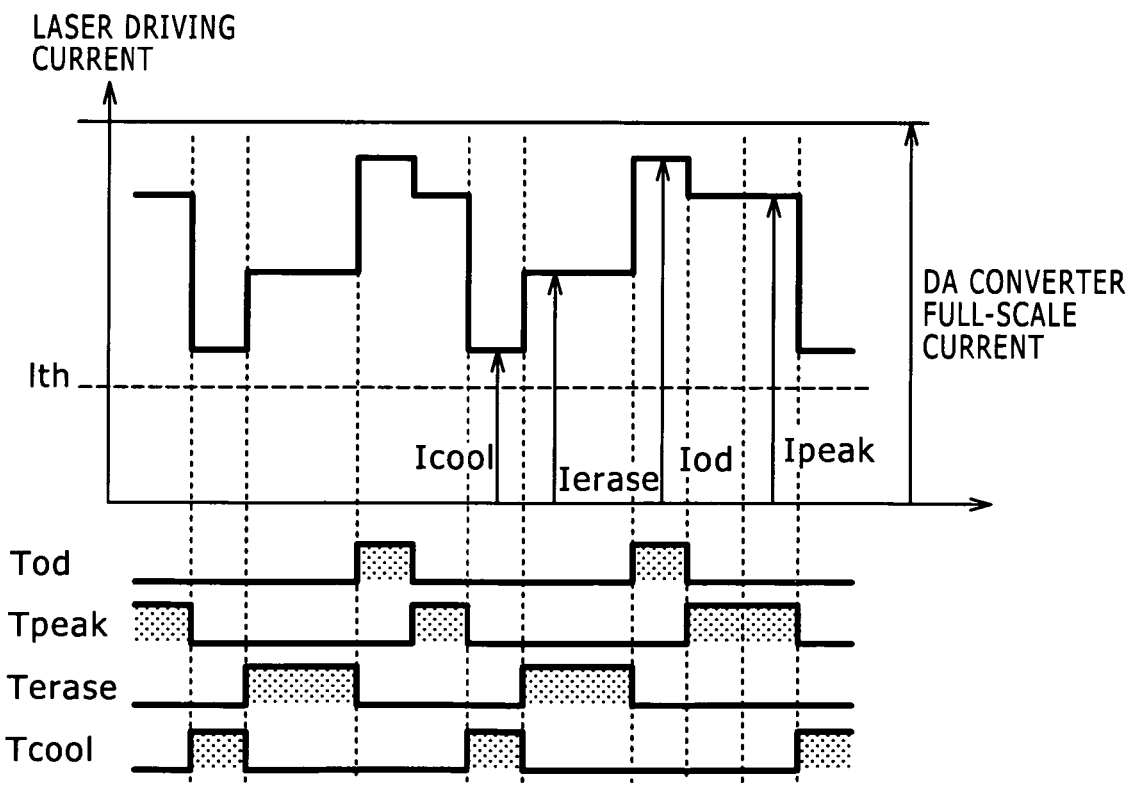

The DA converter 608 is connected to receive a signal indicative of the full scale of laser driving current and the current level data Di from the reference level information storage portion 606. A DA converter of the current output type, that is, an IDAC, is used for the DA converter 608 such that output current thereof drives the semiconductor laser 41. Multi-level laser driving current can be generated by varying the current level data Di in accordance with a write strategy. The reference level information storage portion 606 has four values of level information Dcool, Derase, Dpeak and Dod. The values are successively changed over with the timing signals Tcool, Terase, Tpeak and Tod to generate multi-level laser driving current as seen in FIG. 2E.

The DA converter system can implement any multi-level waveform within the range of the maximum driving current of the DA converter 608 although the control unit for output current is limited by the number of bits of the DA converter 608.

<Problems of Laser Driving and Principle of the Countermeasure Technique>

Figure 3A:
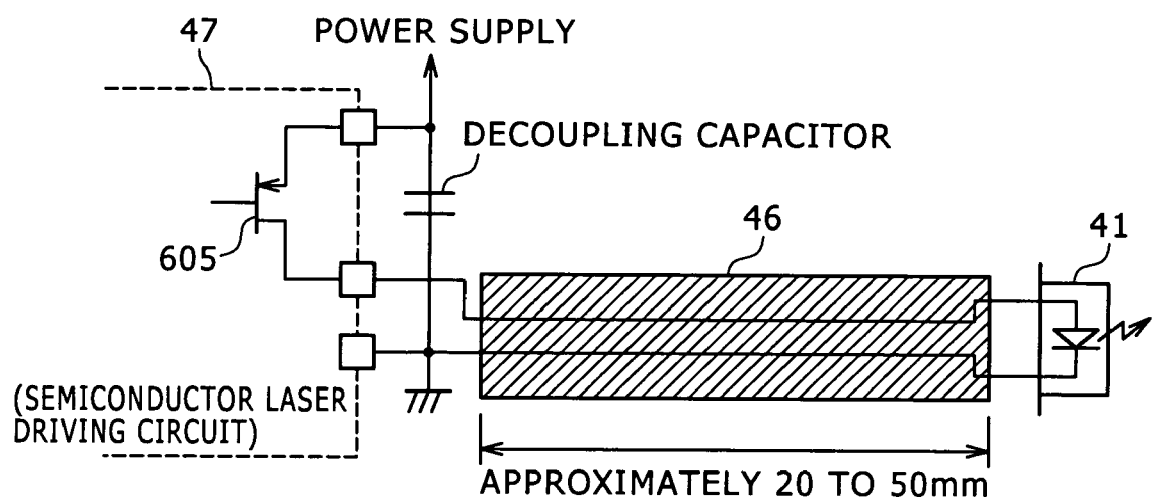
FIGS. 3A and 3B are circuit diagrams illustrating an example of a connection interface of a laser device and a driving circuit.
Figure 3B:
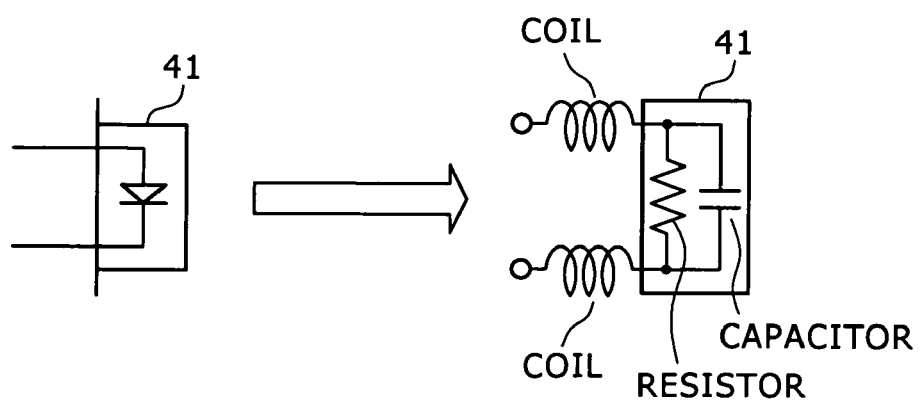
Figure 3C:
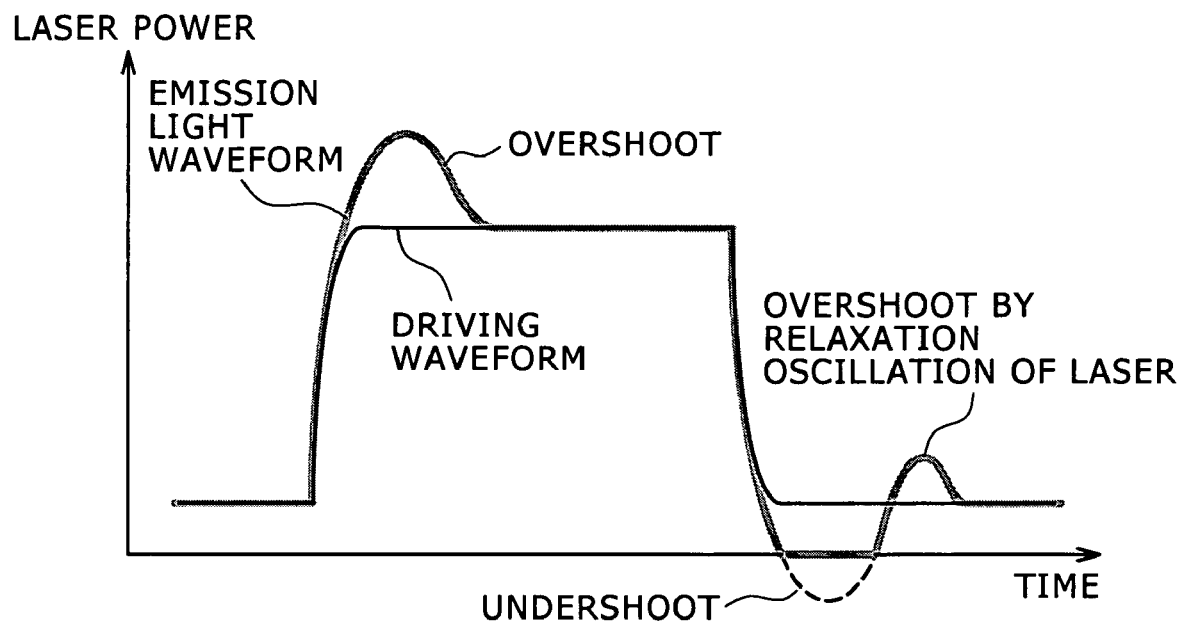
FIGS. 3C and 3D are waveform diagrams illustrating emission light wave abnormality.
Figure 3D:
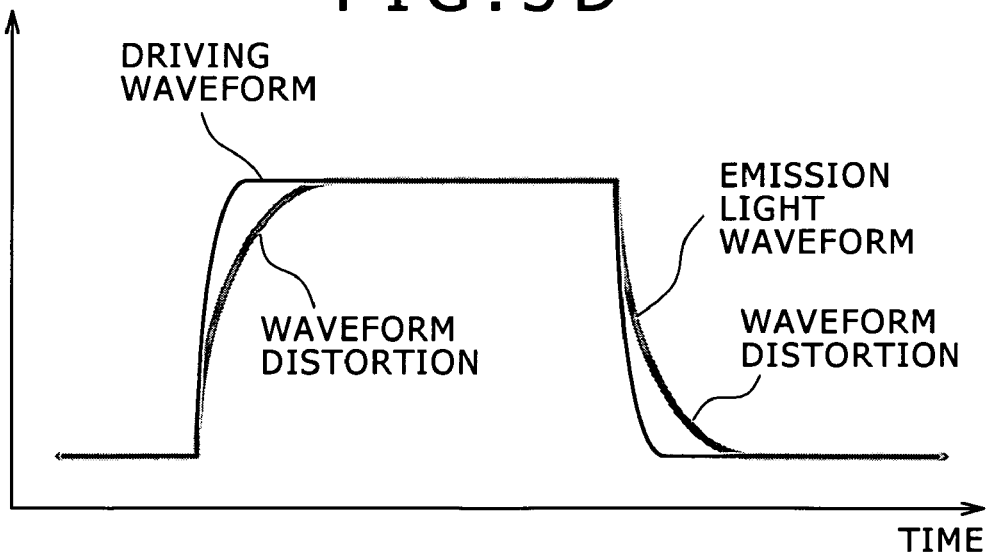

FIGS. 3A to 3H illustrate problems of laser driving and a basic principle of a countermeasure technique against the problems. Particularly, FIGS. 3A and 3B show an example of a connection interface between a laser device and a driving circuit and FIGS. 3C and 3D illustrate emission light waveform abnormality. FIGS. 3E to 3H illustrate a basic configuration of the present invention which is improved against emission light waveform abnormality.

Recording on an optical disk is implemented utilizing such a write strategy technique as described hereinabove with reference to FIG. 2A, and also a request for the shape of an emission light waveform is severe. For example, such values as rise time and fall time $\leq 1$ ns and overshoot $\leq 10\%$ are requested. When such high speed modulation is carried out, this is liable to be influenced by a load condition of the driving current controlling block 47, that is, a semiconductor laser driving circuit.

An equivalent circuit to the semiconductor laser 41 can be represented simply by a parallel connection circuit of a resistor and a capacitor as seen in FIG. 3B. The resistance and capacitance values of the resistor and the capacitor depend upon the laser chip design. Further, particularly in a blue-violet semiconductor laser, the resistance value of the resistor indicates a great individual difference and besides has driving current dependency and temperature dependency.

A laser driving system of the optical disk apparatus is composed of the optical pickup 14 or optical head in which the semiconductor laser 41 and optical parts are incorporated, and a drive substrate in which a control circuit is incorporated as shown in FIG. 1B or FIG. 3A, for example. Further, the optical pickup 14 moves in response to a radius of the optical disk OD, and it is difficult to dispose the driving current controlling block 47 and the semiconductor laser 41 in the proximity of each other from a restriction in shape of the apparatus and the optical pickup 14. Therefore, the optical pickup 14 is frequently connected by the flexible board 46 of, for example, a length of approximately 20 to 50 mm.

As a result, the load to the driving current controlling block 47 is not defined only by the equivalent circuit of the semiconductor laser 41 itself. In FIG. 3B, an impedance component is represented by a coil. The load to the driving current controlling block 47 is given, for example, by a combination of characteristic impedance of the flexible board 46 and parasitic impedance between the flexible board 46 and the semiconductor laser 41 or between the flexible board 46 and the driving current controlling block 47. The load varies depending upon the type or the individual of the semiconductor laser 41, the board design and an operation state.

The emission light waveform varies, for example, as seen in FIGS. 3C and 3D depending upon such difference in load conditions. FIG. 3C shows an emission light waveform where a great overshoot and a great undershoot appear. If the undershoot is so great that the emission light waveform becomes lower than threshold current of the semiconductor laser 41 once, then when the emitted light wave returns from the undershoot, an overshoot is sometimes caused by relaxation oscillation of the semiconductor laser 41. FIG. 3D illustrates an emission light waveform where the response speed at a rising edge and a falling edge is lowered.

Such variation of the emission light waveform is effectively equivalent to variation of the write strategy and has a bad influence on the recording characteristic. Usually, a waveform is demanded which has a small overshoot and undershoot and is close to a rectangular shape having short rise and fall time.

In order to make the laser emission light waveform close to a rectangular waveform, a function for correcting the shape of the emission light waveform is required for a semiconductor laser driving circuit, that is, for the driving current controlling block 47.

Figure 3E:
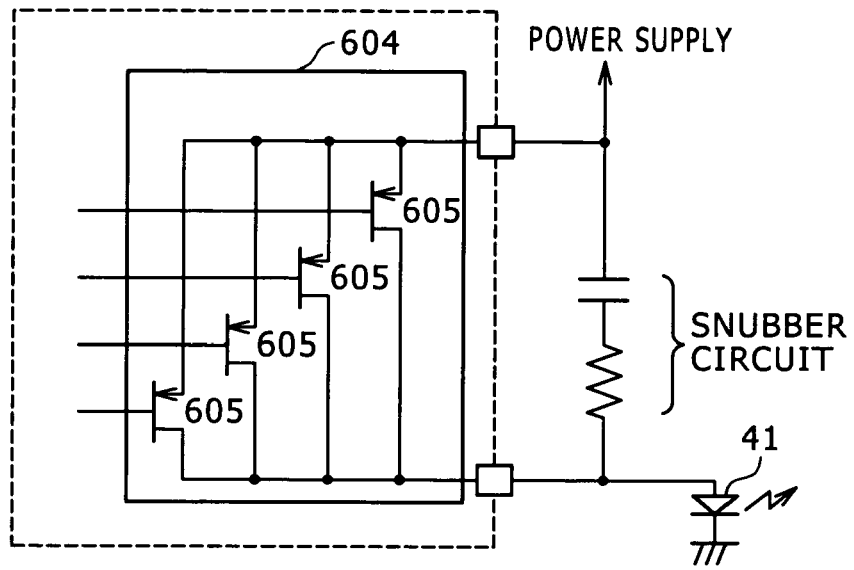
FIGS. 3E to 3H are circuit diagrams showing a basic configuration according to the present invention which compensates for emission light wave abnormality.

As a countermeasure technique, for example, a system which includes an externally connected snubber circuit as seen in FIG. 3E seems promising. In the system wherein a snubber circuit is connected externally, a combination circuit of a resistor and a capacitor is connected between an output of the driving transistor, that is, an input of the laser element, and a power supply or the ground. The snubber circuit is a popular technique used also in a motor driving circuit and so forth and can suppress an overshoot and an undershoot where they are great. The snubber circuit is sometimes connected externally to a semiconductor laser driving IC or built in a semiconductor laser driving IC such that the constant thereof can be adjusted. In both cases, the constant is adjusted such that the shape of the emission light waveform is optimized in a state wherein they are incorporated in a mounting substrate or an optical head.

However, although correction by a snubber circuit is frequently effective against an overshoot or an undershoot, it is originally ineffective for improvement of a waveform whose response speed is low. Further, where a resistor or a capacitor is externally connected to a laser driving IC, it increases the component cost or the mounting area. On the other hand, where a snubber circuit is built in a laser driving IC such that it can be adjusted, selection of the constant is limited and sufficient correction cannot necessarily be achieved.

Figure 3F:
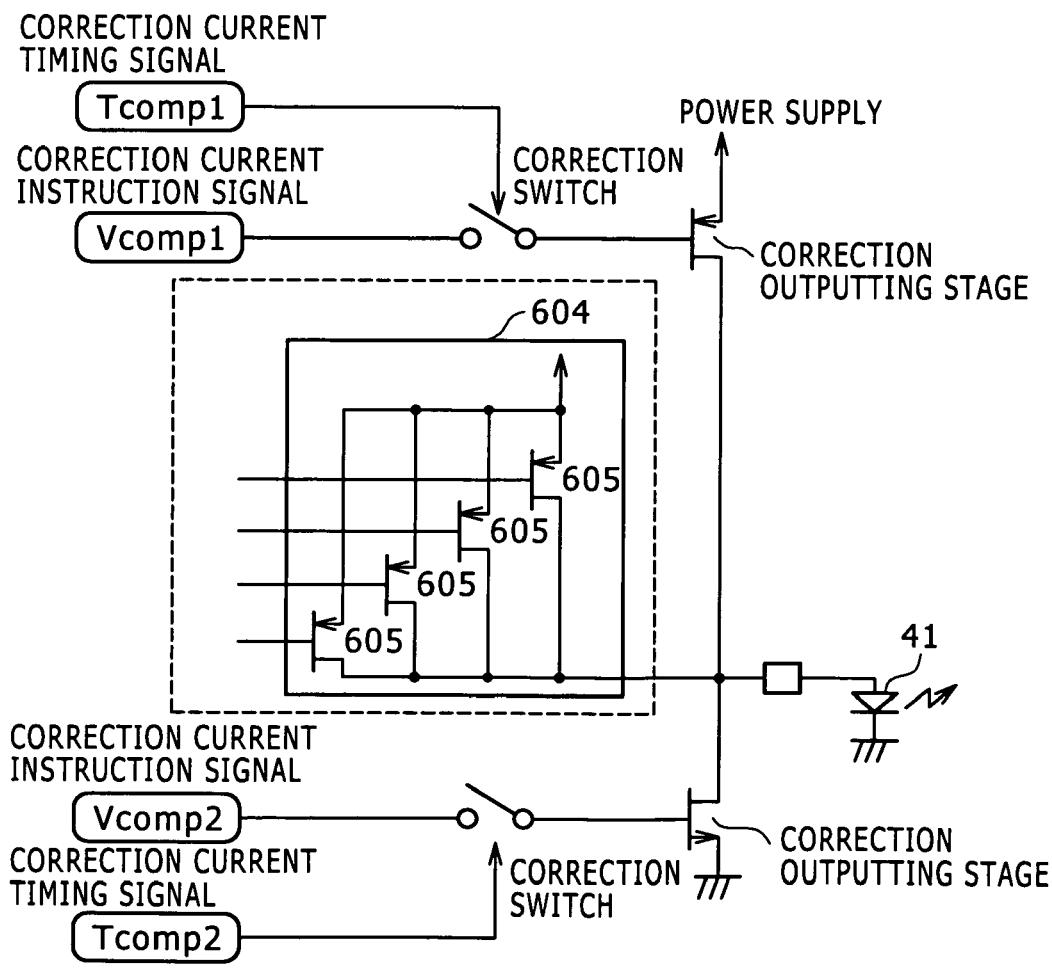

In such a mechanism of Patent Document 1 as shown in FIG. 3F, a correction outputting stage for supplying correction current to the semiconductor laser 41, that is, a stage including two systems of driving transistors for correction, is required in addition to an output stage for pulse-driving the semiconductor laser 41, that is, to a stage of four systems of driving transistors. Since a greater number of transistors are provided at the outputting stage, the response speed drops together with increase of the chip area of the laser driving IC and increase of the parasitic capacitance.

Figure 3G:
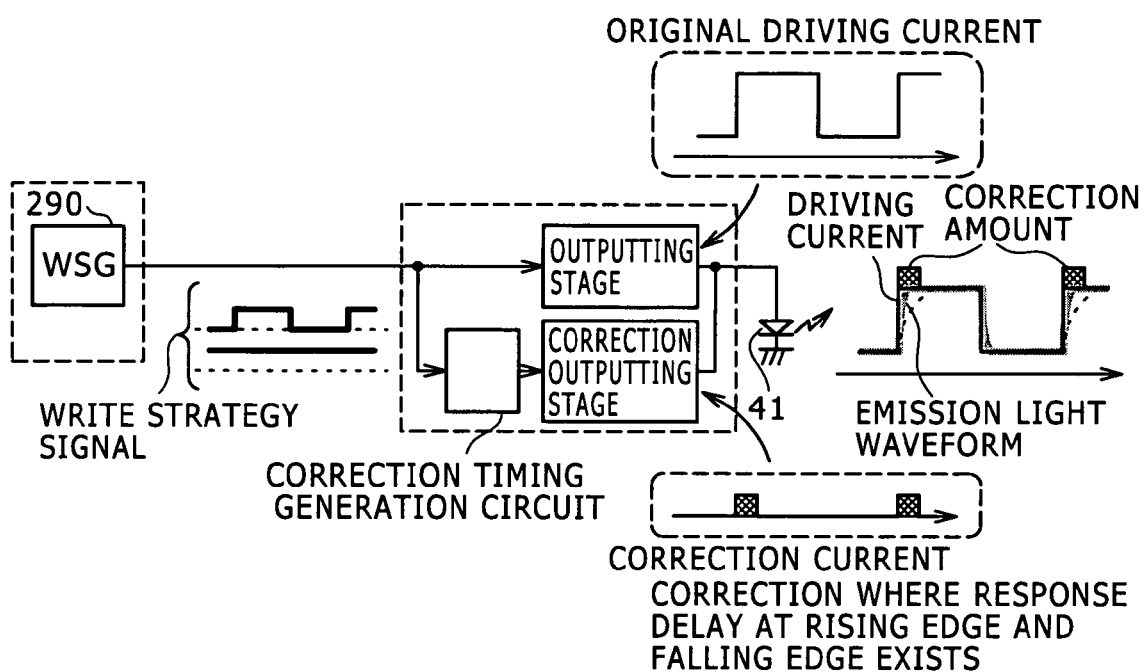

Also in such a mechanism of Patent Document 2 as shown FIG. 3G, a correction outputting stage for supplying correction current to the semiconductor laser 41 is required in addition to an outputting stage for pulse-driving the semiconductor laser 41. The number of outputting stages increases similarly as in Patent Document 1.

Figure 3H:
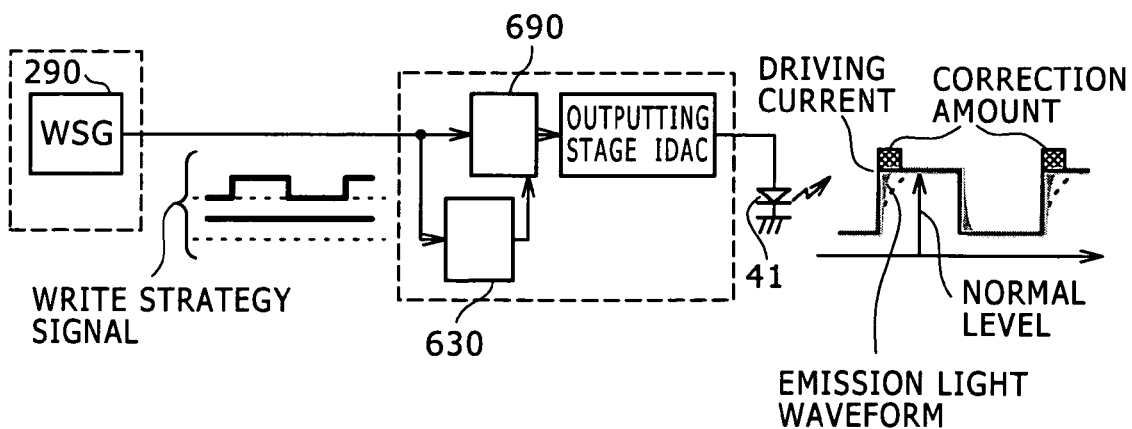

Taking the foregoing into consideration, the present embodiment adopts a configuration wherein a driving signal is corrected in advance and then current is supplied to an outputting stage, that is, to a driving transistor so that the emission light waveform becomes as close to a rectangular waveform as possible without increasing the outputting stage or driving transistor. In short, a driving signal correction unit 690 as an emission light waveform correction unit is provided preceding to the outputting stage as seen in FIG. 3H. The driving signal correction unit 690 may be configured such that changeover between normal level data and correction level data is carried out or correction amount data is injected into, that is, added to or subtracted from, normal level data. A DA converter preferably of the current outputting type, that is, an IDAC, is provided at the outputting stage for driving the semiconductor laser 41. Setting data after waveform correction is applied to an input terminal of the DA converter.

By inserting a correction level into digital data according to a light emission pattern inputted to the DA converter, correction is carried out against a variation of the shape of the emission light waveform caused by a variation of an equivalent circuit of the semiconductor laser 41 or a difference in parasitic impedance by mounting. By setting an appropriate correction level or correction amount, that is, by setting a difference from a reference level, in response to an abnormal shape of the emission light waveform and by setting an appropriate correction timing timed with a timing at which abnormality occurs, an optimum waveform which is as close to a rectangular waveform as possible is obtained. Waveform correction over a wide range equivalent to that of a method of adding an outputting stage for waveform correction is implemented only by addition of some correction circuit without involving such problems as increase of the cost by increase of the chip area or drop of the response speed caused by increase of the parasitic capacitance.

System Configuration of the Signal Interface

First Embodiment

Figure 4A:
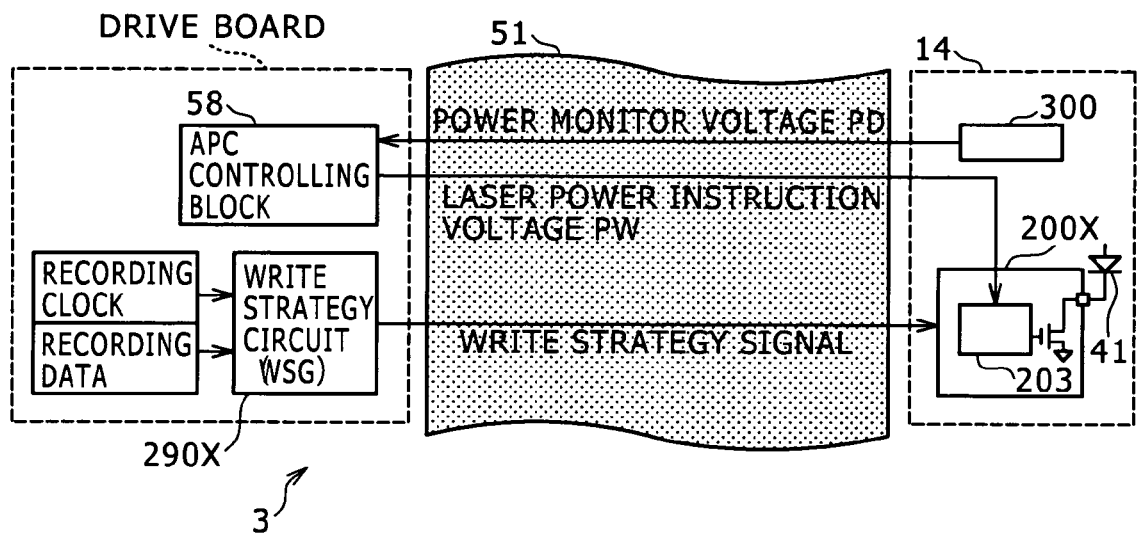
FIGS. 4A and 4B are block diagrams showing system configurations of a first embodiment of the present invention.
Figure 4B:
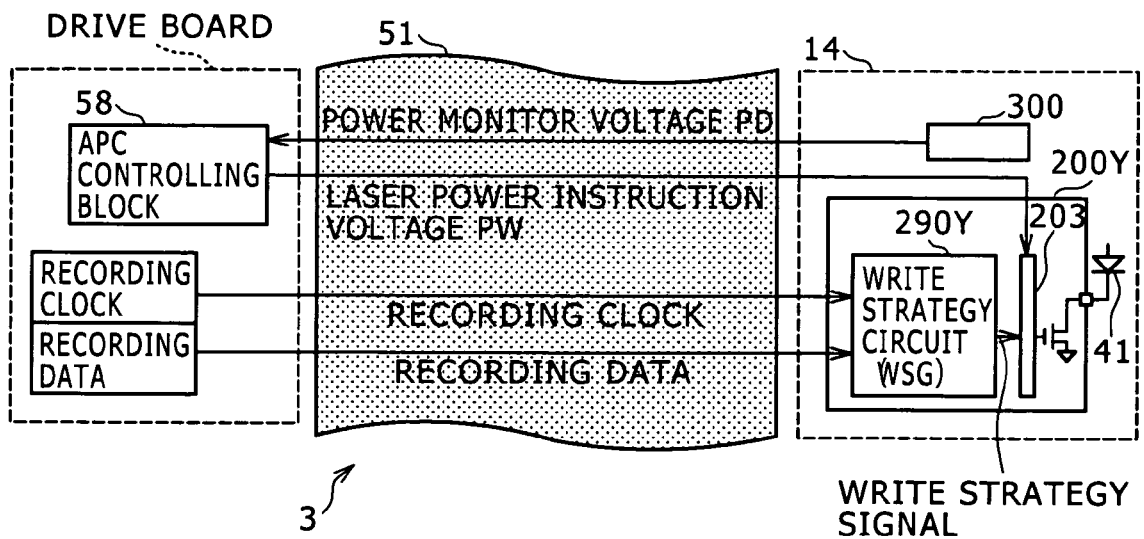

FIGS. 4A and 4B show system configurations for implementing the signal interface system of the first embodiment. The system configuration of the first embodiment is a system wherein timing information of a driving current level is transmitted for each of driving current levels or channels applied by the write strategy technique. In the present specification, this system is referred to as channel timing transmission system.

The system configuration of a first example of the first embodiment shown in FIG. 4A incorporates a write strategy circuit 290X mounted on a drive substrate. A power monitor circuit 300 photoelectrically converts and sample holds part of laser light emitted from the semiconductor laser 41 to acquire a power monitor voltage PD as a feedback signal for APC control and sends the power monitor voltage PD to the APC controlling block 58. A recording pulse signal indicative of a light emission timing corresponding to each power level and a laser power instruction voltage PW are sent from the drive substrate to a laser driving circuit 200X of the optical pickup 14 side, and an emission light waveform generation unit 203 which is an example of a pulse current generation circuit generates driving current to drive the semiconductor laser 41 to emit light.

In the system configuration of a second example of the first embodiment shown in FIG. 4B, a write strategy circuit 290Y is incorporated not in a drive substrate but in a laser driving circuit 200Y. The write strategy circuit 290Y generates a timing signal for controlling the optical power from a recording clock and recording data. The timing signal is given in a unit smaller than a channel clock interval Tw and is generated for each power level so that the power levels and timings correspond in a one-by-one corresponding relationship to each other.

The write strategy circuit 290Y for implementing this includes a phase synchronizing circuit, a memory, an address encoder, and a timing generation circuit. The phase synchronizing circuit generates a multi-phase clock for generating a unit smaller than the channel clock interval Tw. The memory stores level information. The address encoder decides a recording data length and generates a memory address. The timing generation circuit converts timing information read out from the memory in response to the recoding data length into a timing signal.

<Waveform Correction: First Mode>

FIGS. 5A to 9C illustrate an emission light waveform correction unit of the first mode. In the emission light waveform correction unit of the first mode, a mechanism for correction of a laser emission light waveform of the present mode is applied to the system configuration of the first embodiment, that is, of the channel timing transmission system. Particularly, in the first embodiment, a correction level is provided separately from a normal driving level or normal level which is outputted from a circuit configuration of the DA conversion system and changeover from the normal level to the correction level is carried out in accordance with a timing at which correction is required.

In order to cope with this, a correction level information storage portion for storing information of correction levels and a driving level changeover portion for carrying out changeover between a normal level and a correction level. The correction level information storage portion is a first example of the correction information storage portion. It is to be noted that, in an alternative system configuration wherein timing information for which correction is required is not transmitted independently of a write strategy signal from the drive substrate side, a correction timing generation portion or correction period setting portion for generating timing information for which correction is required is provided additionally based on the received write strategy signal.

Further, the correction object period may be provided not at one place but at a plurality of places, and in this instance, the correction level information storage portion, correction timing generation portion and driving level changeover portion are provided for each of systems for the correction object periods so that correction can be carried out for various places of the emission light waveform. Further, the waveform abnormality of the correction object may be an overshoot immediately after a rising edge, an undershoot immediately after a falling edge, an overshoot after an undershoot and a slow response at a rising edge or a falling edge. In the following, specific description thereof will be given.

First Example

Figure 5B:
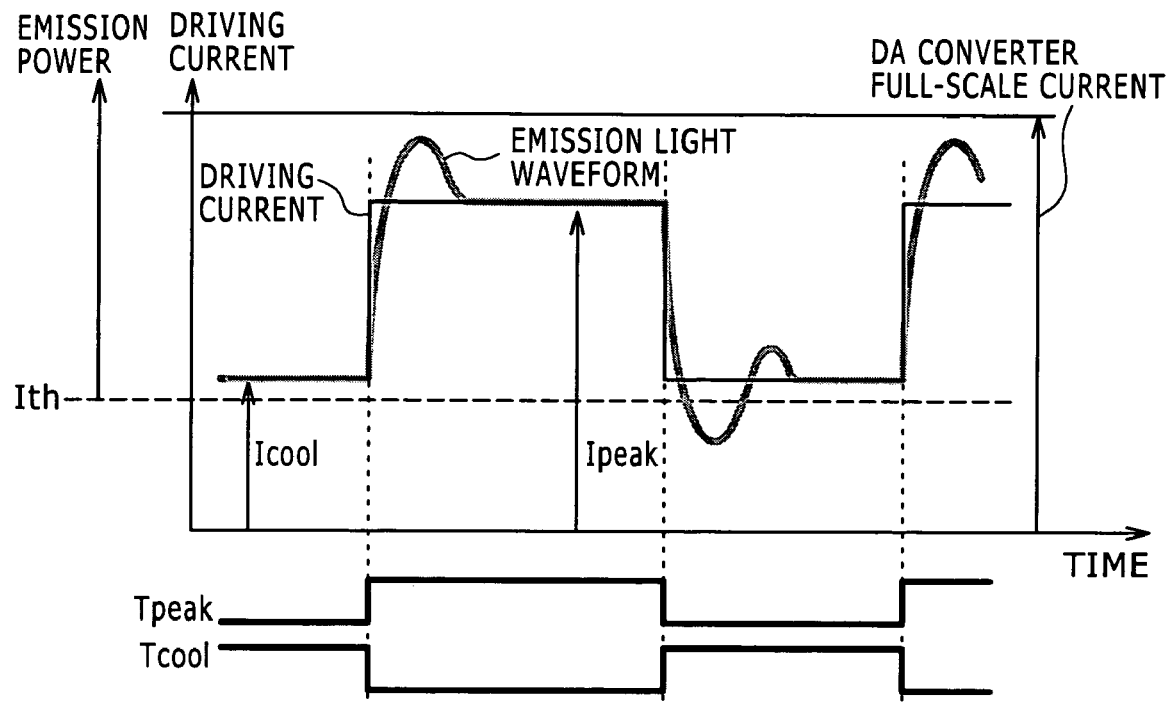
FIGS. 5B and 5C are waveform diagrams illustrating operation of the configuration shown in FIG. 5A.
Figure 5C:
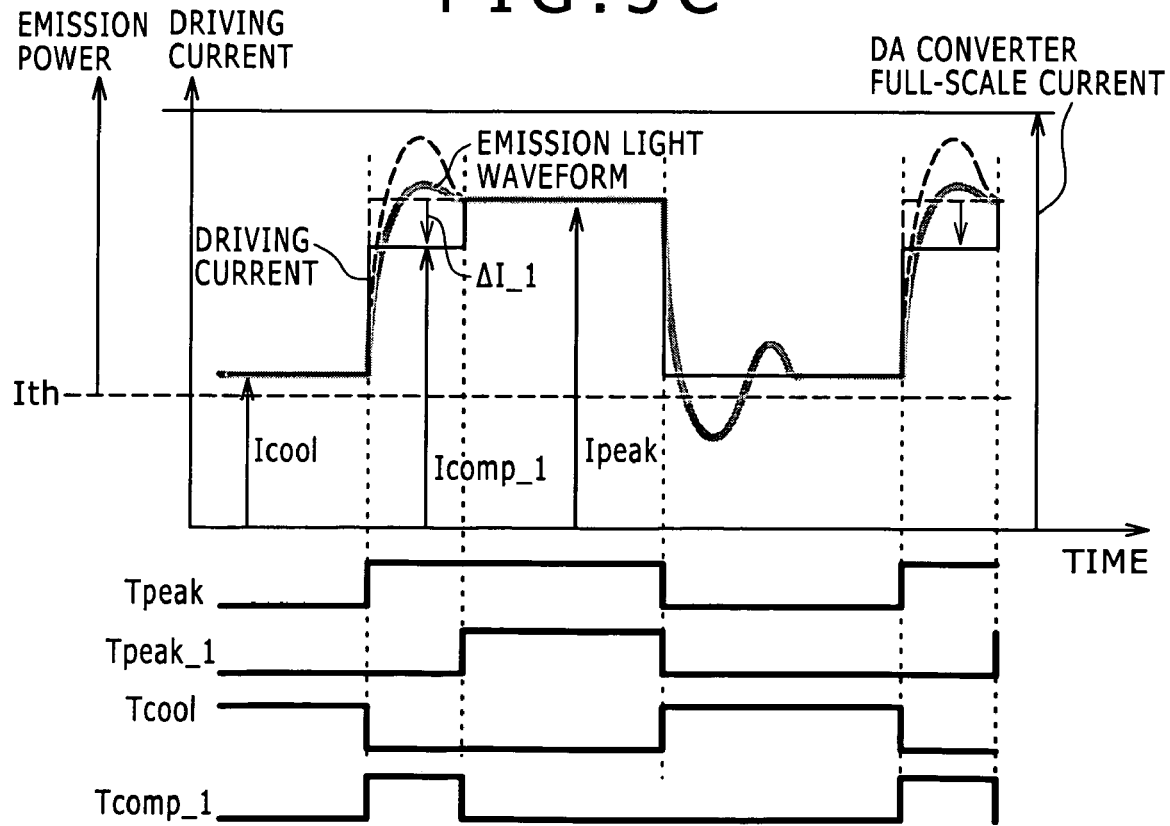

FIG. 5A shows a first example of the first mode of waveform correction, and FIGS. 5B and 5C illustrate operation in the waveform correction. Referring to FIG. 5A, the laser driving circuit 200A_1 of the first example of the first mode includes an emission light waveform correction unit 600A_1. The emission light waveform correction unit 600A_1 includes a correction information storage portion 610A_1, a correction timing generation portion 630A_1 and a driving level changeover portion 650_1.

The correction information storage portion 610A_1 is an example of a correction level information storage portion which includes a correction current level register 612_1 for storing correction level data Dcomp_1 corresponding to driving current amount Icomp_1 of correction levels. The correction timing generation portion 630A_1 includes a reference timing selection part 632_1, a delay setting part 634_1, and a pulse width setting part 636_1. The driving level changeover portion 650_1 includes a correction switch 652_1 and a masking part 654_1.

The reference timing selection part 632_1 selects, from among received write strategy signals or timing signals for the four channels for the cool, erase, peak and overdrive power levels, that write strategy signal of the channel which makes a reference for a correction period, that is, the reference channel CH_1, and transfers the selected write strategy signal to the delay setting part 634_1. The delay setting part 634_1 determines a starting edge of the selected reference channel CH_1 as a starting point, sets a delay time CD_1 from the starting point and transfers the delay time CD_1 to the pulse width setting part 636_1. With these configurations, the pulse width setting part 636_1 sets a pulse width CT_1 for defining a width of a correction period. The correction timing generation portion 630A_1 generates a correction timing pulse Tcomp_1 representative of a correction period and a complementary pulse which is an inverted pulse or masking pulse Mcomp_1 of the correction timing pulse Tcomp_1. The correction timing generation portion 630A_1 supplies the correction timing pulse Tcomp_1 to the correction switch 652_1 and supplies the masking pulse Mcomp_1 to the masking part 654_1.

The correction switch 652_1 receives, at an input terminal thereof, the correction level data Dcomp_1 from the correction information storage portion 610A_1 and is connected at an output terminal thereof to an input terminal of the DA converter 608. The correction switch 652_1 exhibits an on state within a period within which the correction timing pulse Tcomp_1 has the active H level.

The masking part 654_1 is a switch circuit which switches selection of a timing signal for each channel between on and off and includes a masking switch 655_1 on a timing signal line of the channel of an object of correction. The masking switch 655_1 receives, at a control input terminal thereof, the masking pulse Mcomp_1 corresponding to a correction channel from the correction timing generation portion 630A_1 and receives, at an input terminal thereof, a timing signal of the corresponding channel. The masking switch 655_1 is connected at an output terminal thereof to a control input terminal of the switch 603. In short, a timing signal inputted to the masking switch 655_1 is supplied to a control input terminal of the switch 603 after it is gated by the masking switch 655_1 (correction timing pulse Tcomp_1).

The masking switch 655_1 switches selection of a timing signal for each channel into an on state for a period of time within which the masking pulse Mcomp_1 has the H level. The correction timing pulse Tcomp_1 and the masking pulse Mcomp_1 have a complementary relationship to each other. Therefore, when the correction switch 652_1 is on, the masking switch 655_1 switches off the selection of a timing signal for each channel, but when the correction switch 652_1 is off, the masking switch 655_1 switches on the selection of a timing signal for each channel.

Operation of the emission light waveform correction unit 600A_1 is described with reference to FIGS. 5B and 5C. Incidentally, according to the configuration shown in FIG. 5A, as level information-timing signals according to the write strategy, four level information-timing signals for the cool, erase, peak and overdrive power levels are provided, in FIGS. 5B and 5C, operation where modulation into two values of the cool and peak power levels is carried out for simplified illustration. This similarly applies also to the following description of operation in regard to the other examples hereinafter described.

FIG. 5B illustrates a laser driving waveform and a laser emission light waveform before correction is carried out. The level information Dcool and Dpeak is sequentially inputted to the DA converter 608 in response to the timing signals Tcool and Tpeak, respectively, and laser driving current of two values of Icool and Ipeak is outputted. The laser emission light waveform has a great overshoot immediately after a rising edge.

FIG. 5C illustrates a laser driving waveform and a laser emission light waveform where correction for moderating the overshoot is carried out by the emission light waveform correction unit 600A_1. Although the masking pulse Mcomp_1 is not shown, it is obtained by logically inverting the correction timing pulse Tcomp_1. The waveform Tpeak_1 is a waveform after the timing signal Tpeak is gated with the correction timing pulse Tcomp_1.

In the present example, in order to suppress an overshoot which appears immediately after a rising edge when a Tpeak period is entered from a Tcool period, correction level data Dcomp_1 corresponding to a correction level Icomp_1 which is lower than the reference level Ipeak for the peak power level is set to the correction information storage portion 610A_1.

Further, the correction period within which the correction switch 652_1 is to be on is set with reference to the timing signal Tpeak while a delay is not set, and the pulse width is set to an appropriate value in response to the shape and the period of the overshoot. In other words, the reference timing selection part 632_1 selects the timing signal Tpeak as the reference channel CH_1. The delay setting part 634_1 sets the delay time CD_1 to zero. The pulse width setting part 636_1 sets an appropriate pulse width CT_1 in response to the shape and the period of the overshoot. Consequently, the correction timing generation portion 630A_1 generates a correction timing pulse Tcomp_1 and a masking pulse Mcomp_1 in accordance with the period of appearance and the shape of the overshoot.

After the Tpeak period is entered, the correction timing pulse Tcomp_1 is immediately placed into the active H level and the correction switch 652_1 is switched on, and the correction level data Dcomp_1 corresponding to the correction level Icomp_1 set to the correction information storage portion 610A_1 is inputted to the DA converter 608. Within this period, the masking pulse Mcomp_1 has the L level, and the timing signal Tpeak is not selected by the masking switch 655_1 of the masking part 654_1. Therefore, the level information Dpeak is not inputted to the DA converter 608.

If the set pulse width CT_1 comes to an end and the correction timing pulse Tcomp_1 is placed into the inactive L level, then the correction switch 652_1 is switched off and the supply of the masking pulse Mcomp_1 to the DA converter 608 is stopped. Simultaneously, the masking pulse Mcomp_1 is placed into the H level, and consequently, the masking of the timing signal Tpeak is canceled and then the level information Dpeak is inputted to the DA converter 608. As a result, the laser driving current is changed over to the reference level Ipeak.

As a result, the driving current immediately after a rising edge when a Tpeak period is entered from a Tcool period can be lowered to the correction level Icomp_1 which is lower than the reference level Ipeak for the peak power level. By this series of operations, the overshoot of the laser emission light waveform which appears immediately after a rising edge when a Tpeak period is entered from a Tcool period can be suppressed low.

Second Example

Figure 6A:
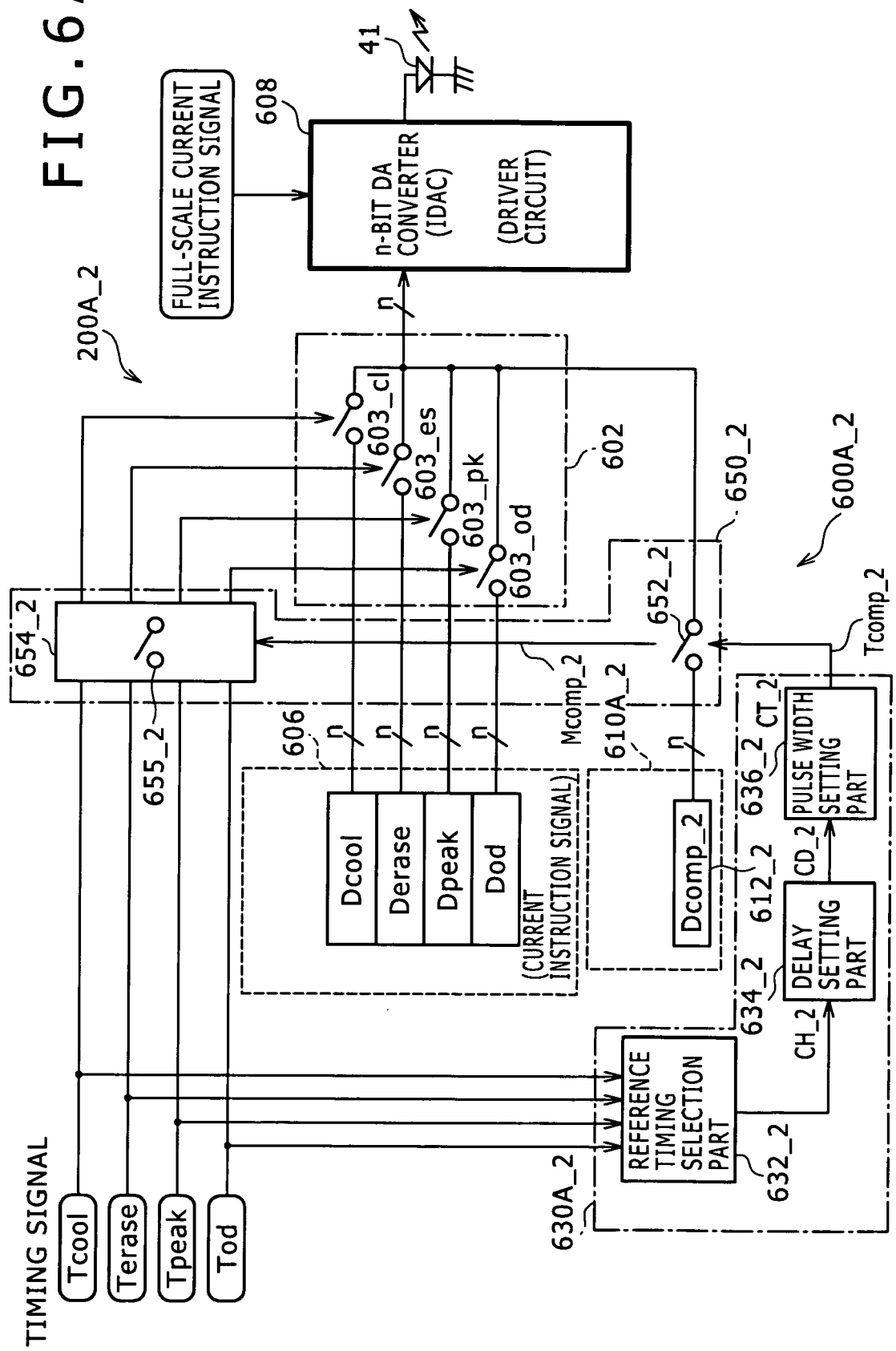
FIG. 6A is a block diagram showing a configuration of a second example of the first mode of emission light waveform correction.
Figure 6B:
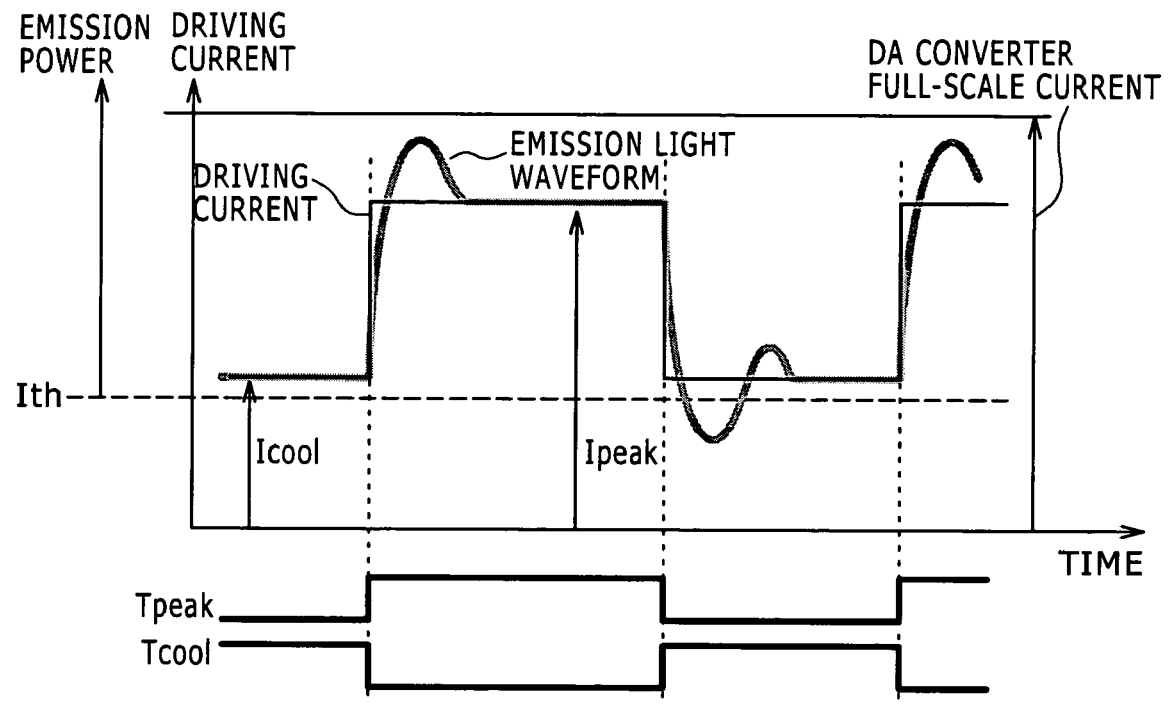
FIGS. 6B and 6C are waveform diagrams illustrating operation of the configuration shown in FIG. 6A.
Figure 6C:
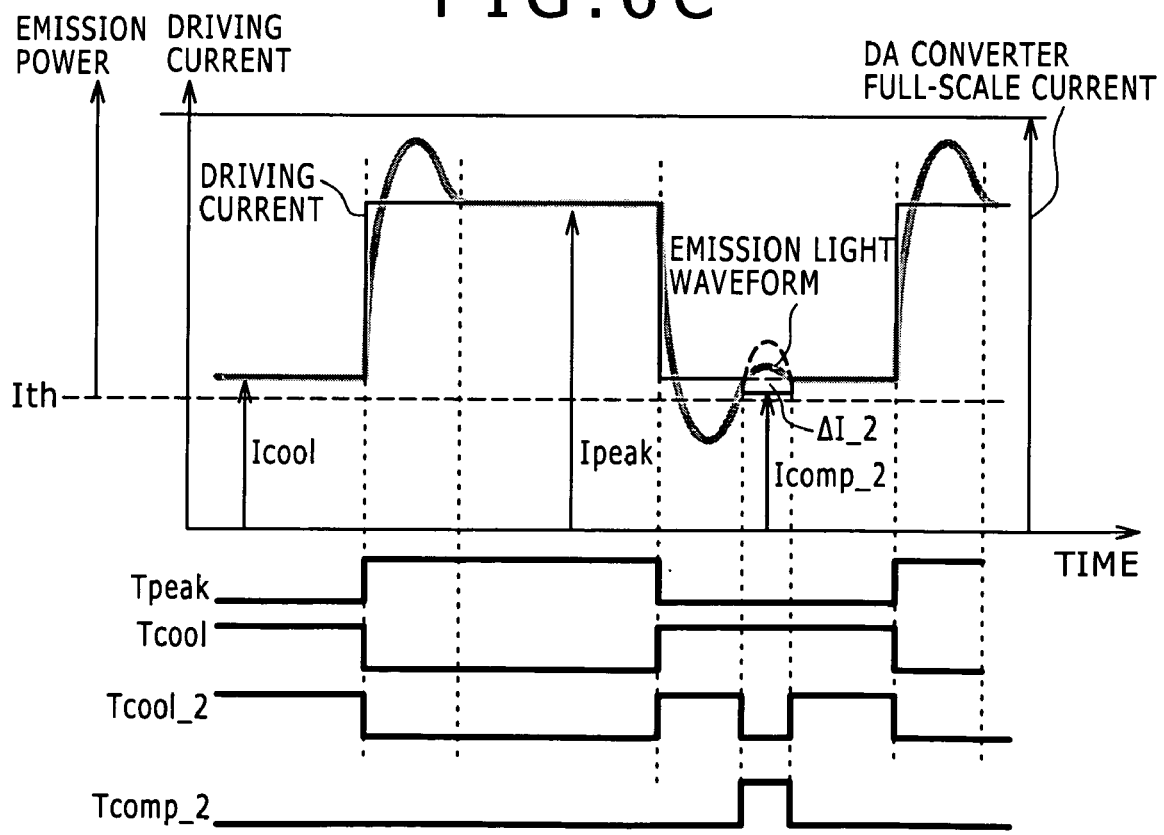

FIG. 6A shows a second example of the first mode of waveform correction, and FIGS. 6B and 6C illustrate operation in the waveform correction. Referring first to FIG. 6A, the laser driving circuit 200A_2 of the second example of the first mode includes an emission light waveform correction unit 600A_2. The emission light waveform correction unit 600A_2 includes a correction information storage portion 610A_2, a correction timing generation portion 630A_2 and a driving level changeover portion 650_2. The functioning sections denoted by the suffix "_2" function similarly to the corresponding functioning sections denoted by the suffix "_1" of the first example of the first mode, and the configuration of the emission light waveform correction unit 600A_2 itself is not different from that of the first example of the first mode.

For example, the correction information storage portion 610A_2 stores correction level data Dcomp_2 corresponding to driving current amount Icomp_2 of correction levels. A reference timing selection part 632_2 selects a reference channel CH_2, which is to be used as a reference for a correction period, from among four timing signals Tcool, Terase, Tod and Tpeak and transfers the selected reference channel CH_2 to a delay setting part 634_2. The delay setting part 634_2 decides a starting edge of the selected reference channel CH_2 as a starting point and sets a delay time CD_2 from the starting point and then transfers the delay time CD_2 to a pulse width setting part 636_2. The pulse width setting part 636_2 sets a pulse width CT_2 which defines the width of the correction period. The correction timing generation portion 630A_2 thereby generates a correction timing pulse Tcomp_2 representative of a correction period and a masking pulse Mcomp_2. The correction timing generation portion 630A_2 supplies the correction timing pulse Tcomp_2 to a correction switch 652_2 and supplies the masking pulse Mcomp_2 to a masking part 654_2.

The correction switch 652_2 receives, at an input terminal thereof, the correction level data Dcomp_2 from the correction information storage portion 610A_2 and is connected at an output terminal thereof to the input terminal of the DA converter 608. The correction switch 652_2 is switched on when the correction timing pulse Tcomp_2 has the active H level. A masking switch 655_2 of the masking part 654_2 switches on selection of a timing signal for each of the channels within a period within which the masking pulse Mcomp_2 has the H level.

Operation of the emission light waveform correction unit 600A_2 is described with reference to FIGS. 6B and 6C. FIG. 6B illustrates a laser driving waveform and a laser emission light waveform before correction is carried out and is similar to FIG. 5B. FIG. 6C illustrates a laser driving waveform and a laser emission light waveform where correction for moderating an overshoot which appears after an undershoot immediately after a falling edge of a laser emission light wave is carried out by the emission light waveform correction unit 600A_2. Although the masking pulse Mcomp_2 is not shown, it is obtained by logically inverting the correction timing pulse Tcomp_2. The timing signal Tcool_2 is obtained by gating the timing signal Tcool with the correction timing pulse Tcomp_2.

In order to suppress an overshoot which appears after an undershoot immediately after a falling edge when a Tcool period is entered, correction level data Dcomp_2 corresponding to a correction level Icomp_2 which is lower than the reference level Icool for the cool power level is set to the correction information storage portion 610A_2.

Further, a correction period within which the correction switch 652_2 is to be on is set with reference to the timing signal Tcool, and the delay is set to an appropriate value in response to a starting point of time of an overshoot which appears after an undershoot while a pulse width is set to an appropriate value in response to the shape and the period of the overshoot. In particular, the reference timing selection part 632_2 selects the timing signal Tcool as the reference channel CH_2. The delay setting part 634_2 sets delay time CD_2 of an appropriate value in accordance with a starting point of time of an overshoot which appears after an undershoot. The pulse width setting part 636_2 sets an appropriate pulse width CT_2 in response to the shape and the period of the overshoot. Consequently, the correction timing generation portion 630A_2 generates a correction timing pulse Tcomp_2 and a masking pulse Mcomp_2 in accordance with the appearance period and shape of an overshoot which appears after an undershoot.

After a Tcool period is entered, the correction timing pulse Tcomp_2 changes to the inactive L level and the correction switch 652_2 is switched off, and supply of the correction level data Dcomp_2 to the DA converter 608 is stopped. At this time, the masking pulse Mcomp_2 has the H level, and hence the masking of the timing signal Tcool is canceled and the timing signal Tcool is inputted to the DA converter 608. Consequently, the level information Dcool is inputted to the DA converter 608, and the laser driving current equal to the reference level Icool flows.

Thereafter, at a timing at which an overshoot appears after an undershoot, the correction timing pulse Tcomp_2 changes to the active H level and the correction switch 652_2 is switched on. The correction level data Dcomp_2 corresponding to the correction current level Icomp_2 is set in the correction information storage portion 610A_2 and is inputted to the DA converter 608 when the correction switch 652_2 is switched on with the correction timing pulse Tcomp_2. Within this period, the masking pulse Mcomp_2 has the L level and the timing signal Tcool is not selected by the masking switch 655_2 of the masking part 654_2 any more. Therefore, the level information Dcool is not inputted to the DA converter 608. In other words, when the correction timing pulse Tcomp_2 becomes the active H level, the laser driving current is changed over to the correction level Icomp_2.

When the set pulse width CT_2 comes to an end and the correction timing pulse Tcomp_2 changes to the inactive L level, the correction switch 652_2 is switched off and the supply of the correction level data Dcomp_2 to the DA converter 608 is stopped. Simultaneously, the masking pulse Mcomp_2 changes to the H level. Consequently, the masking of the timing signal Tcool is canceled and the level information Dcool is inputted to the DA converter 608. As a result, the laser driving current changes from the correction level Icomp_2 to the reference level Icool.

Consequently, the driving current for a fixed period of time after a Tcool period is entered from a Tpeak period can be lowered to the correction level Icomp_2 which is lower than the reference level Icool for the cool power level. By the series of operations described, an overshoot of a laser emission light waveform which appears after the laser driving current becomes lower than the threshold current of the laser due to an undershoot immediately after a falling edge when a Tcool period is entered from a Tpeak period can be suppressed to a low level.

Third Example

Figure 7A:
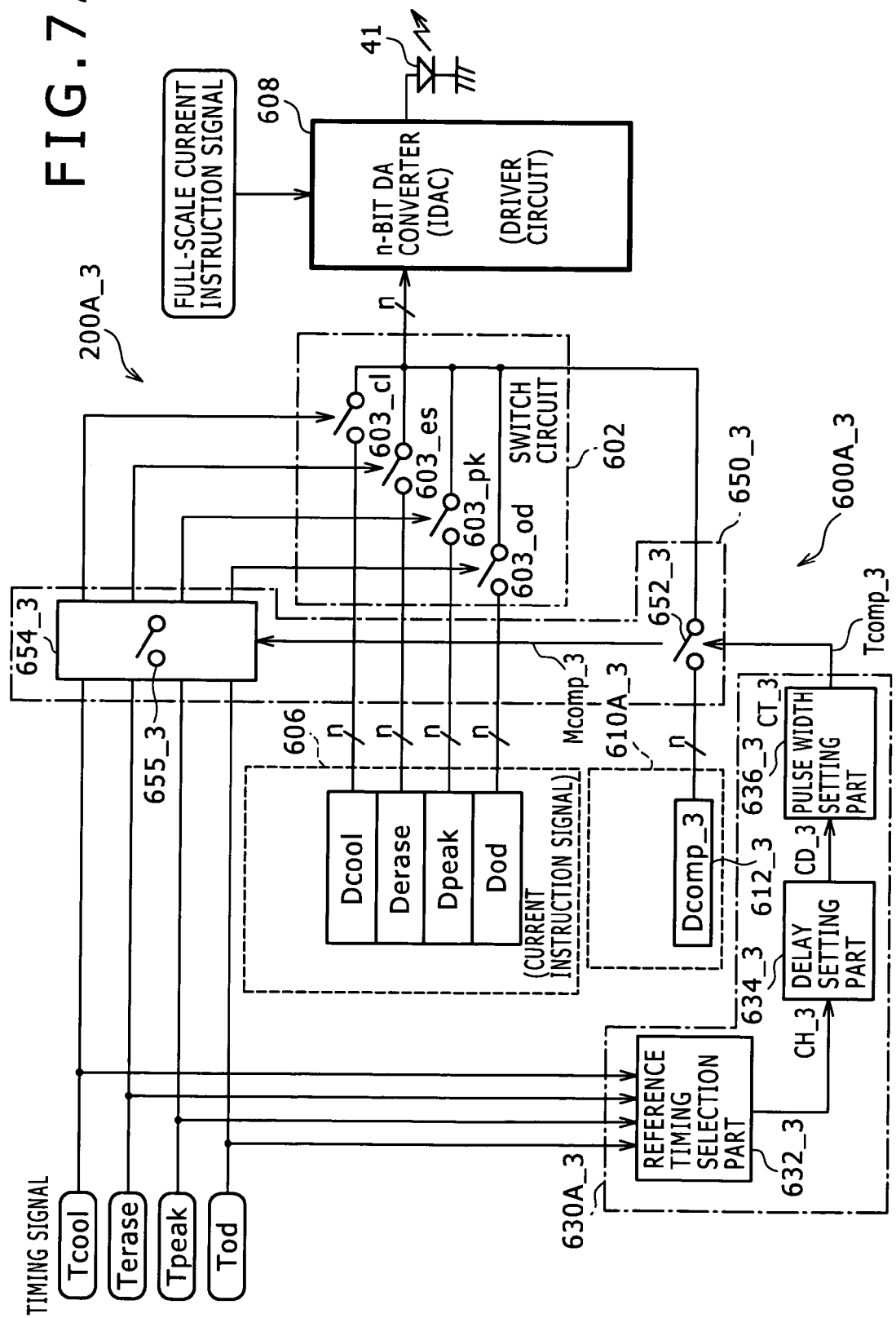
FIG. 7A is a block diagram showing a configuration of a third example of the first mode of emission light waveform correction.
Figure 7B:
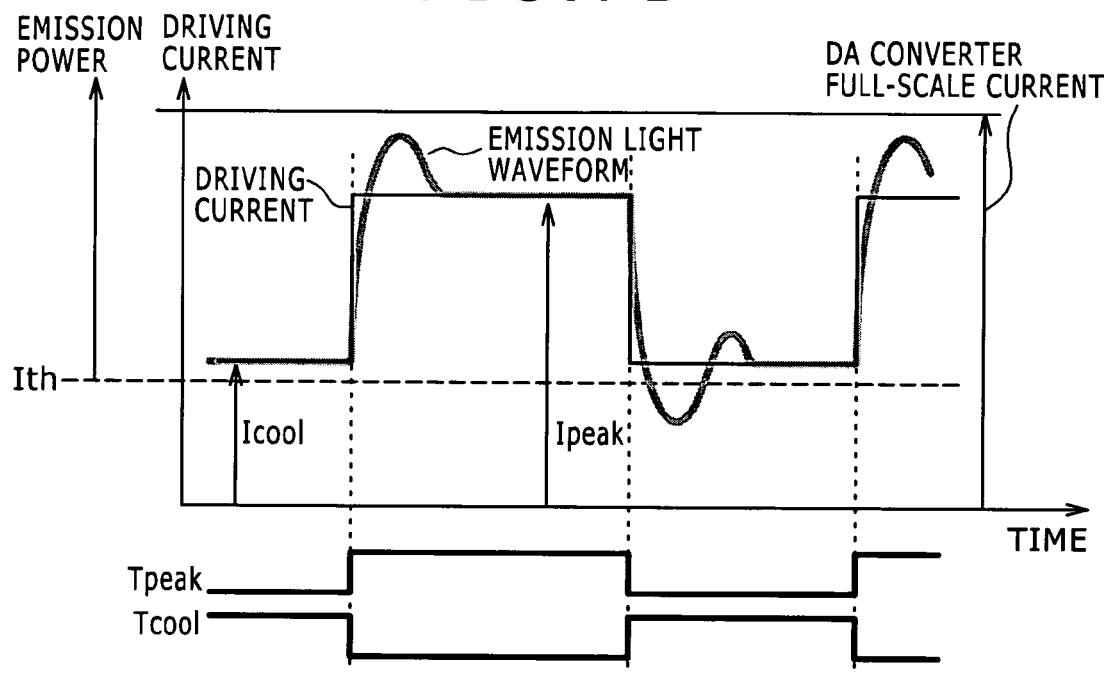
FIGS. 7B and 7C are waveform diagrams illustrating operation of the configuration shown in FIG. 7A.
Figure 7C:
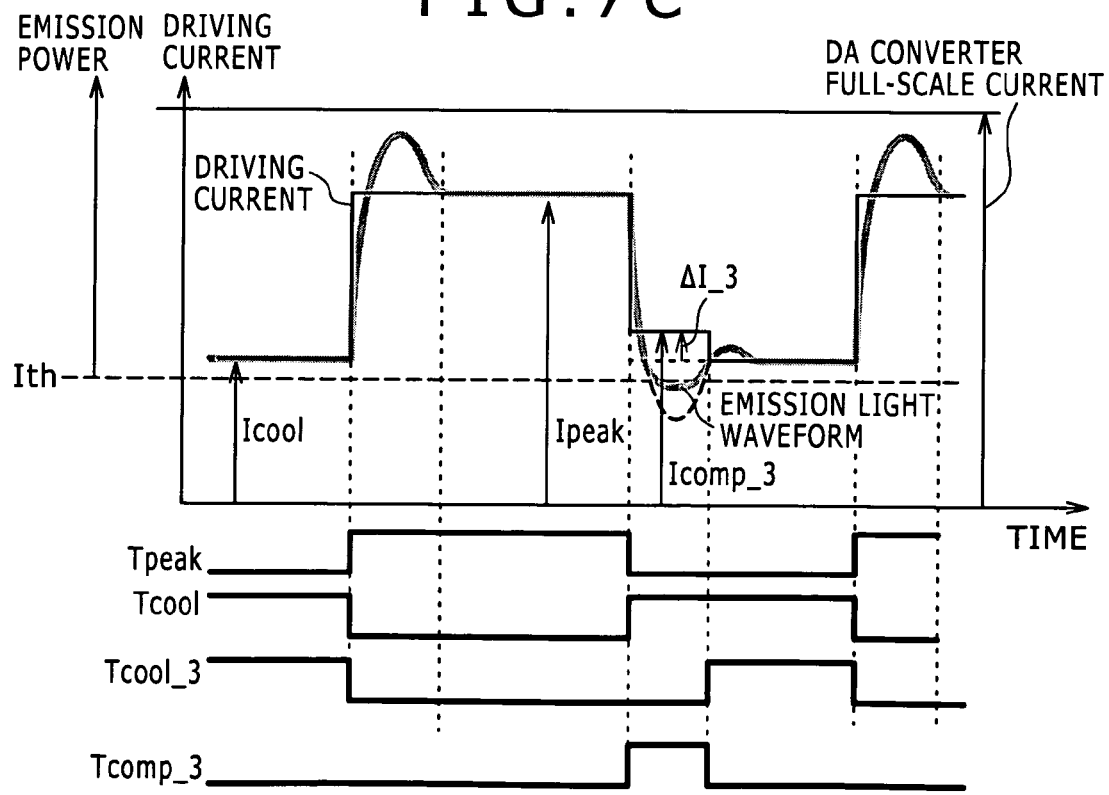

FIG. 7A shows a configuration of a third example of the first mode of waveform correction, and FIGS. 7B and 7C illustrate operation in the waveform correction. Referring to FIG. 7A, the laser driving circuit 200A_3 of the third example of the first mode includes emission light waveform correction unit 600A_3. The emission light waveform correction unit 600A_3 includes a correction information storage portion 610A_3, a correction timing generation portion 630A_3, and a driving level changeover portion 6503. The functioning sections denoted by the suffix "_3" function similarly to the corresponding functioning sections denoted by the suffix "_1" of the first example of the first mode, and the configuration of the emission light waveform correction unit 600A_3 itself is not different from that of the first example of the first mode.

For example, the correction information storage portion 610A_3 stores correction level data Dcomp_3 corresponding to driving current amount Icomp_3 of correction levels. A reference timing selection part 632_3 selects a reference channel CH_3, which is to be used as a reference for a correction period, from among four timing signals Tcool, Terase, Tod and Tpeak and transfers the selected reference channel CH_3 to a delay setting part 634_3. The delay setting part 634_3 decides a starting edge of the selected reference channel CH_3 as a starting point and sets a delay time CD_3 from the starting point and then transfers the delay time CD_3 to a pulse width setting part 636_3. The pulse width setting part 636_3 sets a pulse width CT_3 which defines the width of the correction period. The correction timing generation portion 630A_3 thereby generates a correction timing pulse Tcomp_3 representative of a correction period and a masking pulse Mcomp_3. The correction timing generation portion 630A_3 supplies the correction timing pulse Tcomp_3 to a correction switch 652_3 and supplies the masking pulse Mcomp_3 to a masking part 654_3.

The correction switch 652_3 receives, at an input terminal thereof, the correction level data Dcomp_3 from the correction information storage portion 610A_3 and is connected at an output terminal thereof to the input terminal of the DA converter 608. The correction switch 652_3 is switched on when the correction timing pulse Tcomp_3 has the active H level. A masking switch 655_3 of the masking part 654_3 switches on selection of a timing signal for each of the channels within a period within which the masking pulse Mcomp_3 has the H level.

Operation of the emission light waveform correction unit 600A_3 is described with reference to FIGS. 7B and 7C. FIG. 7B illustrates a laser driving waveform and a laser emission light waveform before correction is carried out and is similar to FIG. 5B and FIG. 6B. FIG. 7C illustrates a laser driving waveform and a laser emission light waveform where correction for moderating an undershoot which appears immediately after a falling edge of a laser emission light wave is carried out by the emission light waveform correction unit 600A_3. Although the masking pulse Mcomp_3 is not shown, it is obtained by logically inverting the correction timing pulse Tcomp_3. The timing signal Tcool_3 is obtained by gating the timing signal Tcool with the correction timing pulse Tcomp_3.

In order to suppress an undershoot which appears immediately after a falling edge of the driving current when a Tcool period is entered, correction level data Dcomp_3 corresponding to a correction level Icomp_3 which is higher than the reference level Icool for the cool power level is set to the correction information storage portion 610A_3. Further, a correction period within which the correction switch 652_3 is to be on is set with reference to the timing signal Tcool, and no delay is set while the pulse width is set to an appropriate value in response to the shape and the period of the undershoot. In particular, the reference timing selection part 632_3 selects the timing signal Tcool as the reference channel CH_3. The delay setting part 634_3 sets delay time CD_3 to zero. The pulse width setting part 636_3 sets an appropriate pulse width CT_3 in response to the shape and the period of the undershoot. Consequently, the correction timing generation portion 630A_3 generates a correction timing pulse Tcomp_3 and a masking pulse Mcomp_3 in accordance with the appearance period and shape of an undershoot.

After a Tcool period is entered, the correction timing pulse Tcomp_3 immediately changes to the active H level and a correction switch 652_3 is switched on. Consequently, a correction level data Dcomp_3 corresponding to the correction current level Icomp_3 set in the correction information storage portion 610A_3 is inputted to the DA converter 608. Within this period, the masking pulse Mcomp_3 has the L level and the timing signal Tcool is not selected by a masking switch 655_3 of a masking part 654_3, and consequently, the level information Dcool is not inputted to the DA converter 608.

When a set pulse width CT_3 comes to an end and the correction timing pulse Tcomp_3 changes to the inactive L level, the correction switch 652_3 is switched off and the supply of the correction level data Dcomp_3 to the DA converter 608 is stopped. Simultaneously, the masking pulse Mcomp_3 changes to the H level. Consequently, the masking of the timing signal Tcool is canceled and the level information Dcool is inputted to the DA converter 608, and therefore, the laser driving current changes over to the reference level Icool.

Consequently, the driving current immediately after a falling edge when a Tcool period is entered from a Tpeak period can be raised to the correction current level Icomp_3 which is higher than the reference level Icool for the cool power level. By the series of operations described, an undershoot of the laser emission light waveform which appears immediately after a falling edge when a Tcool period is entered from a Tpeak period can be corrected.

Fourth Example

Figure 8A:
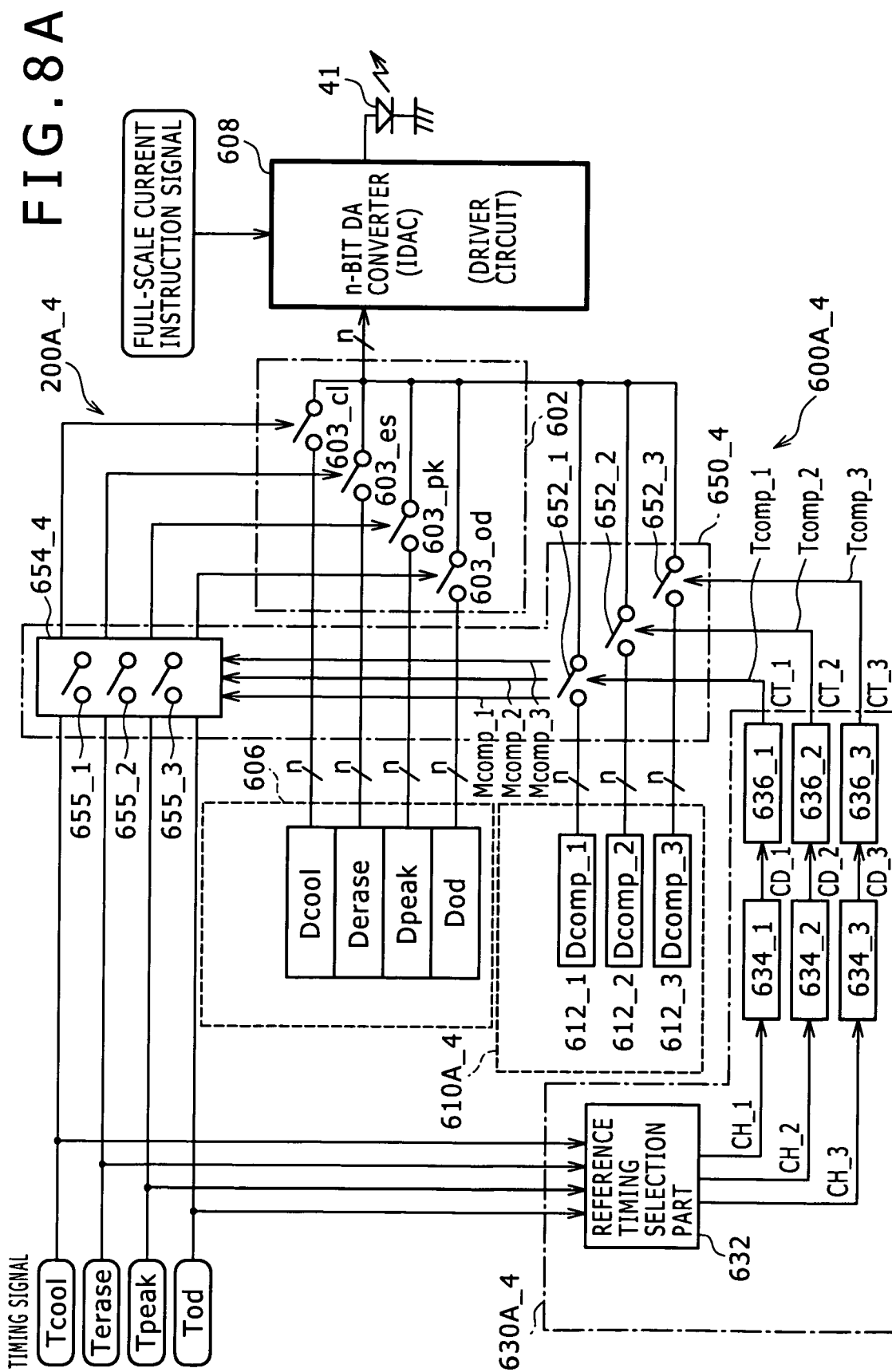
FIG. 8A is a block diagram showing a configuration of a fourth example of the first mode of emission light waveform correction.

FIG. 8A shows a configuration of a fourth example of the first mode of waveform correction, and FIGS. 8B and 8C illustrate operation in the waveform correction. Referring to FIG. 8A, the laser driving circuit 200A_4 of the fourth example of the first mode includes an emission light waveform correction unit 600A_4. The emission light waveform correction unit includes three systems each including a correction information storage portion 610A, a correction timing generation portion 630A and a driving level changeover portion 650. For the first system, a suffix "_1" is added; for the second system, another suffix "_2" is added; and for the third system, a further suffix "_3" is added. A common item to the three systems is denoted by a still further suffix "_4." The system of the suffix "_1" is the first example described above; the system of the suffix "_2" is the second example described hereinabove, and the system of the suffix "_3" is the third example described hereinabove. It is to be noted that, as regards a correction timing generation portion 630, a reference timing selection part 632 common to the three systems is used such that it individually selects and outputs reference channels CH_1, CH_2 and CH_3 of the systems. The functioning sections of the reference timing selection parts 632_1, 632_2 and 632_3 are made common to simplify the circuit configuration.

Since the fourth example of the first mode includes a plurality of systems, in the example shown, three systems, of correction circuits, correction is carried out for a plurality of places, in the example shown, of a laser emission light waveform. Since the systems are same as the first to third examples described above, description of the configuration and operation of them is omitted herein to avoid redundancy.

Actually, the system of the second example which suppresses an overshoot of a laser emission light waveform which appears after the laser driving current becomes lower than the threshold current of the laser due to an undershoot immediately after a falling edge may not possibly be provided due to the system of the third example which suppresses an undershoot immediately after a falling edge. This is because, where an undershoot immediately after a falling edge is suppressed, also a succeeding overshoot is estimated to be suppressed.

Fifth Example

Figure 9A:
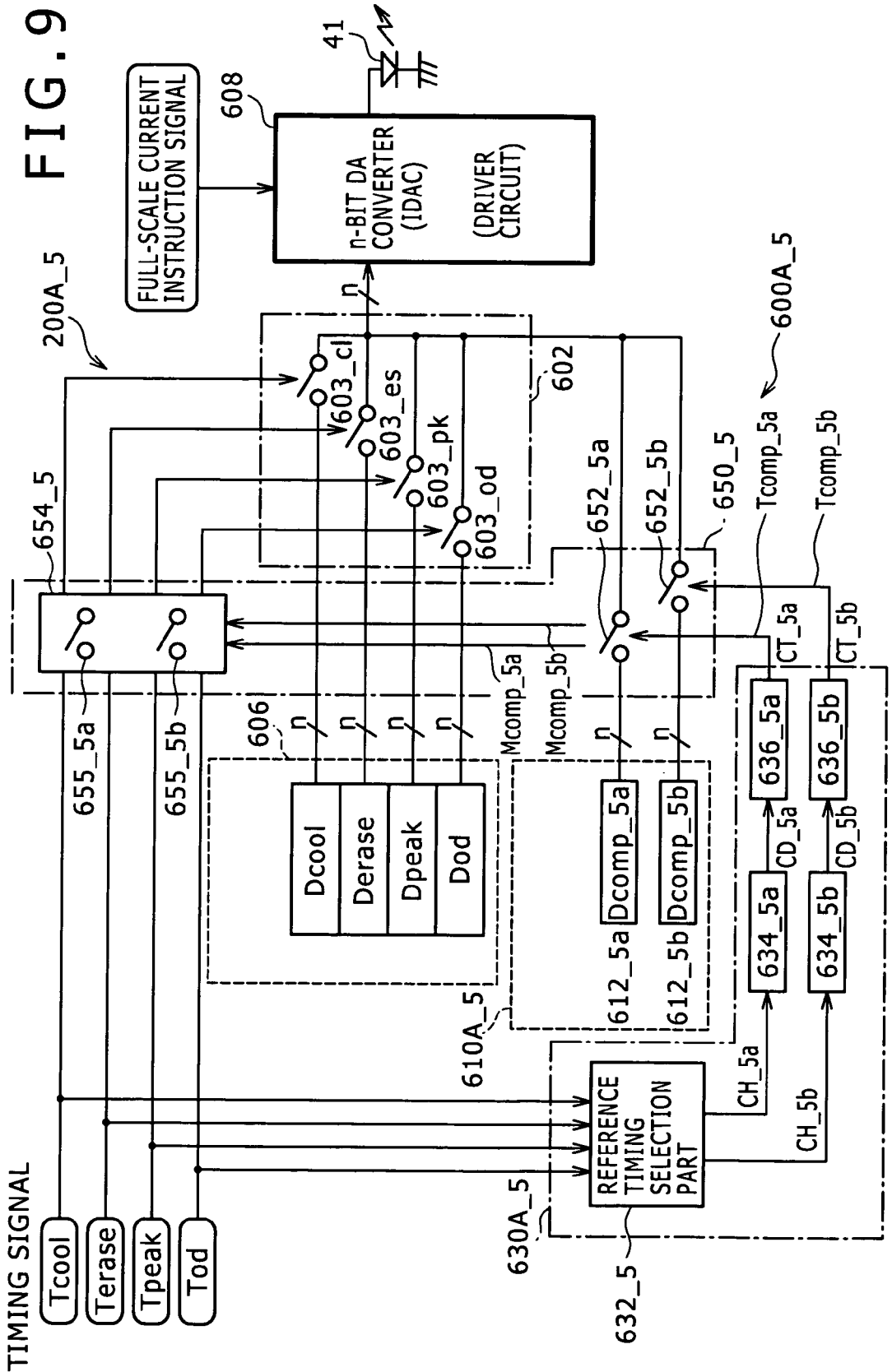
FIG. 9A is a block diagram showing a configuration of a fifth example of the first mode of emission light waveform correction.
Figure 9B:
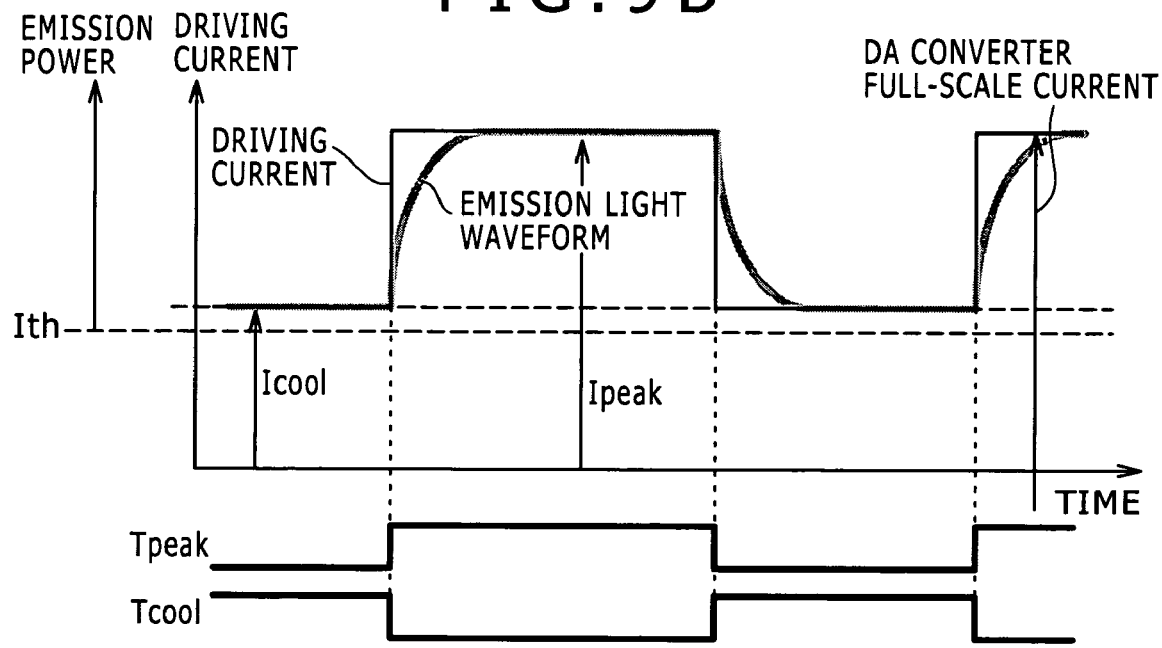
FIGS. 9B and 9C are waveform diagrams illustrating operation of the configuration shown in FIG. 9A.
Figure 9C:
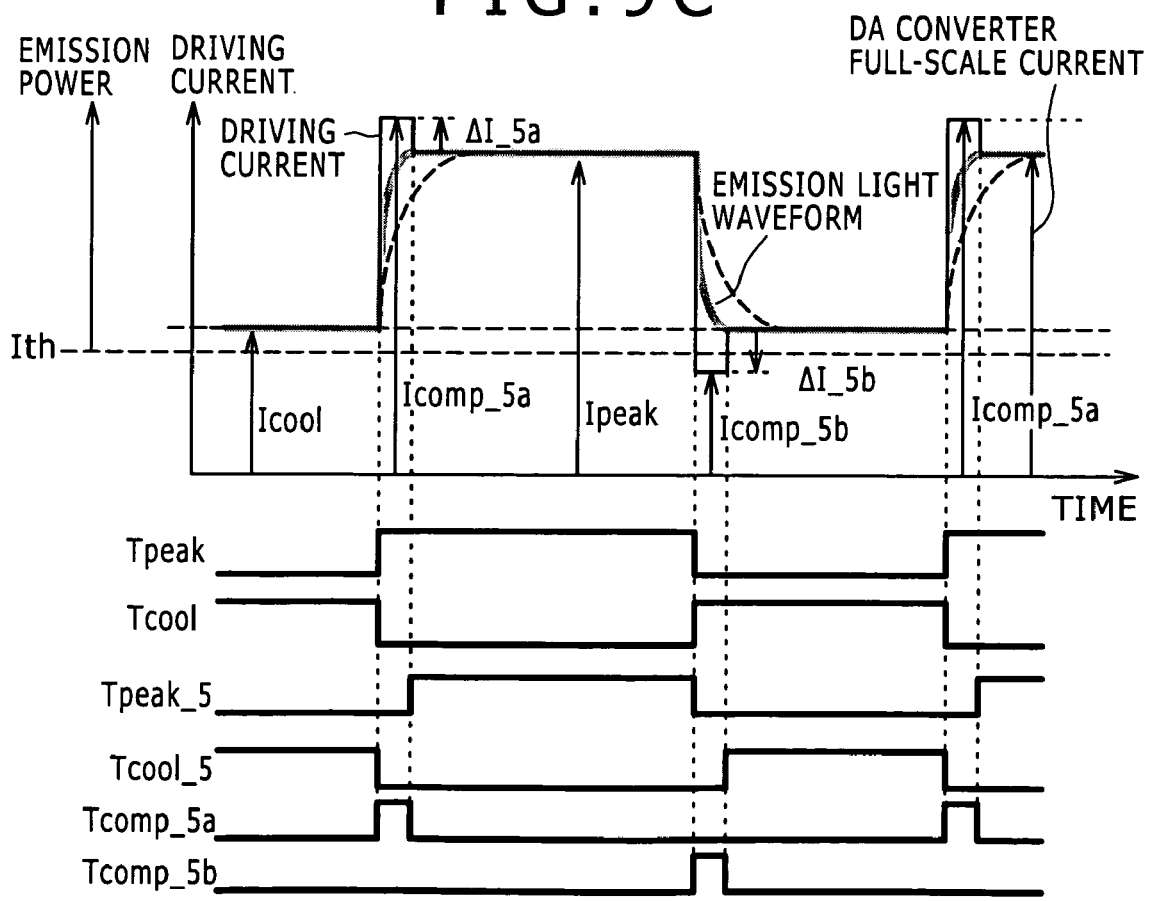

FIG. 9A shows a configuration of a fifth example of the first mode of waveform correction, and FIGS. 9B and 9C illustrate operation in the waveform correction. The fifth example of the first mode is directed to correction where the response speed at a rising edge and a falling edge is low, that is, where the waveform is deformed.

Referring to FIG. 9A, the laser driving circuit 200A_5 of the fifth example of the first mode includes an emission light waveform correction unit 600A_5. In FIG. 9A, a common item to two systems denoted by suffixes "5a" and "5b" is denoted by a suffix "_5." The emission light waveform correction unit 600A_5 includes a correction information storage portion 610A_5, a correction timing generation portion 630A_5, and a driving level changeover portion 650_5. The functioning sections function similarly to the corresponding functioning sections denoted by the suffix "_1" of the first example of the first mode, and the configuration of the systems of the emission light waveform correction unit 600A_5 itself is not different from that of the first example of the first mode. Particularly, the functioning sections have a circuit configuration similar to that of the fourth example wherein a correction object is set to a plurality of places.

Correction current level registers 612_5a and 612_5b store correction level data Dcomp_5a and Dcomp_5b corresponding to driving current amounts Icomp_5a and Icomp_5b of correction levels.

A reference timing selection part 632_5 selects reference channels CH_5a and CH_5b, which are used as a reference for a correction period, from among four timing signals Tcool, Terase, Tod and Tpeak and passes the reference channels CH_5a and CH_5b to delay setting parts 634_5a and 634_5b, respectively.

The delay setting parts 634_5a and 634_5b determine a starting edge of the selected reference channels CH_5a and CH_5b as starting points, set delay time CD_5a and CD_5b from the starting points and passes the delay time CD_5a and CD_5b to the pulse width setting parts 636_5a and 636_5b, respectively. The pulse width setting parts 636_5a and 636_5b set pulse widths CT_5a and CT_5b for defining a width of a correction period. A correction timing generation portion 630A_5 thereby generates correction timing pulses Tcomp_5a and Tcomp_5b representative of a correction period and masking pulses Mcomp_5a and Mcomp_5b. The correction timing generation portion 630A_5 supplies the correction timing pulses Tcomp_5a and Tcomp_5b to correction switches 652_5a and 652_5b, respectively, and supplies the masking pulses Mcomp_5a and Mcomp_5b to a masking part 654_5.

The correction switches 652_5a and 652_5b receive, at an input terminal thereof, correction level data Dcomp_5a and Dcomp_5b from the correction current level registers 612_5a and 612_5b, respectively, and are connected at an output terminal thereof to an input terminal of the DA converter 608. The correction switches 652_5a and 652_5b exhibit an on state when the correction timing pulses Tcomp_5a and Tcomp_5b have the active H level, respectively. Masking switches 655_5a and 655_5b of the masking part 654_5 switch on selection of a timing signal for each channel within a period within which the masking pulses Mcomp_5a and Mcomp_5b have the H level.

Operation of the emission light waveform correction unit 600A_5 is described with reference to FIGS. 9B and 9C. FIG. 9B shows a laser driving waveform and a laser emission light waveform before correction is carried out. As seen in FIG. 9B, the laser emission light waveform indicates that the response speed at a rising edge and a falling edge thereof is delayed. In other words, waveform deformation appears at a rising edge and a falling edge of the laser emission light waveform.

FIG. 9C shows a laser driving waveform and a laser emission light waveform where the emission light waveform correction unit 600A_5 carries out such correction as to moderate waveform deformation at a rising edge and a falling edge to raise the response speed at a rising edge and a falling edge. Though not illustrated, the masking pulse Mcomp_5a is obtained by logically inverting the correction timing pulse Tcomp_5a, and the masking pulse Mcomp_5b is obtained by logically inverting the correction timing pulse Tcomp_5b. The timing signal Tpeak_5 is obtained by gating the timing signal Tpeak with the correction timing pulse Tcomp_5a. The timing signal Tcool_5 is obtained by gating the timing signal Tcool with the correction timing pulse Tcomp_5b.

In order to improve the response at a rising edge against a delay when a Tpeak period is entered, that is, to raise the response speed, correction level data Dcomp_5a corresponding to a correction level Icomp_5a which is higher than the reference level Ipeak for the peak power level is first set to the correction current level register 612_5a.

Further, the correction period within which the correction switch 652_5a is to be on is set with reference to the timing signal Tpeak while no delay is set, and the pulse width is set to an appropriate value in response to the shape and the period of the rising edge response delay. In other words, the reference timing selection part 632_5 selects the timing signal Tpeak as the reference channel CH_5a. The delay setting part 634_5a sets the delay time CD_5a to zero. The pulse width setting part 636_5a sets an appropriate pulse width CT_5a in response to the shape and the period of the rising edge response delay. Consequently, the correction timing generation portion 630A_5a generates a correction timing pulse Tcomp_5a and a masking pulse Mcomp_5a in accordance with the period of appearance and the shape of the rising edge response delay.

After the Tpeak period is entered, the correction timing pulse Tcomp_5a immediately changes to the active H level and the correction switch 652_5a is switched on. The correction level data Dcomp_5a corresponding to the correction current level Icomp_5a is set in the correction current level register 612_5a, and by switching on the correction switch 652_5a first with the correction timing pulse Tcomp_5a immediately after a rising edge of the Tpeak period before correction, the correction level data Dcomp_5a is inputted to the DA converter 608. Within this period, the masking pulse Mcomp_5a has the L level and the timing signal Tpeak is not selected any more by the masking switch 655_5a of the masking part 654_5, and therefore, the level information Dpeak is not inputted to the DA converter 608.

If the set pulse width CT_5a comes to an end and the correction timing pulse Tcomp_5a is placed into the inactive L level, then the correction switch 652_5a is switched off and the supply of the correction level data Dcomp_5a to the DA converter 608 is stopped. Simultaneously, the masking pulse Mcomp_5a is placed into the H level, and consequently, the masking of the timing signal Tpeak is canceled and then the level information Dpeak is inputted to the DA converter 608. As a result, the laser driving current is changed over to the reference level Ipeak.

As a result, the driving current immediately after a rising edge when a Tpeak period is entered from a Tcool period can be raised to the correction level Icomp_5a which is higher than the reference level Ipeak for the peak power level. As a result, at a rising edge when a Tpeak period is entered from a Tcool period, a driving waveform to which correction current like an overshoot is added can be generated, and a rising edge response delay of the laser emission light waveform can be compensated for.

Further, in order to compensate for the response delay at a falling edge of the laser driving waveform when a Tcool period is entered, that is, to raise the response speed, correction level data Dcomp_5b corresponding to the correction level Icomp_5b lower than the reference level Icool for the cool power level is first set to the correction current level register 612_5b.

Further, the correction period within which the correction switch 652_5b is to be on is set with reference to the timing signal Tcool while no delay is set, and the pulse width is set to an appropriate value in response to the shape and the period of the falling edge response delay. In other words, the reference timing selection part 632_5 selects the timing signal Tcool as the reference channel CH_5b. The delay setting part 634_5b sets the delay time CD_5b to zero. The pulse width setting part 636_5b sets an appropriate pulse width CT_5b in response to the shape and the period of the falling edge response delay. Consequently, the correction timing generation portion 630A_5b generates a correction timing pulse Tcomp_5b and a masking pulse Mcomp_5b in accordance with the period of appearance and the shape of the falling edge response delay.

After the Tcool period is entered, the correction timing pulse Tcomp_5b immediately changes to the active H level and the correction switch 652_5b is switched on. The correction level data Dcomp_5b corresponding to the correction current level Icomp_5b is set in the correction current level register 612_5b, and by switching on the correction switch 652_5b first with the correction timing pulse Tcomp_5b immediately after a falling edge of the Tcool period before correction, the correction level data Dcomp_5b is inputted to the DA converter 608. Within this period, the masking pulse Mcomp_5b has the L level and the timing signal Tcool is not selected any more by the masking switch 655_5b of the masking part 654_5, and therefore, the level information Dcool is not inputted to the DA converter 608.

If the set pulse width CT_5b comes to an end and the correction timing pulse Tcomp_5b is placed into the inactive L level, then the correction switch 652_5b is switched off and the supply of the correction level data Dcomp_5b to the DA converter 608 is stopped. Simultaneously, the masking pulse Mcomp_5b is placed into the H level, and consequently, the masking of the timing signal Tcool is canceled and then the level information Dcool is inputted to the DA converter 608. As a result, the laser driving current is changed over to the reference level Icool.

As a result, the driving current immediately after a falling edge when a Tcool period is entered from a Tpeak period can be lowered to the correction level Icomp_5b which is lower than the reference level Icool for the cool power level. As a result, at a falling edge when a Tcool period is entered from a Tpeak period, a driving waveform to which correction current like an undershoot is added can be generated, and a falling edge response delay of the laser emission light waveform can be compensated for. By positively adding an overshoot and an undershoot to driving current, the response speed at a rising edge and a falling edge can be raised.

<Waveform Correction: Second Mode>

FIGS. 10A to 12C show an emission light waveform correction unit of the second mode. In the second mode, a correction amount is set separately from a normal driving level or normal level outputted from a circuit configuration of the DA conversion system and is injected into, that is, added to or subtracted from, the normal level in a timed relationship with a timing at which correction is required. In short, the second mode is different from the first mode in that not an absolute value but information of a correction amount $\Delta I$ is provided as a correction level.

In order to cope with this, a correction amount information storage portion for storing information of correction amounts and an injection changeover portion for carrying out changeover of whether or not a correction amount should be injected into a normal level. The correction amount information storage portion is a second example of the correction information storage portion. It is to be noted that, in an alternative system configuration wherein timing information for which correction is required is not transmitted independently of a write strategy signal from the drive substrate side, a correction timing generation portion or correction period setting portion for generating timing information for which correction is required is provided additionally based on the received write strategy signal.

Further, the correction object period may be provided not at one place but at a plurality of places, and in this instance, the correction amount information storage portion, correction timing generation portion and injection changeover portion are provided for each of systems for the correction object periods so that correction can be carried out for various places of the emission light waveform. Further, the waveform abnormality of the correction object may be an overshoot immediately after a rising edge, an undershoot immediately after a falling edge, an overshoot after an undershoot and a slow response at a rising edge or a falling edge. These are similar to those in the first mode. Particular description is given below.

First Example

Figure 10A:
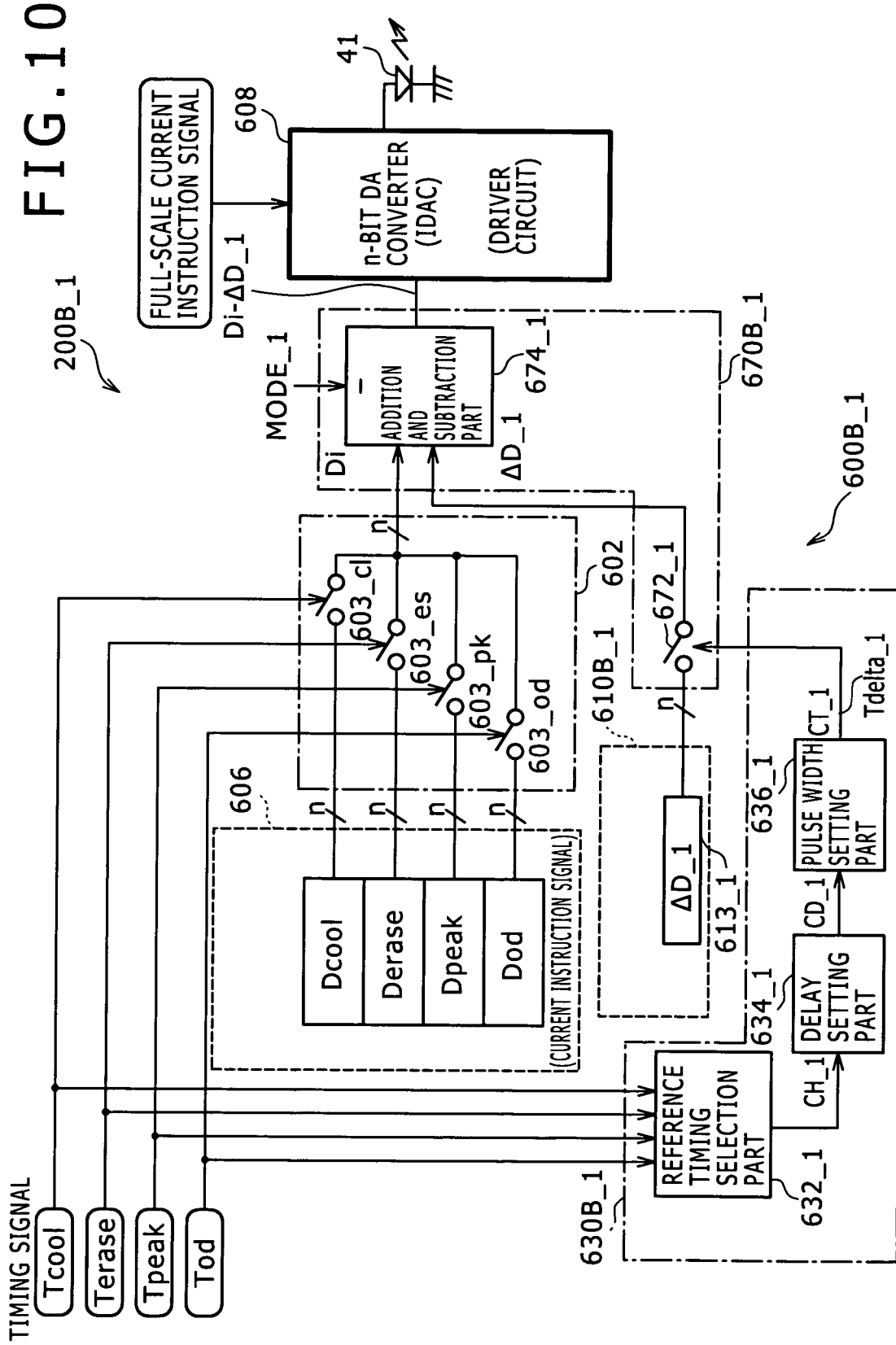
FIG. 10A is a block diagram showing a configuration of a first example of a second mode of emission light waveform correction.
Figure 10B:
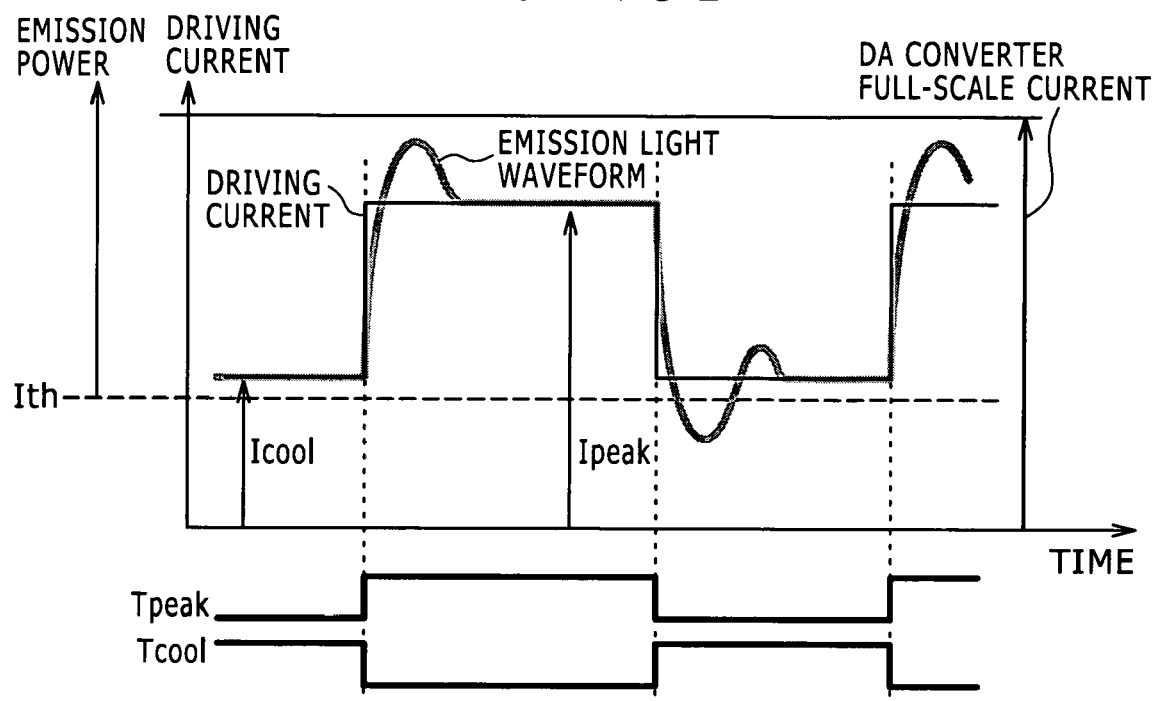
FIGS. 10B and 10C are waveform diagrams illustrating operation of the configuration shown in FIG. 10A.
Figure 10C:
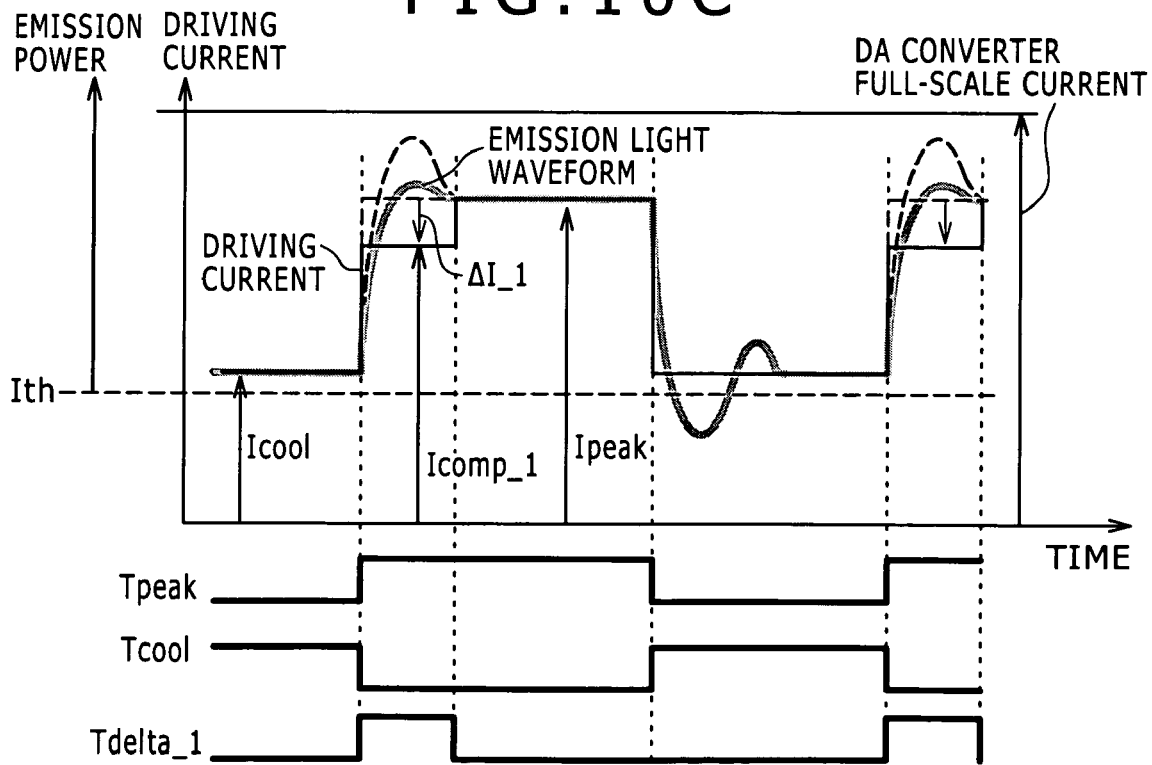

FIG. 10A shows a first example of the second mode of waveform correction, and FIGS. 10B and 10C illustrate operation in the waveform correction. Referring to FIG. 10A, the laser driving circuit 200B_1 of the first example of the second mode includes an emission light waveform correction unit 600B_1. The emission light waveform correction unit 600B_1 includes a correction information storage portion 610B_1, a correction timing generation portion 630B_1 and an injection changeover portion 670B_1.

The correction information storage portion 610B_1 is an example of a correction amount information storage portion which includes a correction current amount register 613_1 for storing correction amount data $\Delta D\_1$ corresponding to a correction current amount $\Delta I\_1$. The correction timing generation portion 630B_1 includes a reference timing selection part 632_1, a delay setting part 634_1 and a pulse width setting part 636_1 similarly to the correction timing generation portion 630A_1. The injection changeover portion 670B_1 includes a correction switch 672_1 and an addition and subtraction part 674_1. It is to be noted that, while, different from the correction timing generation portion 630A_1, the correction timing generation portion 630B_1 generates a correction timing pulse Tdelta_1 representative of a correction period, it may not generate a masking pulse. The correction timing generation portion 630B_1 supplies the correction timing pulse Tdelta_1 to the correction switch 672_1.

The switch 603 of the switch circuit 602 is connected at an output terminal thereof to one of input terminals of the addition and subtraction part 674_1. In short, current level data Di from the reference level information storage portion 606 is supplied to the one of the input terminals of the addition and subtraction part 674_1. The correction switch 672_1 receives, at the input terminal thereof, correction amount data $\Delta D\_1$ supplied thereto from the correction information storage portion 61013_1, and is connected at an output terminal thereof to the other input terminal of the addition and subtraction part 674_1. The correction switch 672_1 exhibits an on state within a period within which the correction timing pulse Tdelta_1 has the active H level. Consequently, only when the correction timing pulse Tdelta_1 has the active H level, the correction amount data $\Delta D\_1$ is inputted to the other input terminal of the addition and subtraction part 674_1.

The injection changeover portion 670B_1 is configured to change the direction in which a correction amount is to be inputted. To this end, the addition and subtraction part 674_1 receives, at a mode controlling input terminal thereof, a control signal Mode_1 for carrying out changeover between an addition mode and a subtraction mode. The changeover between the addition mode and the subtraction mode is set in a corresponding relationship to a correction direction for the driving current. Incidentally, a mode is set in response to whether the correction amount should be set to a positive value or negative value and also to the correction direction of the driving current amount, that is, whether the driving current amount should be increased or decreased. Here, it is assumed that the correction amount is set as a positive value. The addition and subtraction part 674_1 may be configured such that it is formed as one of an adder and a subtractor and the correction direction is adjusted with the sign of the correction direction.

The addition and subtraction part 674_1 supplies, in the addition mode, an addition result of the data input to both input terminals, that is, Di+ΔD_1, to the DA converter 608, but in the subtraction mode, supplies a result of subtraction between the data input to both input terminals, that is, Di−ΔD_1, to the DA converter 608. Since the correction amount data ΔD_1 is supplied to the other input terminal of the addition and subtraction part 674_1 only when the correction timing pulse Tdelta_1 has the active H level, only when the correction timing pulse Tdelta_1 has the active H level, the value "±ΔD_1" functions effectively on the current level data Di and the correction current Icomp_1 is obtained.

Operation of the emission light waveform correction unit 600B_1 is described with reference to FIGS. 10B and 10C. FIG. 10B shows a laser driving waveform and a laser emission light waveform before correction is carried out. Level information Dcool and Dpeak is successively inputted to the DA converter 608 in response to timing signals Tcool and Tpeak, and laser driving current of two values of Icool and Ipeak is outputted from the DA converter 608. The laser emission light waveform of a correction object has a great overshoot immediately after a rising edge.

FIG. 10C shows a laser driving waveform and a laser emission light waveform where such correction as to reduce an overshoot is carried out by the emission light waveform correction unit 600B_1. In order to suppress an overshoot which appears immediately after a rising edge of the laser driving signal when a Tpeak period is entered from a Tcool period, the driving current immediately after the rising edge is set to a level lower by the correction current amount ΔI_1 than the reference level Ipeak for the peak power level, which corresponds to the correction level Icomp_1 in the first mode. To this end, the correction amount data ΔD_1 corresponding to the correction current amount ΔI_1 is set to the correction information storage portion 610B_1. Further, the subtraction mode is set to the addition and subtraction part 674_1.

The correction period within which the correction switch 672_1 is to be on is set with reference to the timing signal Tpeak while no delay is set, and the pulse width is set to an appropriate value in response to the shape and the period of the overshoot. In this regard, the first example of the second mode is similar to the first example of the first mode. Consequently, the correction timing generation portion 630B_1 generates a correction timing pulse Tdelta_1 in accordance with the period of appearance and the shape of the overshoot.

After the Tpeak period is entered, immediately after a rising edge of the laser driving signal, the current level data Di=Dpeak is inputted from the reference level information storage portion 606 to the addition and subtraction part 674_1. In short, the level information Dpeak is rendered effective as the level information in response to the timing signal Tpeak. Simultaneously, also the correction timing pulse Tdelta_1 changes to the active H level and the correction switch 672_1 is switched on, and consequently, the correction amount data ΔD_1 which is set in the correction information storage portion 610B_1 and corresponds to the correction current amount ΔI_1 is inputted to the addition and subtraction part 674_1. As a result, the addition and subtraction part 674_1 subtracts the correction amount data ΔD_1 from the level information Dpeak for the peak power level and inputs a resulting value to the DA converter 608. Therefore, the laser driving current Icomp_1 outputted from the DA converter 608 is given by "Ipeak−ΔI_1."

When the set pulse width CT_1 comes to an end and the correction timing pulse Tdelta_1 changes to the inactive L level, then the correction switch 672_1 is switched off and the supply of the correction amount data ΔD_1 to the addition and subtraction part 674_1 is stopped or canceled. As a result, the addition and subtraction part 674_1 inputs the level information Dpeak of the peak power level to the DA converter 608. Therefore, the input data to the DA converter 608 becomes only the level information Dpeak of the peak power level, and the laser driving current changes over to the reference level Ipeak.

Consequently, the driving current immediately after a rising edge when a Tpeak period is entered from a Tcool period can be lowered to the correction level Icomp_1 which is lower than the reference level Ipeak for the peak power level. By the series of operations described, an overshoot of the laser emission light waveform which appears immediately after a rising edge when a Tpeak period is entered from a Tcool period can be corrected.

Here, although correction against an overshoot when a Tpeak period is entered from a Tcool period is described above, waveform abnormality of a correction object is not limited to this. Though not shown, an overshoot of a laser emission light waveform which appears after the laser driving current becomes lower than the threshold current of the laser due to an undershoot immediately after a falling edge of the laser driving current when a Tcool period is entered from a Tpeak period may be suppressed low as in the case of the second example of the first mode. In this instance, correction amount data ΔD_2 corresponding to the correction level Icomp_2 shown in FIG. 6C should be handled, and an addition and subtraction part 674_2 should operate in the subtraction mode. While correction timing pulse Tdelta_2 remains the active H level, a correction switch 672_2 is on, and the correction current amount ΔI_2 is subtracted from the original reference level Icool. As a result, an overshoot after an undershoot can be moderated.

Further, though not shown, an undershoot immediately after a falling edge of the laser driving signal when a Tcool period is entered from a Tpeak period may be suppressed to a low level as in the case of the third example of the first mode. In this instance, correction amount data ΔD_3 corresponding to a correction level Icomp_3 shown in FIG. 7C should be handled, and an addition and subtraction part 674_3 not shown should operate in the addition mode. While a correction timing pulse Tdelta_3 remains the active H level, a correction switch 672_3 is on, and the correction current amount ΔI_3 is applied to the original reference level Icool. As a result, the falling speed of the driving current is equivalently suppressed, and an undershoot can be moderated.

Second Example

Figure 11B:
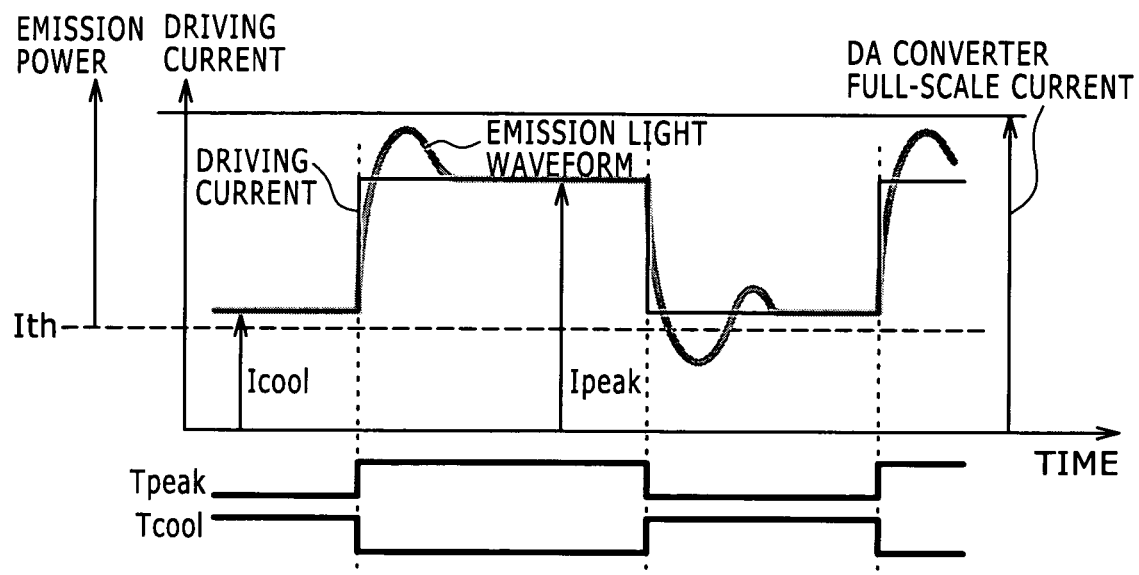
FIGS. 11B and 11C are waveform diagrams illustrating operation of the configuration shown in FIG. 11A.
Figure 11C:
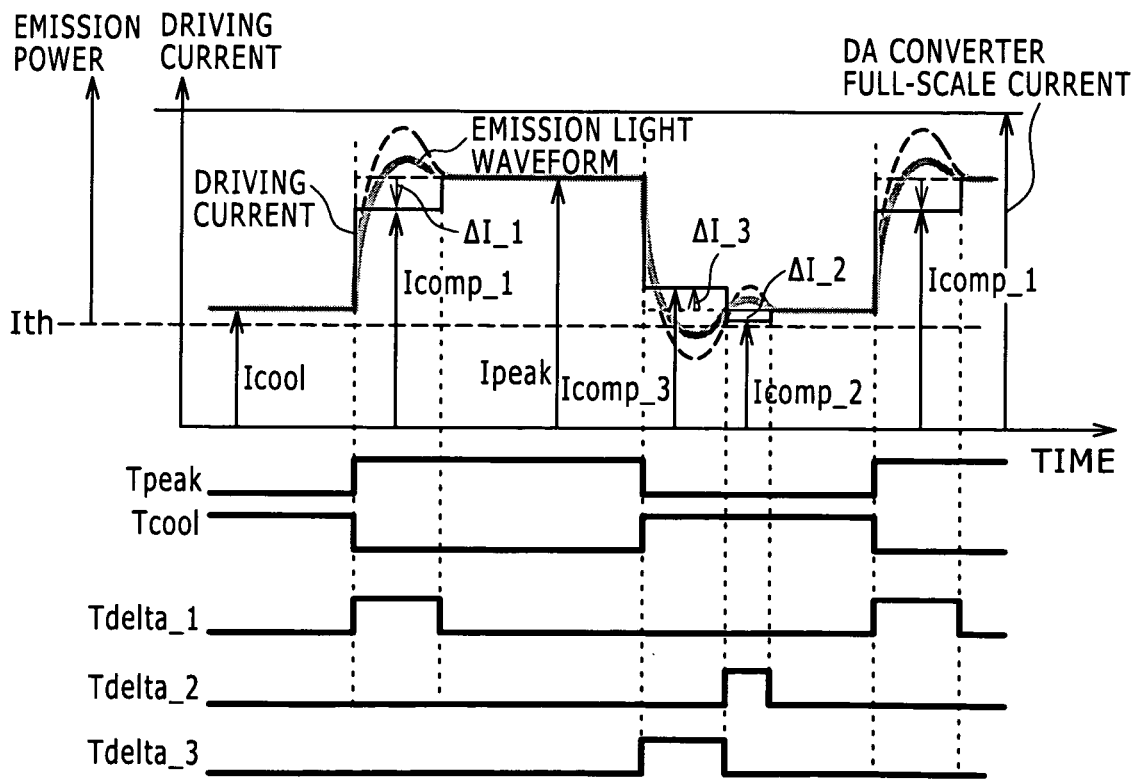

FIG. 11A shows a configuration of a second example of the second mode of waveform correction, and FIGS. 11B and 11C illustrate operation in the waveform correction. The second example of the second mode includes a plurality of, three in the example shown, systems of correction circuits to carry out correction for a plurality of places, in the example shown, for three places, of a laser emission light waveform similarly as in the fourth example of the first mode.

The laser driving circuit 200B_4 of the second example of the second mode includes a emission light waveform correction unit 600B_4 having three systems of emission light waveform correction units 600. The systems are configured similarly to the first to third examples of the first mode described hereinabove, and detailed description of the configuration and operation of them is omitted herein to avoid redundancy. It is to be noted that an addition and subtraction part 674_4 has input terminals for correction amount data $\Delta D\_1$, $\Delta D\_2$ and $\Delta D\_3$ of the systems and mode controlling input terminals corresponding to control signals Mode_1, Mode_2 and Mode_3. If the addition and subtraction part 674_4 is applied to the examples described above, then it inputs an addition and subtraction result $Di-\Delta D\_1-\Delta D\_2+\Delta D\_3$ to the DA converter 608.

Third Example

Figure 12A:
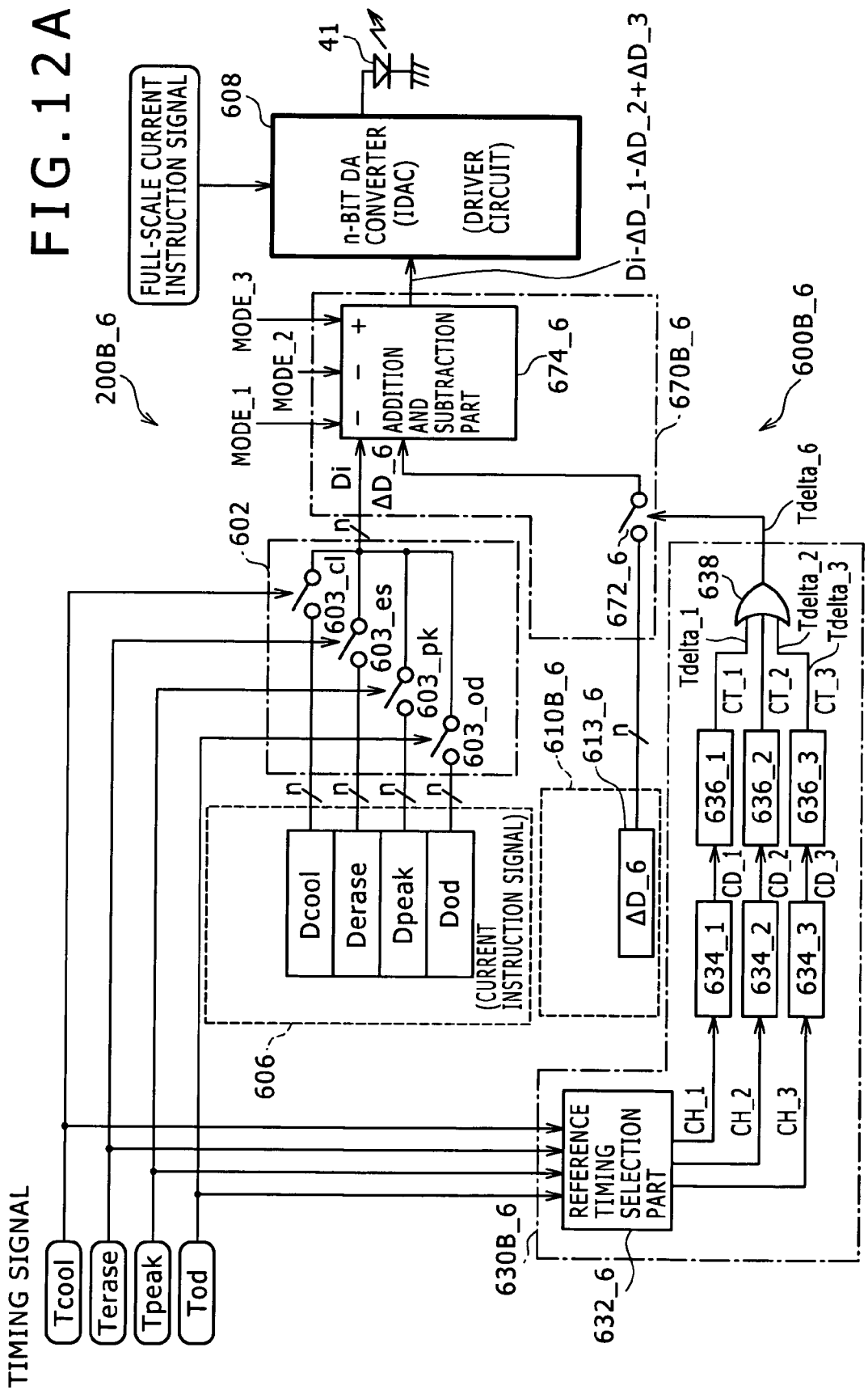
FIG. 12A is a block diagram showing a configuration of a third example of the second mode of emission light waveform correction.
Figure 12B:
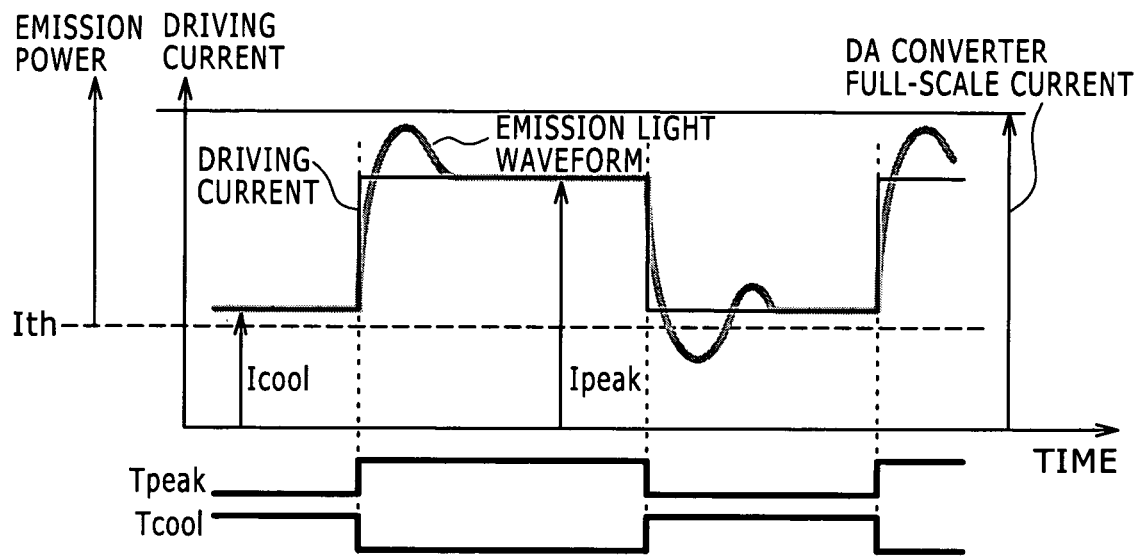
FIGS. 12B and 12C are waveform diagrams illustrating operation of the configuration shown in FIG. 12A.
Figure 12C:
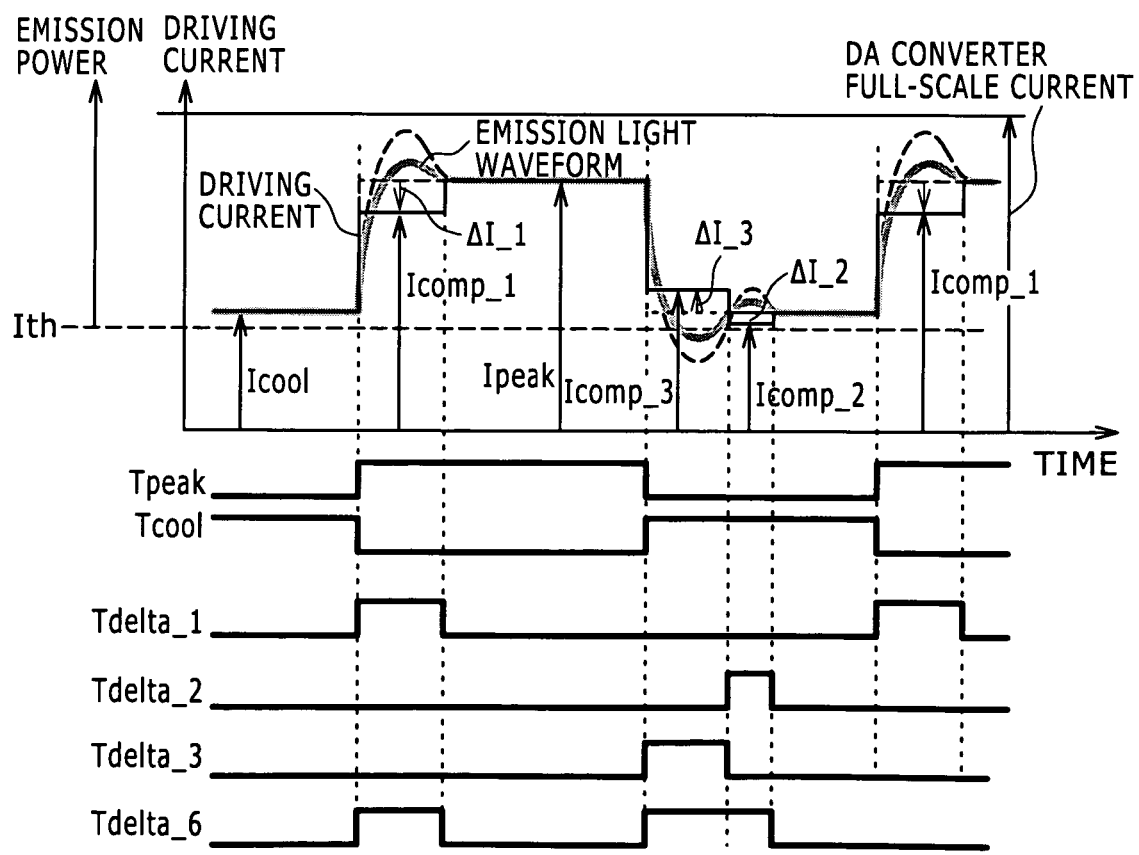

FIG. 12A shows a configuration of a third example of the second mode of waveform correction, and FIGS. 12B and 12C illustrate operation in the waveform correction. The third example of the second mode is designed commonly in an object to the second example of the second mode in that correction is carried out for a plurality of, three in the present example, places of a laser emission light waveform, but is different in that the correction current amounts $\Delta I$ for the places may be equal to each other. Attention is paid to the fact that an equal correction current amount is used to form functioning sections for the correction current as a common functioning section to simplify the circuit configuration.

The laser driving circuit 200B_6 of the third example of the second mode includes an emission light waveform correction unit 600B_6 having three systems of emission light waveform correction units 600. Although the three systems are involved, since the correction current amounts $\Delta I\_6$ are equal to each other, a correction information storage portion 610_6 and a correction switch 672_6 may be provided only for one system for the correction amount data $\Delta D\_6$ corresponding to the correction current amount $\Delta I\_6$. In order to use the single correction switch 672_6 to control the three systems, a correction timing generation portion 630B_6 includes a three-input type OR gate 638. Correction timing pulses Tdelta_1, Tdelta_2 and Tdelta_3 for the systems are supplied to the OR gate 638, and an output of the OR gate 638 is supplied to a control input terminal of the correction switch 672_6. Consequently, the correction switch 672_6 is controlled with a result Tdelta_6 of logical ORing of the correction timing pulses Tdelta_1, Tdelta_2 and Tdelta_3 for the systems. Although the degree of freedom is lower than that in an alternative case wherein all components are provided for the individual systems, where the correction current amounts may be equal to each other, only a correction timing may be provided so as to cope with the plural systems. Consequently, the circuit scale can be reduced significantly.

Comparison Between the First and Second Modes

The first mode which has correction levels is disadvantageous in that a masking part 654 is required and it is necessary to mask timing signals for the main lines. On the other hand, the second mode which has correction amounts is disadvantageous in that the addition and subtraction part 674 is required although the masking part need not be provided. The timing system handles a signal having such a very fine resolution as, for example, Tw/32 of a channel clock, for example, in twelve-speed driving of a next generation DVD for which a blue laser of a wavelength of approximately 405 nm is used, approximately 40 psec. Timing design not only for the masking part but also for the addition and subtraction part is influenced. Accordingly, it is estimated that which one of the configurations of the first and second modes is desirable depends upon the design.

<Waveform Correction: Third Mode)

Figure 13A:
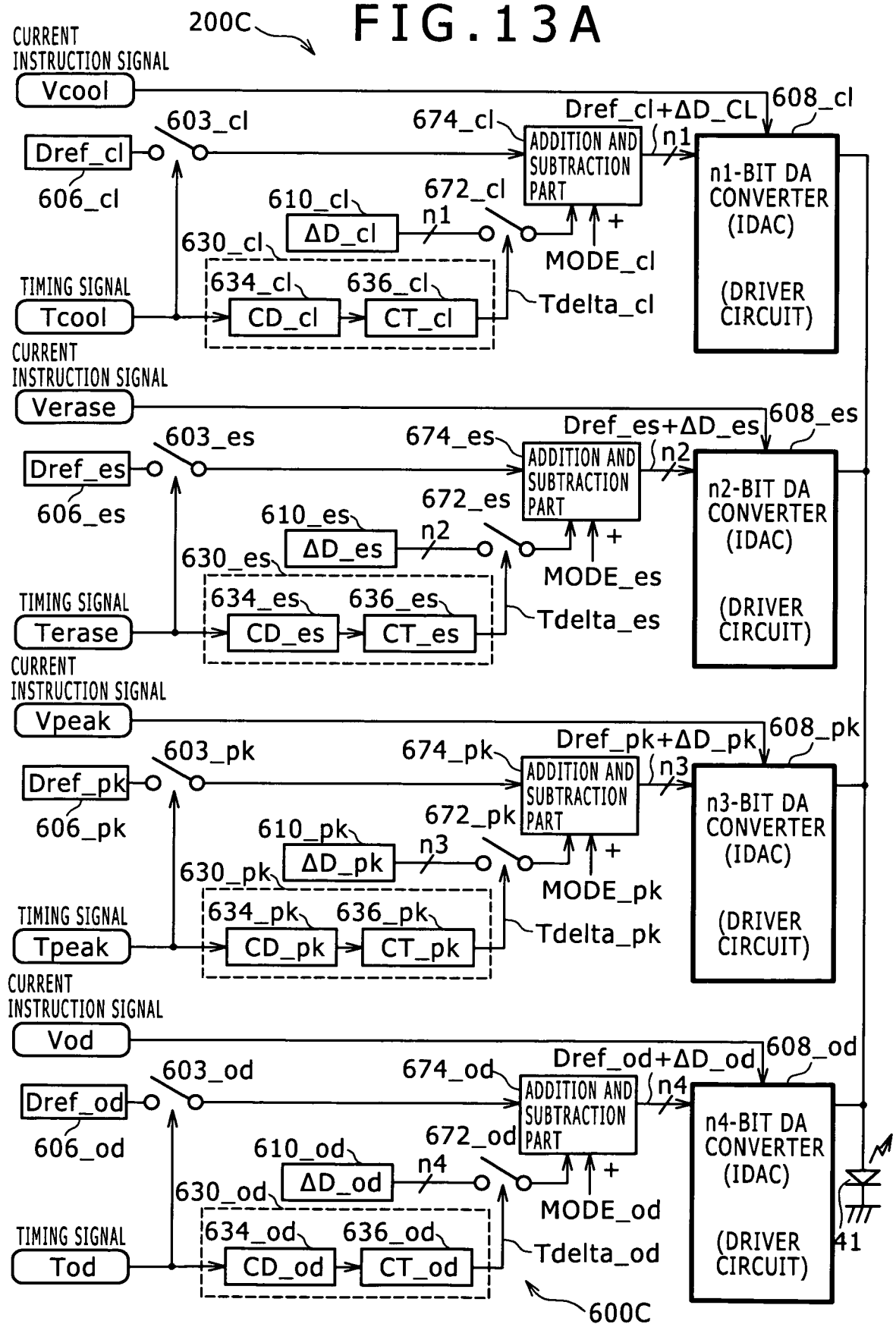
FIG. 13A is a block diagram showing a configuration of a third mode of emission light waveform correction.
Figure 13B:
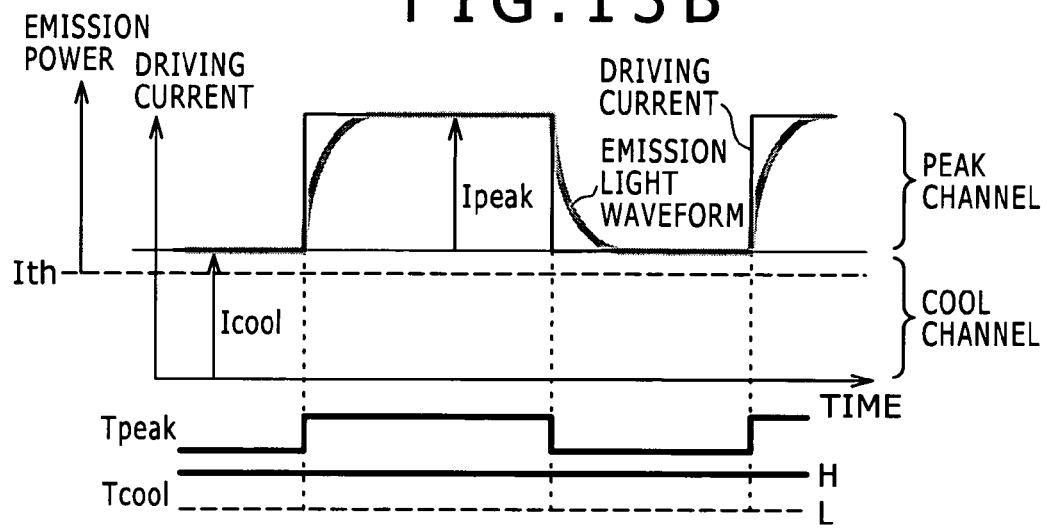
FIGS. 13B and 13C are waveform diagrams illustrating operation of the configuration shown in FIG. 13A.
Figure 13C:
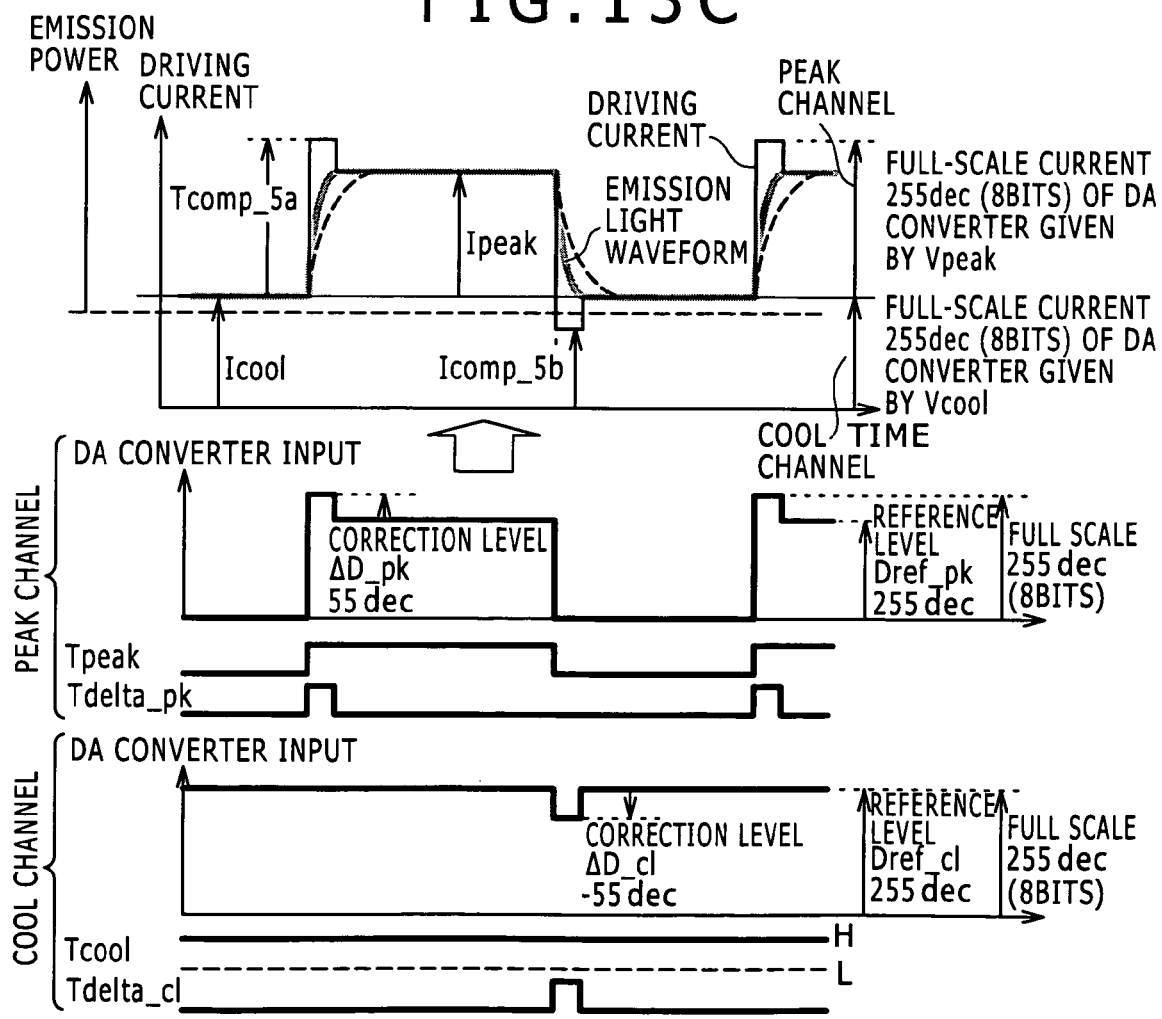

FIGS. 13A to 13C illustrate an emission light waveform correction unit of the third mode. In particular, FIG. 13A shows a configuration of the third mode of waveform correction, and FIGS. 13B and 13C illustrate operation in the waveform correction.

The third mode is an example of an application to a circuit configuration of the conventional system. The third mode adopts a configuration wherein a correction amount is set separately from a normal driving level or normal level of each channel outputted from the circuit configuration of the conventional system and is injected into, that is, added to or subtracted from, the normal level in a timed relationship with a timing at which correction is required as in the case of the second mode.

Referring first to FIG. 13A, for the application to the conventional system, the laser driving circuit 200C of the third mode includes an emission light waveform correction unit 600C. The emission light waveform correction unit 600C includes a DA converter 608 in place of the outputting transistor 605 for each channel so that a waveform correction function is added to each channel. Full scale current of the DA converters 608 is provided using current instruction signals Vcool, Verase, Vpeak and Vod. Reference level information Dref is stored in the reference level information storage portion 606. Laser driving current outputted actually from each channel is not the full scale current itself but has a value determined from the full scale current and the reference level information Dref.

On/off switching of the channels is controlled by timing signals Tcool, Terase, Tod and Tpeak as in the case of FIG. 2C. The on/off switching for each channel is implemented by switching inputting of the reference level information Dref to the corresponding DA converter 608 between on and off.

In order to carry out emission light waveform correction, the emission light waveform correction unit 600C includes, for each of the channels similarly as in the second mode, a correction information storage portion 610 which retains correction current amounts $\Delta I$, a correction timing generation portion 630 and an injection changeover portion 670. Since the components mentioned of the emission light waveform correction unit 600C are provided for each channel, the correction timing generation portion 630 does not require the reference timing selection part 632. It is to be noted that, in FIG. 13A, the cool, erase, peak and overdrive are denoted by "cl," "es," "pk" and "od," respectively.

Each addition and subtraction part 674 operates in the addition mode, and subtraction is carried out by setting the correction data $\Delta D$ to be set to the correction information storage portion 610 to a negative value. This relationship may be reversed or a unified sign of positive or negative may be used for the correction amount data $\Delta D$ while mode setting is used for addition and subtraction.

Operation of the emission light waveform correction unit 600C is described with reference to FIGS. 13B and 13C. In the conventional system, if, for example, as seen in FIG. 13B, the cool channel is always kept on while the peak channel is switched on/off in accordance with the timing signal Tpeak, then modulation with two values of the peak and the cool can be carried out. As seen in FIGS. 13B and 13C, the laser emission light waveform is delayed in the response speed at a rising edge and a falling edge thereof. In other words, waveform deformation appears at a rising edge and a falling edge of the laser emission light waveform.

FIG. 13C illustrates driving current where such correction as to moderate the waveform deformation at a rising edge and a falling edge of the driving current to raise the response speed at the rising edge and the falling edge is carried out by the emission light waveform correction unit 600C. As an example, the DA converters 608 for the peak channel and the cool channel are formed from an 8-bit DA converter.

Addition of correction current at a rising edge is carried out using the peak channel. In the peak channel, the reference peak level Dref_pk is 200 dec and the correction amount data ΔD_pk is 55 dec. When only the timing signal Tpeak has the active H level, driving current "Ipeak=(full scale current given by Vpeak)×(Dref_pk/255 dec)" flows to the peak channel.

Here, since the correction current is added at a rising edge, the correction timing pulse Tdelta_pk is formed as a pulse which starts in synchronism with a rising edge of the timing signal Tpeak and has an appropriate width similarly as in the fifth example of the first mode. In short, the timing signal Tpeak is determined as a reference and no delay is set while the pulse width is set to an appropriate value in response to the shape and the period of delay at a rising edge.

After a Tpeak period is entered, immediately after a rising edge of the driving current, the reference peak level Dref_pk is inputted from a reference level information storage portion 606_pk to an addition and subtraction part 674_pk. In other words, the reference peak level Dref_pk is rendered effective as level information with the timing signal Tpeak. At this time, also a correction timing pulse Tdelta_pk changes to the active H level simultaneously or immediately, and a correction switch 672_pk is switched on. Consequently, a correction amount data ΔD_pk corresponding to a correction current amount ΔI_pk set in a correction information storage portion 610_pk is inputted to the addition and subtraction part 674_pk. As a result, the addition and subtraction part 674_pk adds the correction amount data ΔD_pk to the current level data Dref_pk for the peak power level and inputs a resulting value to a DA converter 608_pk. Therefore, the laser driving current outputted from the DA converter 608_pk is given by "Ipeak+ΔI_pk." Here, since the correction amount data ΔD_pk is set to 55 dec, "Ipeak+ΔI_3" exhibits a value higher by 55 dec than Dref_pk=200 dec.

Consequently, the driving current after a rising edge when a Tpeak period is entered from a Tcool period can be raised to the correction level Icomp_5a which is higher than the reference level Ipeak for the peak power level. As a result, at a rising edge of the driving current after a Tpeak period is entered from a Tcool period, driving current to which correction current like an overshoot is added can be generated, and a rising edge response delay of the laser emission light waveform can be compensated for.

The addition of correction current at a falling edge is carried out in the cool channel. In the cool channel, the reference cool level Dref_cl is 255 dec and the correction amount data ΔD_cl is −55 dec. When only the timing signal Tcool indicates the active H level, driving current "Icool=(full scale current given by Vcool)×(Dref_cl/255 dec)" flows to the cool channel. Since the reference cool level Dref_cl has an equal value to that of the full scale, which is 255 dec, the full scale current itself provided by the current instruction signal Vcool flows.

Here, since the correction current is added at a falling edge of the driving current, the correction timing pulse Tdelta_cl is formed as a pulse which starts in synchronism with a falling edge of the timing signal Tcool and has an appropriate width similarly as in the fifth example of the first mode. In short, the timing signal Tcool is determined as a reference and no delay is set while the pulse width is set to an appropriate value in response to the shape and the period of delay at a rising edge.

After a Tcool period is entered, the reference cool level Dref_cl is inputted from the reference level information storage portion 606_cl to the addition and subtraction part 674_cl immediately after a falling edge of the driving current. In other words, the reference cool level Dref_cl is rendered effective as level information by the timing signal Tcool. At this time, since also the correction timing pulse Tdelta_cl is changed to the active H level and the correction switch 672_cl is switched on simultaneously or immediately, correction amount data ΔD_cl corresponding to the correction current amount ΔI_cl set in the correction information storage portion 610_cl is inputted to the addition and subtraction part 674_cl. As a result, the addition and subtraction part 674_cl adds the correction amount data ΔD_cl to the current level data Dref_cl for the cool power level and inputs a resulting value to the DA converter 608_cl. Therefore, the laser driving current outputted from the DA converter 608_cl is given by "Icool+ΔI_cl." Here, since the correction amount data ΔD_cl is set to −55 dec, "Icool+ΔI_cl" exhibits a value smaller by 55 dec than Dref_cl=255 dec.

Consequently, the driving current after a falling edge when a Tcool period is entered from a Tpeak period can be reduced to the correction level Icomp_5b which is lower than the reference level Icool for the cool power level. As a result, at a falling edge of the driving current after a Tcool period is entered from a Tpeak period, a driving waveform to which correction current like an undershoot is added can be generated. Consequently, a response delay at a falling edge of the laser emission light waveform can be corrected.

Although correction against a response delay at a rising edge and a falling edge of the driving current is described above, the waveform abnormality of a correction object is not limited to them. Though not shown, an overshoot of the laser emission light waveform which appears when a Tpeak period is entered from a Tcool period may be suppressed to a low level as in the first example of the first mode. In this instance, for the peak channel, the correction amount data ΔD_1 corresponding to the correction level Icomp_1 shown in FIG. 6B should be determined as a negative value and set to the correction information storage portion 610_pk of the peak channel. While the corresponding correction timing pulse Tdelta_pk remains the active H level, the correction switch 672_pk is on and the correction current amount ΔI_1 defined by the correction amount data ΔD_1 is subtracted from the reference level Ipeak, and an overshoot can be moderated thereby.

Further, though not shown, an overshoot of the laser emission light waveform which appears after the driving current becomes lower than the threshold current of the laser due to an undershoot immediately after a falling edge when a Tcool period is entered from a Tpeak period may be suppressed to a low level as in the case of the second example of the first mode. In this instance, the correction amount data ΔD_2 corresponding to the correction level Icomp_2 shown in FIG. 6C should be determined as a negative value and set to the correction information storage portion 610_cl of the cool channel. While the corresponding correction timing pulse Tdelta_cl remains the active H level, the correction switch 672_cl is on and the correction current amount ΔI_2 defined by the correction amount data ΔD_2 is subtracted from the reference level Icool. Consequently, the overshoot can be moderated.

System Configuration of the Signal Interface

Second Embodiment

FIGS. 14A to 14D illustrate a signal interface system of the second embodiment. In particular, FIG. 14A shows a system configuration for implementing the signal interface system of the second embodiment, and FIGS. 14B to 14D illustrate a basic principle of the laser driving system of the second embodiment.

In the system configuration of the first example of the first embodiment described hereinabove, the recording pulse signal sent from the write strategy circuit 290X has timing information finer than that of the channel clock. However, the following subjects arising from enhancement of the recording speed in recent years have become a problem. First, the number of transmission lines increases as a result of increase of the power level. Second, a frequency characteristic or transmission band originating from the flexible board 51 makes it difficult to transmit a recording pulse signal accurately. In short, the distance between recording pulse signals cannot be transmitted accurately, which makes an obstacle to enhancement of the recording speed.

Meanwhile, in the system configuration of the second example of the first embodiment, a recording clock and recording data are transmitted as signals through the flexible board 51, and they are signals in a unit of a channel clock. Therefore, they are less liable to be influenced by the transmission characteristic of the flexible board 51, and the problem of the first example is eliminated. However, since the write strategy circuit 290Y includes a phase synchronizing circuit, a memory, an address encoder and a timing generation circuit, the system configuration has problems in that the laser driving circuit 200Y has an increased scale, that the power consumption increases and that a problem of heat generation is invited.

Therefore, the system configuration of the second embodiment adopts a mechanism which can eliminate the problems of the number of transmission lines and the transmission band without increasing the circuit scale of the laser driving circuit so much as in the second example of the first embodiment. According to a basic concept of the technique, power level information, which is a recording waveform controlling signal pattern, of laser light emission at individual timings where the write strategy technique is applied is first stored on the optical pickup 14 side, for example, into a laser driving circuit 200. Further, a reset signal RS which is a first transmission signal and includes information which defines an acquisition timing of a reference pulse indicative of a changeover timing between repetitions of a space and a mark and an edge signal ES which is a second transmission signal and includes information which defines an acquisition timing of a changeover pulse indicative of a changeover timing between divided driving signals, that is, between laser emission light levels are used. The reset signal RS and the edge signal ES are handled as the write strategy signals in FIGS. 1A and 1B. The number of types of signal lines for transmission is reduced on the basis of the fact that a signal interface system similar to the system configuration of the first example of the first embodiment wherein a write strategy circuit 290 is disposed on the drive substrate side is adopted in the recording system.

A reference pulse and a changeover pulse are generated from two different pulse signals from the drive board, and the reference pulse is used to establish an initial level of a recording waveform controlling signal pattern. Thereafter, changeover to a light emission power level to which the write strategy technique is applied is carried out in accordance with the recording waveform controlling signal pattern for every changeover pulse. Then, every time a reference pulse is generated, processing similar to that described above is carried out again. Such a system as just described is hereinafter referred to as sequential system. Although the sequential system is common to an existing ordinary system in that the write strategy circuit 290 is incorporated on the drive substrate side, the number of signal transmission lines through the flexible board 51 can be reduced.

As seen in FIG. 14A, the drive substrate includes a transmission signal generation portion 500 for a sequential operation provided at a stage following the write strategy circuit 290. The transmission signal generation portion 500 generates a first transmission signal and a second transmission signal based on write strategy signals of, for example, four to five channels from the write strategy circuit 290. The transmission signal generation portion 500 supplies the first and second transmission signals to the laser driving circuit 200 through the flexible board 51.

The laser driving circuit 200 on the optical pickup 14 side includes a pulse generation portion 202 which matches with the transmission signal generation portion 500 of the digital signal processing block 57, an emission light waveform generation unit 203, and a power monitor circuit 300. The pulse generation portion 202 generates a reference pulse and a changeover pulse based on the first and second transmission signals. The emission light waveform generation unit 203 uses the reference pulse and the changeover pulse to generate a current signal in accordance with a recording waveform controlling signal pattern.

As seen in FIG. 14C, in the sequential system, two different input signals of the reset signal RS and the edge signal ES are used to generate a reset pulse RP as a reference pulse and an edge pulse EP as a changeover pulse. The reset signal RS is indicative of an edge same as a starting edge, which is a edge pulse EP1 of FIG. 14B, of a recording waveform controlling signal pattern in the laser driving circuit configured to have a built-in write strategy circuit. The edge signal ES is indicative of an edge of the other edge timings, that is, edge pulses EP2, EP3, EP4 and EP5 in FIG. 14B.

As seen in FIG. 14D, information of emission light power levels indicative of a recording waveform controlling signal pattern is stored in order in registers of a memory circuit. The information of the emission light power levels is read out based on the reset pulse RP. Information of the emission light power levels following the information of the reference power level is read out in order based on the edge pulse EP.

In particular, the laser driving circuit 200 includes a sequential access memory with a reset function which operates at a high speed, and the information of the power levels is retained in an order in which it is to be read out. Then, every time a changeover pulse, that is, the edge pulse EP, is generated, information of an emission light power level is selected and read out in order beginning with the information of the emission light power level next to the information of the reference power level. By the reset function of the reference pulse, that is, of the reset pulse RP, information of the top area, that is, information of the reference power level, is read out at a timing at which the reference pulse is generated regardless of the emission light power level being selected.

As seen in FIGS. 14B to 14D, the edge pulse EP1 from among the edge pulses EP1 to EP5 which define a recording waveform controlling signal pattern generated by the write strategy circuit 290 corresponds to the edge pulse EP. Thus, the transmission signal generation portion 500 generates a reset signal RS based on the edge pulse EP1. Further, since the edge pulses EP2 to EP5 correspond to the edge pulse EP, the transmission signal generation portion 500 generates an edge signal ES based on the edge pulses EP2 to EP5.

In the following, in order to facilitate understandings of the system configuration of the second embodiment, a basic mechanism of the sequential system is described first, and then a mechanism for correction of a laser emission light waveform of the present embodiment having the system configuration is described.

Basis of the Sequential System

Figure 15A:
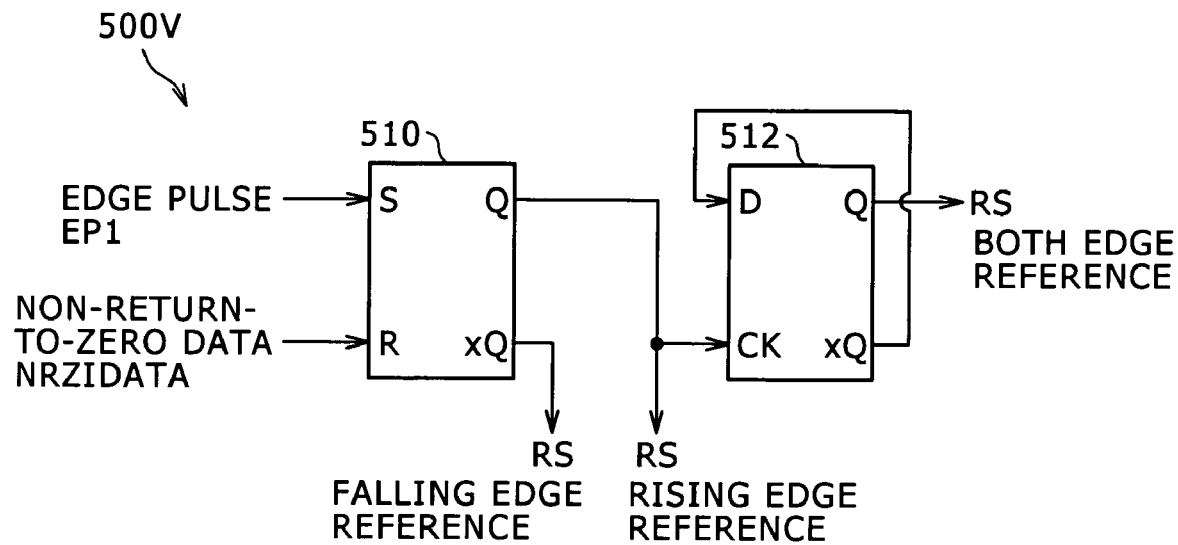
FIGS. 15A and 15B are circuit diagrams showing a transmission signal generation portion of the sequential system.
Figure 15B:
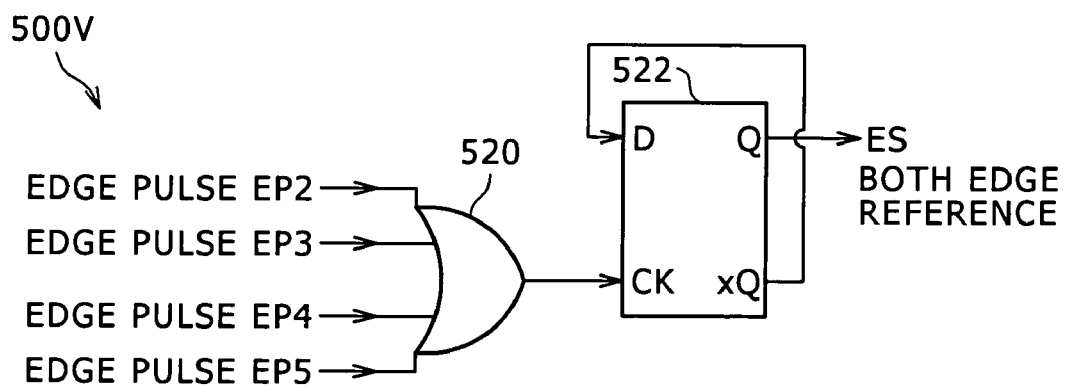
Figure 16B:
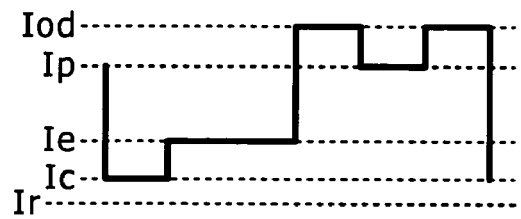
FIG. 16B is a waveform diagram and a circuit diagram illustrating memory storage information of the sequential system and current switches.
Figure 16B:
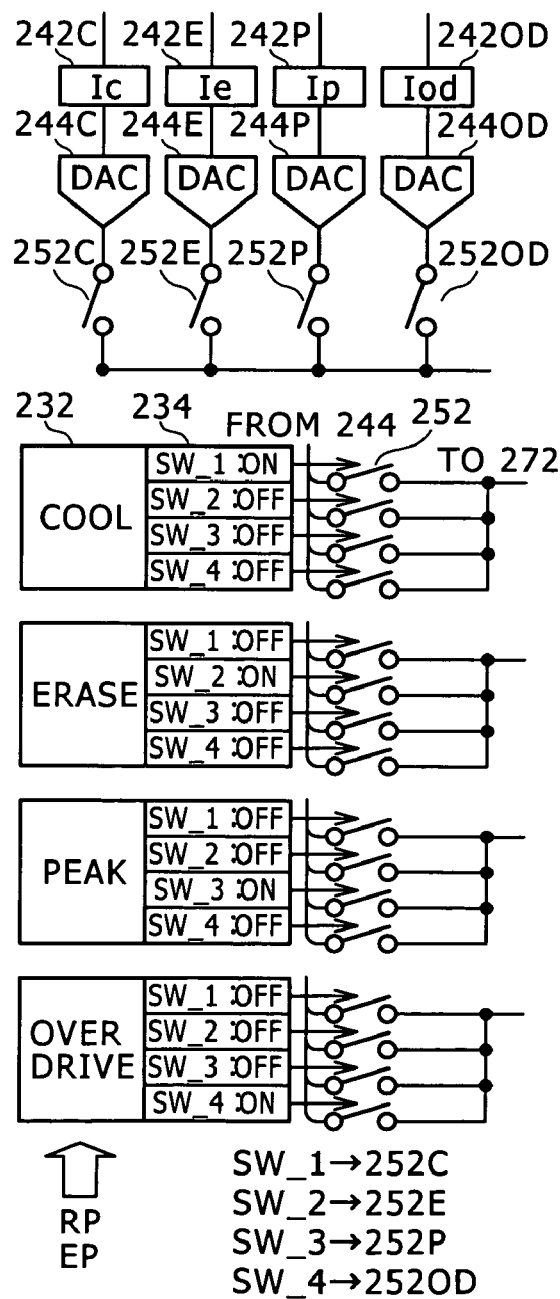
Figure 16E:
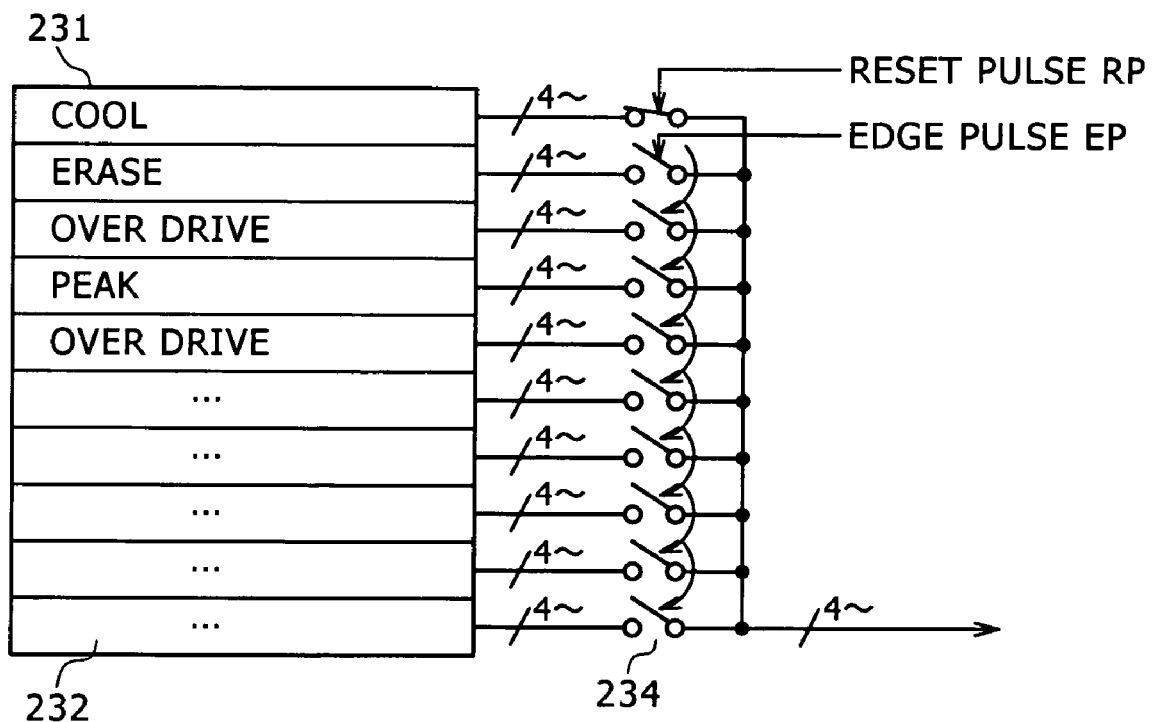
FIG. 16E is a circuit diagram illustrating power level setting information of the sequential system.

FIGS. 15A to 16E illustrate a basic mechanism of a laser driving system to which the sequential system is applied. In particular, FIGS. 15A and 15B show an example of a basic configuration of a transmission signal generation portion 500V provided in the digital signal processing block 57 on the drive substrate side which implements the sequential system. FIG. 15C illustrates operation of the transmission signal generation portion 500V of the basic configuration. FIG. 16A shows an example of a basic configuration of a laser driving circuit 200V which particularly corresponds to the driving current controlling block 47 shown in FIG. 1B. FIG. 16B illustrates a relationship between storage information of a memory circuit, which is an emission light level pattern storage portion, used in the laser driving circuit of the basic configuration and current switches. FIGS. 16C and 16D illustrate operation of the laser driving circuit 200V of the basic configuration. FIG. 16E illustrates register setting information of a memory circuit corresponding to recording waveform controlling signal patterns shown in FIGS. 16C and 16D.

In the basic configuration, one first transmission signal and one second transmission signal are supplied to the laser driving circuit 200V to drive the semiconductor laser 41 using the write strategy technique in a recording mode. For the first transmission signal, the reset signal RS is used wherein an acquisition timing of a reference pulse indicative of a changeover timing between repetitions of a space and a mark is indicated by an edge. For the second transmission signal, the edge signal ES is used wherein an acquisition timing of a changeover pulse indicative of a changeover timing between laser emission light levels is indicated by an edge.

Circuit Configuration: Transmission Signal Generation Portion

Referring to FIGS. 15A and 15B, the transmission signal generation portion 500V on the drive substrate side includes an RS-type flip-flop 510 and a D-type flip-flop 512 in order to generate the reset signal RS. Non-return-to-zero data NRZI-DATA is inputted to the R input terminal of the RS-type flip-flop 510, and the edge pulse EP1 is inputted to the S input terminal of the RS-type flip-flop 510. The non-negated output terminal Q of the RS-type flip-flop 510 is connected to the clock input terminal CK of the D-type flip-flop 512. The negated output terminal xQ of the D-type flip-flop 512 is connected to the D input terminal of the D-type flip-flop 512 so that a frequency dividing circuit by two is formed. An example of operation of the transmission signal generation portion 500 is illustrated in FIG. 15C.

The non-negated output terminal Q of the RS-type flip-flop 510 is placed into the active H level in synchronism with a rising edge of the edge pulse EP1 and placed into the inactive L level in synchronism with a rising edge of the non-return-to-zero data NRZIDATA. An output pulse of the non-negated output terminal Q of the RS-type flip-flop 510 is supplied to the clock input terminal CK of the D-type flip-flop 512 and divided by two by the D-type flip-flop 512.

If an output pulse of the non-negated output terminal Q of the RS-type flip-flop 510 is used as the reset signal RS, then the reset pulse RP is defined by a rising edge of the output pulse. If an output pulse of the negated output terminal xQ of the RS-type flip-flop 510 is used as the reset signal RS, then the reset pulse RP is defined by a falling edge of the output pulse. If an output pulse of the non-negated output terminal Q or the negated output terminal xQ of the D-type flip-flop 512 is used as the reset signal RS, then the reset pulse RP is defined by the opposite rising and falling edges of the output pulse. Therefore, where a system configuration wherein the reset pulse RP is defined by one edge of the reset signal RS is adopted, the D-type flip-flop 512 is not required.

The transmission signal generation portion 500V further includes a four-input type OR gate 520 and a D-type flip-flop 522 in order to generate the edge signal ES. The edge pulses EP2 to EP5 are supplied to the input terminals of the OR gate 520. The OR gate 520 is connected at an output terminal thereof to the clock input terminal CK of the D-type flip-flop 522. The D-type flip-flop 522 is connected at the negated output terminal xQ thereof to the D input terminal thereof so as to form a frequency dividing circuit by two.

By the configuration described, the outputs of the non-negated output terminal Q and the negated output terminal xQ of the D-type flip-flop 522 exhibit a variation between the L level and the H level in order in synchronism with a rising edge of one of the edge pulses EP2 to EP5.

Therefore, if an output pulse of the non-negated output terminal Q or the negated output terminal xQ of the D-type flip-flop 522 is used as the edge signal ES, then the edge pulse EP is defined by the opposite rising and falling edges of the output pulse.

Circuit Configuration: Laser Driving Circuit

Referring to FIG. 16A, the laser driving circuit 200V of the basic configuration includes a pulse generation portion 202V which in turn includes a reset pulse generation part 210V and an edge pulse generation part 220V, an emission light level pattern storage portion 230V, a current supplying portion 240, a current switch portion 250, and a laser driving portion 270. The reset pulse generation part 210V is an example of a first pulse generation portion, and the edge pulse generation part 220V is an example of a second pulse generation portion.

The components of the laser driving circuit 200V other than the pulse generation portion 202V and the laser driving portion 270 correspond to the emission light waveform generation unit. To the laser driving circuit 200V, the reset signal RS as a first transmission signal and the edge signal ES as a second transmission signal are supplied from the transmission signal generation portion 500 provided in the digital signal processing block 57 on the drive substrate side.

The pulse generation portion 202V uses the reset signal RS and the edge signal ES to generate a reset pulse RP and an edge pulse EP. For example, the reset pulse generation part 210V generates the reset pulse RP based on the reset signal RS. The edge pulse generation part 220V generates the edge pulse EP based on the edge signal ES. In short, the generation timing of the reset pulse RP is synchronized with an edge of the reset signal RS, and the generation timing of the edge pulse EP is synchronized with an edge of the edge signal ES. Here, it is assumed that both of the reset pulse RP and the edge pulse EP are of the active H level type.

The reset pulse generation part 210V includes an edge detection circuit 212 which is an example of a first edge detection section. The edge pulse generation part 220V includes an edge detection circuit 222 which is an example of a second edge detection section. To the edge detection circuits 212 and 222, a known edge detection circuit which utilizes gate circuits such as, for example, a NAND or AND gate, a NOR or OR gate, an inverter and an EX-OR gate may be applied. If a non-negated logic gate is used as a delay element and an input pulse signal and an output of the delay element are inputted to the EX-OR gate, then the opposite edges can be detected with the active H level. If a negated type logic gate is used as a delay element and an input pulse signal and an output of the delay element are inputted to an AND gate, then a rising edge can be detected with the active H level, but if they are inputted to a NOR gate, then a falling edge can be detected with the active H level.

In the reset pulse generation part 210V, one of a rising edge and a falling edge, here, a rising edge, of the reset signal RS inputted thereto is detected by the edge detection circuit 212 to generate a reset pulse RP, which is supplied to the emission light level pattern storage portion 230V as seen in FIG. 16C. As a modification, both of a rising edge and a falling edge of a reset signal may be detected to generate a reset pulses RP (refer to FIG. 16D).

In the edge pulse generation part 220V, both of a rising edge and a falling edge of the edge signal ES are detected by the edge detection circuit 222 to generate edge pulses EP, which are supplied to the emission light level pattern storage portion 230V. Although it is necessary to generate only one reset pulse RP per one cycle of repetitions of a space and a mark, since it is necessary to generate a plurality of edge pulses EP, the edge pulses EP are generated from the opposite edges of the edge signal ES to suppress the frequency of the edge signal ES low.

The emission light level pattern storage portion 230V stores power level information, that is, recording waveform controlling signal patterns, of laser light emission at individual timings where the write strategy technique is applied. For example, the emission light level pattern storage portion 230V includes a plurality of registers 232_1 to 232_k, which are collectively referred to as register set 231, and readout switches 234_1 to 234_k provided at an output of the registers 232_1 to 232_k.

The register set 231 functions as a main storage section. The number of output lines of the registers 232_1 to 232_k and the corresponding readout switches 234_1 to 234_k is a plural number with which multi-value levels of the laser power when the write strategy technique is applied can be set. The number of the multi-value levels and the number of the output lines of the registers 232_1 to 232_k or the readout switches 234_1 to 234_k may be equal to each other or may be different from each other using a decoder. Here, the numbers are equal to each other.

In the emission light level pattern storage portion 230V, information of light emission power levels and information for defining changeover forms of the current switch portion 250 corresponding to the light emission power levels are stored in order in the registers 232_1 to 232_k beginning with an initial level of the recording waveform controlling signal patterns in accordance with a recording waveform controlling signal pattern. To a control input terminal of the readout switch 234_1 connected to the register 232_1 which retains information of the initial level, the reset pulse RP is supplied from the reset pulse generation part 210V. To a control input terminal of the readout switches 234_2, . . . , and 234_k connected to the registers 232_2, . . . , 232_k, respectively, at the second and succeeding stages, the edge pulse EP is supplied commonly from the edge pulse generation part 220V. The readout switches 234_2, . . . , and 234_k are sequential switches for selecting outputs of the registers 232_2, . . . , 232_k in order for each edge pulse EP.

The emission light level pattern storage portion 230V outputs, in the recording mode, a plurality of current changeover pulses SW for switching current switches of the current switch portion 250 on/off based on the reset pulse RP, edge pulse EP and power level information stored in the registers 232. In particular, the emission light level pattern storage portion 230V reads out power level information retained in the registers 232_2, . . . , 232_k, in the present example, current changeover pulses SW for controlling the current switch portion 250 in order for each edge pulse EP. Then, at the timing of the reset pulse RP, the reading out turn is returned to the register 232_1 in which the initial level or reference level information is stored.

The current supplying portion 240 includes reference current generation parts 242 which are reference current setting registers, and DA conversion parts 244 (IDAC) of the current outputting type. Each reference current generation part 242 generates digital reference current values individually corresponding to the multi-values in the recording mode and the power levels for reading in the reproduction or reading mode in the emission light pulse waveform of the semiconductor laser 41 based on the information of the emission light level pattern storage portion 230V. For example, current information corresponding to the individual emission light power levels is set in multi-bit digital data in the emission light level pattern storage portion 230V, and the reference current generation parts 242 corresponding to emission light power levels fetches the current information.

Each DA conversion part 244 converts current information in the form of digital data generated by the reference current generation part 242 into analog information and outputs the analog current information. To the DA conversion parts 244, laser power instruction voltages PW are supplied from the APC controlling block 58 through the flexible board 51. Each DA conversion part 244 adjusts the gain for DA conversion based on the laser power instruction voltages PW. The emission light power of the semiconductor laser 41 is feedback controlled to a fixed value in accordance with the laser power instruction voltage PW.

The current switch portion 250 includes current switches 252 for selecting, in the recoding mode, one or an arbitrary combination of power reference currents converted into analog signals by the DA conversion part 244. The current switch portion 250 switches the current switches 252 on/off based on a plurality of pieces of level information, particularly based on the current changeover pulses SW, read out from the emission light level pattern storage portion 230V to control the light emission power.

As the multi-value levels in the recording mode, the four values of cool, erase, peak and overdrive are adopted as seen in FIGS. 16B and 16C. Corresponding to this, the reference current generation part 242 includes reference current generation parts 242C, 242E, 242P and 2420D for individually generating reference current of the four levels. The reference current generation part 242 further includes a reference current generation part 242R for reading. The DA conversion part 244 includes DA conversion parts 244C, 244E, 244P, 2440D and 244R for converting the reference currents generated by the reference current generation part 242 into analog signals. Also the current switches 252 include power supply switches 252C, 252E, 252P, 2520D and 252R separately.

As the reference currents to be generated by the reference current generation part 242, for example, reference currents Ic, Ie, Ip and Iod are generated individually corresponding to the four values of the cool, erase, peak and overdrive as seen in FIG. 16B. Corresponding to this, also output pattern information of the current changeover pulses SW for controlling the current switches 252 is stored in the emission light level pattern storage portion 230V. In the recording mode, in order to control the four-value levels, four different current changeover pulses SW_1 to SW_4 are outputted from the registers 232 of the emission light level pattern storage portion 230V. The reference currents Ic, Ie, Ip and Iod are supplied separately for the cool, erase, peak and overdrive to the corresponding power supply switches 252C, 252E, 252P and 2520D. Therefore, one of the four different current changeover pulses SW_1 to SW_4 should be rendered active to switch on one of the current switches 252.

The laser driving portion 270 includes a laser changeover circuit 272 and driver circuits 274. The laser changeover circuit 272 includes, as an example, a 3-input 1-output type switch for changing over among three systems of a first semiconductor laser 41_1 for a CD system, a second semiconductor laser 41_2 for a DVD system and a third semiconductor laser 41_3 for a next generation DVD system. The driver circuits 274 include a first driver circuit 274_1 for driving the first semiconductor laser 41_1, a second driver circuit 274_2 for driving the second semiconductor laser 41_2 and a third driver circuit 274_3 for driving the third semiconductor laser 41_3. The laser driving portion 270 is ready for semiconductor lasers 41_1, 41_2 and 41_3 for the three different recording media of a CD, a DVD and a next generation DVD and changes over the semiconductor lasers 41 depending upon a recording medium.

By such a configuration as described above, the laser driving circuit 200V generates an emission light waveform of multi-value power to which the write strategy technique is applied by combination of bias current for supplying threshold current to the semiconductor laser 41 and a plurality of current pulses. In a laser power controlling system not shown, that is, in an APC controlling system, the multi-value power is controlled so that the laser power of the semiconductor lasers 41 exhibits an emission light waveform of the multi-value power.

Operation: Basic Configuration

It is assumed that non-return-to-zero data NRZIDATA is inputted as data for writing as seen in FIGS. 16C and 16D. The space length is 2 T and the mark length is equal to or greater than 2 T, in FIGS. 16C and 16D, 2 T, 3 T, 4 T and 5 T. The highest speed signal is repetitions of 2 T.

When the write strategy technique is applied, where the space length is 2 T, the driving current is set to the cool level within the front half of 1 T and set to the erase level within the latter half of 1 T. Where the mark length is 2 T, the driving current is set to the erase level within the front half of 1 T and set to the overdrive level within the latter half of 1 T. Where the mark length is 3 T, the driving current is set to the erase level within the first period of 1 T, set to the overdrive level within the second period of 1 T, and set to the peak level within the third period of 1 T.

Where the mark length is 4 T, the driving current is set to the erase level within the first period of 1 T, set to the overdrive level within the second period of 1 T, set to the peak level within the third period of 1 T, and set to the overdrive level within the fourth period of 1 T. Where the mark length is 5 T, the driving current is set to the erase level within the first period of 1 T, set to the overdrive level within the second period of 1 T, set to the peak level within the third period of 1 T, set to the peak level within the fourth period of 1 T, and set to the overdrive level within the fifth period of 1 T. In short, where the mark length is 5 T, within the third to fourth periods of totaling 2 T, the peak level is maintained, and within the succeeding fifth period of 1 T, the overdrive level is set.

Further, irrespective of the mark length, within the period of 2 T from the rear half of a space to the first mark, the erase level is maintained, and within the succeeding period of 1 T, the overdrive level is set. The emission light power levels have a relationship of O.D.>Peak>Erase>Cool.

Corresponding to such a recording waveform controlling signal pattern as described above, information of the cool level is stored as an initial level into the register 232_1 at the first stage as seen in FIG. 16E. Information of the erase level is stored into the register 232_2 at the second stage; information of the overdrive is stored into the register 232_3 at the third stage; information of the peak level is stored into the register 232_4 at the fourth stage; and information of the overdrive is stored into the register 232_5 at the fifth stage.

One reset signal RS and one edge signal ES are used as input pulse signals. A reset pulse RP is generated based on a rising edge or a rising edge and a falling edge of the one reset signal RS. An edge pulse EP is generated based on the opposite edges of the one edge signal ES. Then, the power level information stored in the registers 232_1 to 232_5 of the emission light level pattern storage portion 230V is successively read out beginning with the top area, in the present example, with the cool level information. For example, when the reset pulse RP has the active H level, the readout switch 234_1 is switched on to read out the power level information of the register 232_1 at the first stage. Thereafter, every time the edge pulse EP is placed into the active H level, the switches 234_2 to 234_5 of the sequential switch configuration are switched on in order to successively read out the power level information of the registers 232_2 to 232_5.

For example, upon recording of a mark of the mark length of 4 T or 5 T, when all power level information is read out in order, the laser light emission power is changed over in the order of cool→erase→overdrive→peak→overdrive.

All levels are not outputted depending upon the mark length of the non-return-to-zero data NRZIDATA, and, for example, upon recording of a mark of the mark length of 2 T, it is necessary to change the power from the overdrive to the cool. In this instance, by supplying the reset signal RS such that the reset pulse RP changes to the active H level at a timing immediately after the overdrive power at which the cool power is to be set, information of the cool power is read out subsequently to the overdrive power. Similarly, upon recording of a mark of the mark length of 3 T, the reset signal RS should be supplied such that the reset pulse RP changes to the active H level at a timing immediately after the peak power at which the cool power is to be set so that the power changes from the peak power to the cool power.

Now, a mechanism of correction of a laser emission light waveform according to the present mode having the system configuration of the present second embodiment of the sequential system is described. It is to be noted that, although the description is given in regard to a system wherein correction amount data is injected into, that is, added to or subtracted from, normal level data, it is otherwise possible to adopt another system wherein normal level data and correction level data are changed over therebetween.

<Waveform Correction: Fourth Mode>

Figure 17A:
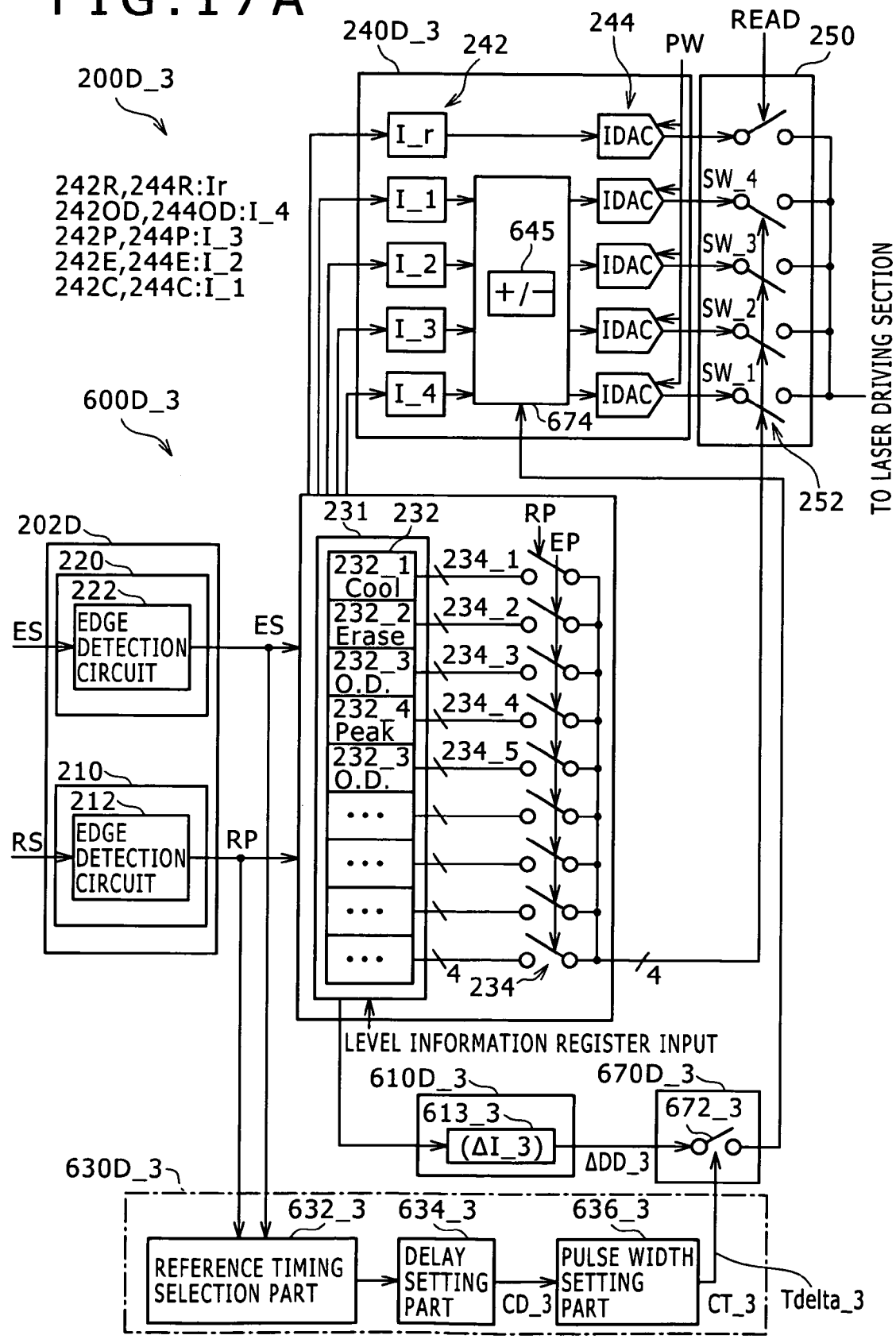
FIG. 17A is a block diagram showing a configuration of a fourth mode of emission light waveform correction.

FIG. 17A shows a fourth mode of waveform correction, and FIGS. 17B and 17C illustrate operation in the waveform correction. Referring to FIG. 17A, the laser driving circuit 200D_3 of the fourth mode includes an emission light waveform correction unit 600D_3. The emission light waveform correction unit 600D_3 includes a correction information storage portion 610D_3 which is an example of a correction amount information storage portion, a correction timing generation portion 630D_3, and an injection changeover portion 670D_3.

A current supplying portion 240D_3 includes a addition and subtraction part 674 which in turn includes an adder-subtractor 675 interposed between the reference current generation part 242 and the DA conversion part 244 of the recording system. The adder-subtractor 675 is provided on a route of a current channel of a correction object. For example, if the reference level Icool is to be corrected, then the adder-subtractor 675 is provided between a reference current generation part 242C and a DA conversion part 244C while the other reference current generation parts and the DA conversion parts are individually connected directly to each other. It is to be noted that, in order to obtain operation in the addition mode in which correction for increasing the current amount is carried out, the addition mode is set to the adder-subtractor 675, but in order to obtain operation in the subtraction mode in which correction for decreasing the current amount is carried out, the subtraction mode is set to the adder-subtractor 675.

The correction information storage portion 610D_3 has a configuration similar to that of the reference current generation part 242 of the current supplying portion 240 and includes a correction current generation part 613_3. The correction current generation part 613_3 generates correction amount data ΔDD_3 corresponding to the correction current amount ΔI_3.

The correction timing generation portion 630D_3 includes a reference timing selection part 632_3, a delay setting part 634_3, and a pulse width setting part 636_3 as in the case of the correction timing generation portion 630A_3. The injection changeover portion 670D_3 includes a correction switch 672_3. The correction timing generation portion 630D_3 supplies a correction timing pulse Tdelta_3 to the correction switch 672_3.

The reference timing selection part 632_3 selects a timing pulse to be used as a reference from the edge pulse EP and the reset pulse RP generated or reproduced by a pulse generation portion 202D. The correction timing generation portion 630D_3 sets delay time CD_3 from the reference timing pulse and a pulse width CT_3 to generate a correction timing pulse Tdelta_3 to control the correction switch 672_3 between on and off.

The correction switch 672_3 receives correction amount data ΔDD_3 supplied to an input terminal thereof from the correction current generation part 613_3 and is connected at an output terminal thereof to the addition and subtraction part 674, particularly to the adder-subtractor 675 of the addition and subtraction part 674. Similarly as in the second embodiment, correction amount data is injected into, that is, added to or subtracted from, normal level data. By adding or subtracting the correction amount data ΔDD_3 to or from original data of the current amount while the correction switch 672_3 is on, a correction function of an emission light waveform can be implemented.

Operation of the emission light waveform correction unit 600D_3 is described with reference to FIGS. 17B and 17C. FIG. 17B shows a laser driving waveform and a laser emission light waveform before correction is carried out. Here, a great undershoot immediately after a falling edge of the laser emission light waveform is determined as an object of correction. FIG. 17C shows a laser driving waveform and a laser emission light wave where correction for suppressing an undershoot immediately after a falling edge when a Tcool period is entered from a Tpeak period to a low level is carried out by the emission light waveform correction unit 600D_3. Here, in order to obtain operation in the addition mode in which correction for increasing the current amount is carried out, the addition mode is set to the adder-subtractor 675.

As shown at a lower stage in FIG. 17C, an edge signal ES and a reset signal RS are inputted alternately based on the principle of the sequential system. Together with this, the cool current Icool and the peak current Ipeak repeat on/off alternately to implement modulation with two values of the cool level and the peak level.

In order to carry out correction for an undershoot immediately after a falling edge of the driving current at which a Tcool period is entered, the correction timing generation portion 630D_3 generates a correction timing pulse Tdelta_3 having an appropriate width without a delay with respect to transition of the reset signal RS.

While the correction timing pulse Tdelta_3 remains the active H level, the correction switch 672_3 is on, and data I_1 of the original current amount by the reference current generation part 242C which provides the cool current Icool is supplied to the DA conversion part 244C after the correction amount data ΔDD_3 is added thereto. As a result, the driving current increases by the correction current amount ΔI_3 from the cool current Icool, and the falling speed of the driving current is suppressed equivalently and an undershoot can be moderated.

It is to be noted that, while the configuration described here is of the system wherein correction amount data is injected into, that is, added to or subtracted from, normal level data similarly as in the second embodiment, also it is possible to alternatively adopt a configuration of another system wherein changeover between normal level data and correction level data is carried out similarly as in the first embodiment.

<Waveform Correction: Fifth Mode>

Figure 18A:
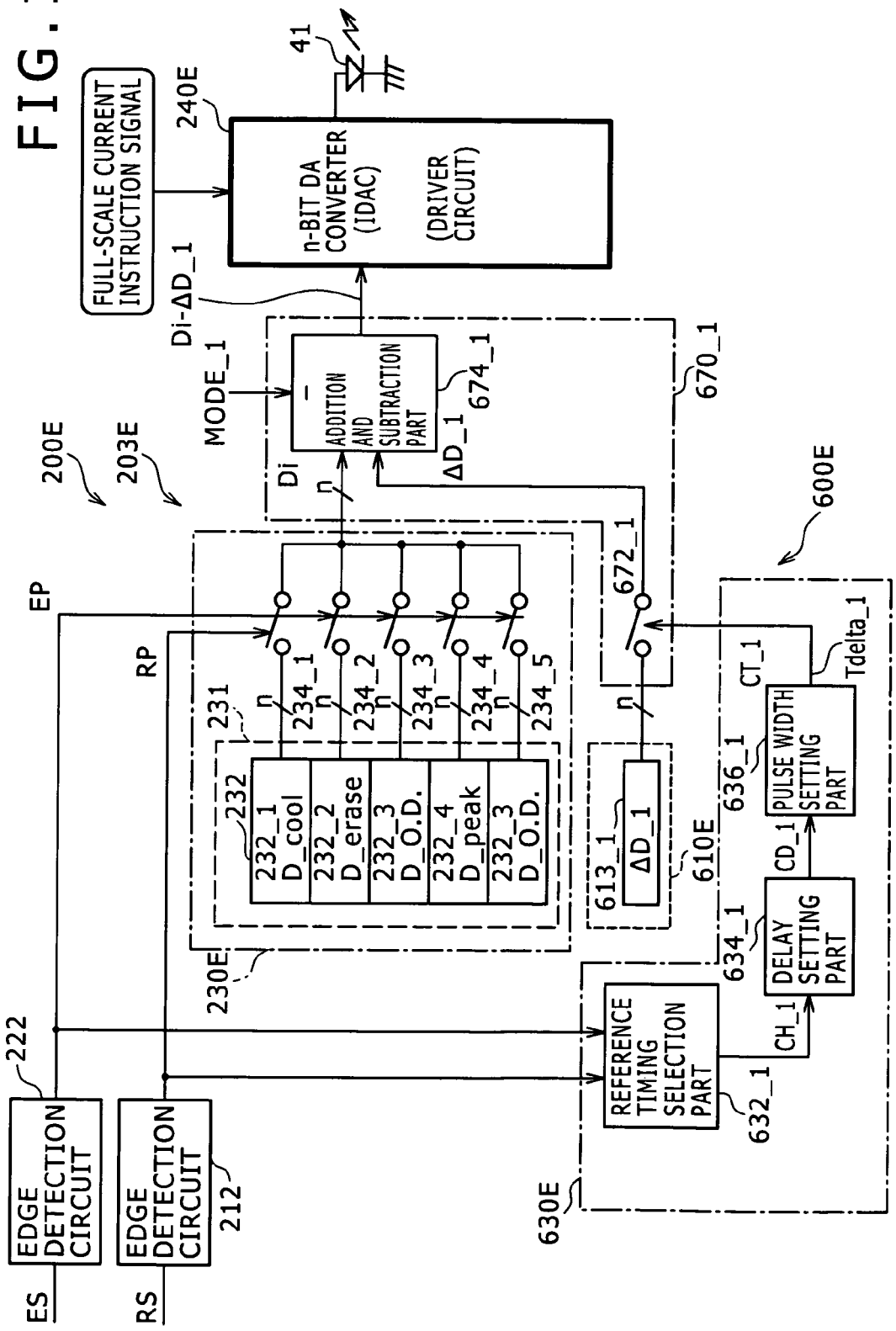
FIG. 18A is a block diagram showing a configuration of a fifth mode of emission light waveform correction.
Figure 18B:
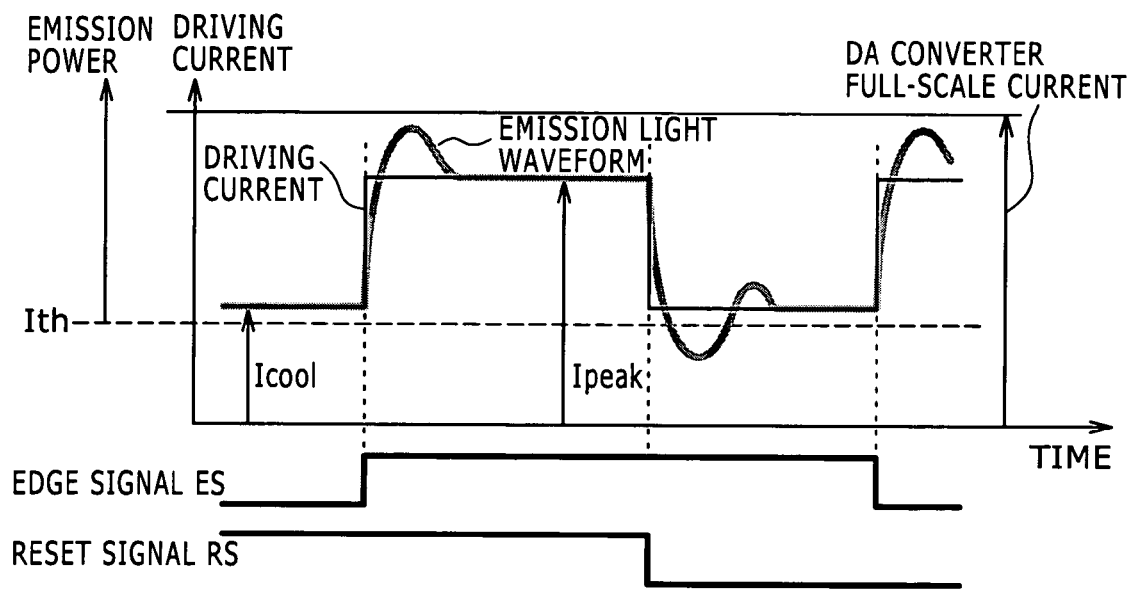
FIGS. 18B and 18C are waveform diagrams illustrating operation of the configuration of FIG. 18A.
Figure 18C:
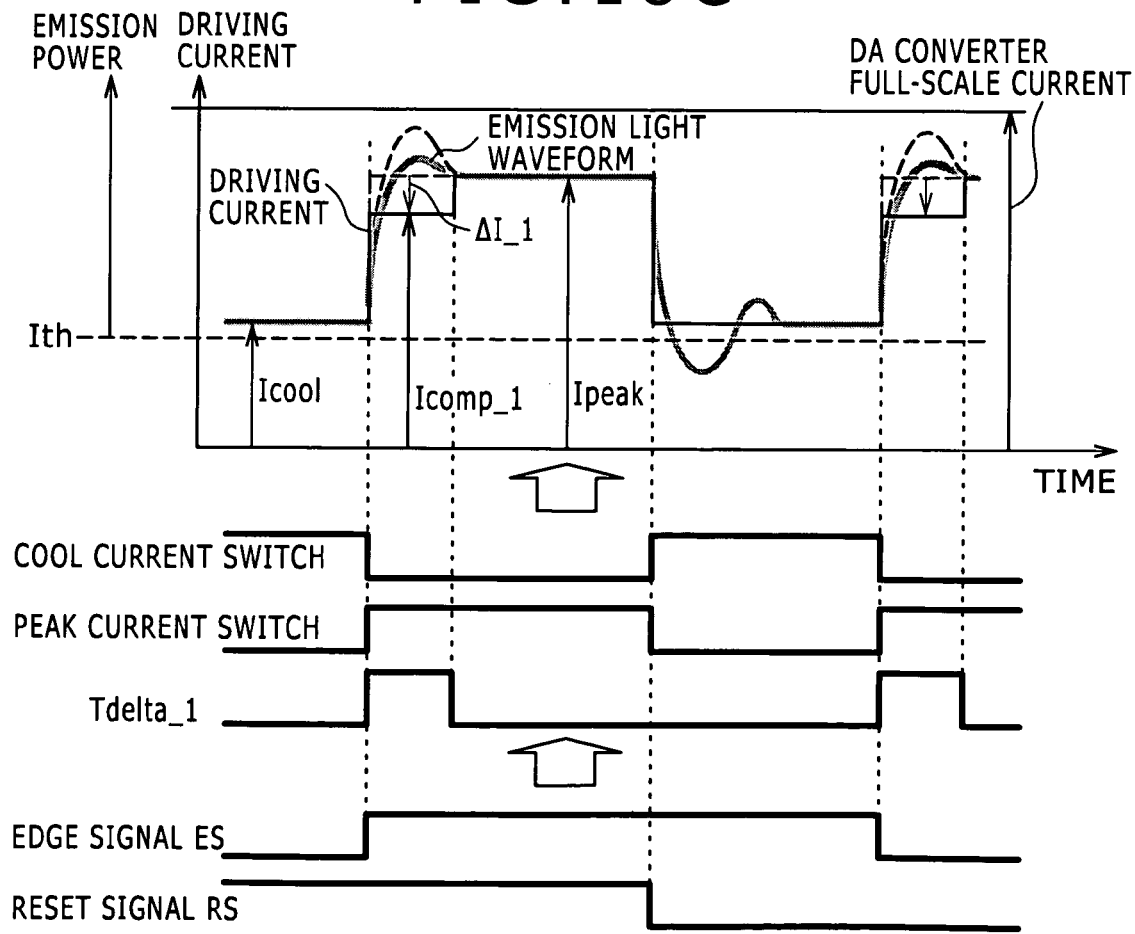

FIG. 18A shows a fifth mode of waveform correction, and FIGS. 18B and 18C illustrate operation in the waveform correction. First, a modified portion of the laser driving circuit on which the fifth mode is based is described. The laser driving circuit 200E of the fifth mode includes an emission light waveform generation unit 203E which in turn includes a emission light level pattern storage portion 230E. The emission light level pattern storage portion 230E stores light emission power information of the registers 232 as current level information itself. The light emission power information of the registers 232 is used as the current level information itself and is successively changed over and supplied to the current supplying portion 240E. Therefore, the configuration of the current supplying portion 240E is simplified in that it includes a single reference current generation part 242 and a single DA conversion part 244 and the necessity for the current switch portion 250 is eliminated.

The emission light waveform correction unit 600E of the fifth mode applied to such a configuration as just described includes a correction information storage portion 610E, a correction timing generation portion 630E, and an injection changeover portion 670. The configuration itself of the functioning sections mentioned is similar to that of the first example of the second mode.

In the emission light waveform generation unit 203E which is the base, the current level information stored in the emission light level pattern storage portion 230 is successively read out in response to a level change between the reset signal RS and the edge signal ES, and therefore, as an actual condition, operation of the emission light level pattern storage portion 230 is similar to that of the DA conversion system. Accordingly, if the emission light waveform correction unit 600E has a configuration similar to that of the examples of the second mode, then similar operation and effects are achieved.

System Configuration of the Signal Interface

Third Embodiment

Figure 19A:
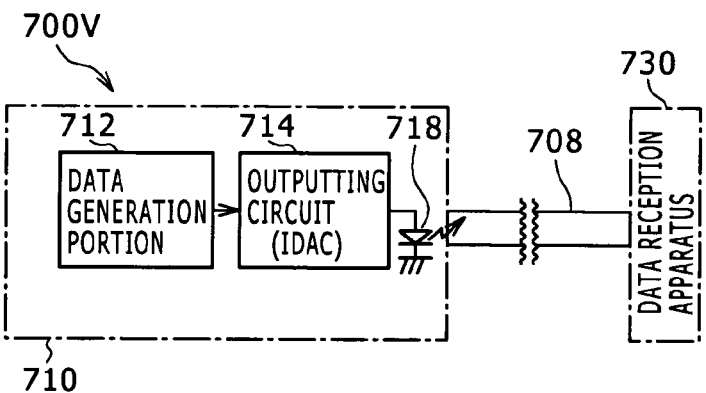
FIGS. 19A to 19C are block diagrams and a waveform diagram showing a system configuration of a third embodiment of the present invention.
Figure 19B:
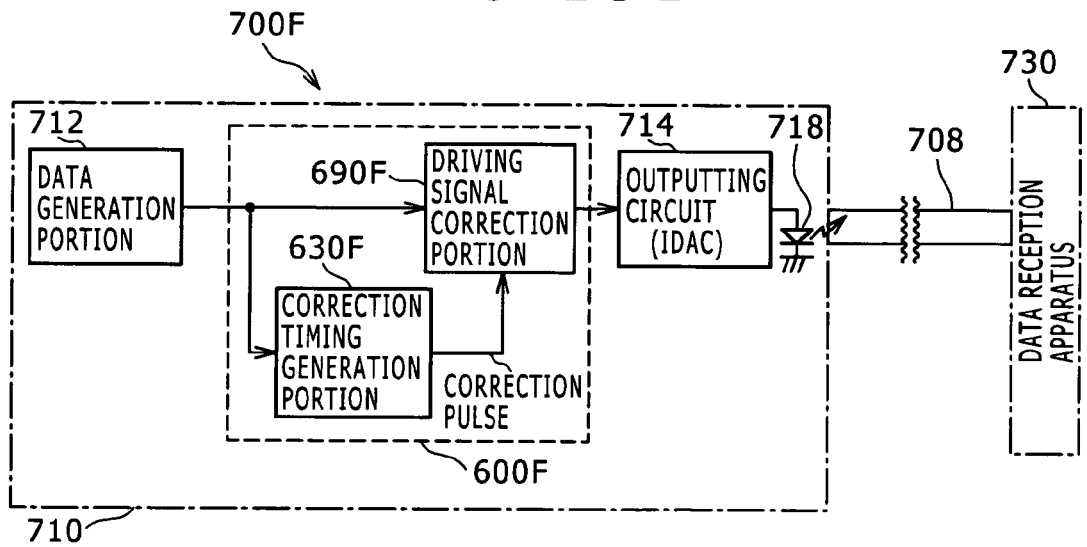
Figure 19C:
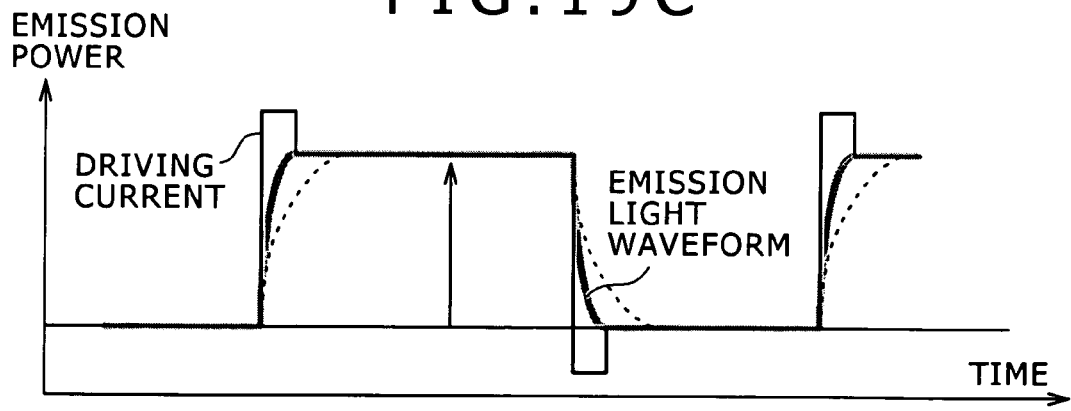

FIGS. 19A to 19C show a system configuration which implements a signal interface system of the third embodiment. In the embodiments described above, an optical apparatus is described taking a recording and reproduction apparatus or optical disk apparatus which uses an optical disk OD as a recording medium as an example. However, the optical apparatus is not limited to a recording and reproduction apparatus. The technical idea of the embodiments can be applied to various pulse current generation circuits for driving a load with pulse current of a high frequency.

In particular, the optical apparatus may be a light emitting apparatus in an optical communication apparatus which uses an optical fiber, and the mechanisms of the embodiments can be applied also to the light emitting apparatus. In short, the mechanisms of the embodiments which correct an abnormal waveform can be applied to any light emitting apparatus wherein abnormality occurs with an emission light waveform in light emission control of a laser beam. The mechanisms of the embodiments can be applied to a general field wherein modulation of a semiconductor laser is utilized such as a semiconductor laser driving circuit incorporated in an optical disk apparatus which uses optical modulation to carry out information recording on an optical disk and an optical communication apparatus which uses optical modulation to transmit information. From this point of view, in the third embodiment, the emission light waveform correction function of the first and second embodiments is applied to an optical communication system.

In an optical communication system 700V, for example, a data transmission apparatus 710 and a data reception apparatus 730 are connected to each other by an optical cable 708 as seen in FIG. 19A if communication through wire is applied. The data transmission apparatus 710 includes a data generation portion 712 for generating transmission object data, and an outputting apparatus 714 as an outputting stage for driving a laser device 718. In the configuration described, for example, where high speed serial communication is carried out, waveform abnormality such as an overshoot, an undershoot, ringing or a response delay can possibly occur with driving current for the laser device 718.

Referring to FIG. 19B, an optical communication system 700F of the third embodiment includes a emission light waveform correction unit 600F of the sixth mode which acts similarly as in the first and second embodiments as seen in FIG. 19C. The emission light waveform correction unit 600F includes a correction timing generation portion 630F and a driving signal correction portion 690F. A correction information storage portion 610F generates a correction pulse having an appropriate delay amount and an appropriate pulse width in response to waveform abnormality of a correction object and supplies the correction pulse to the driving signal correction portion 690F. The driving signal correction portion 690F may adopt any of the system of the first embodiment wherein changeover between normal level data and correction level data is carried out and the systems of the second to fifth modes wherein correction amount data is injected into normal level data.

The present application contains subject matter related to that disclosed in Japanese Priority Patent Application JP 2009-107524 filed in the Japan Patent Office on Apr. 27, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A laser driving apparatus, comprising:
    a driving unit that drives a laser device with a current value in accordance with a level of a correction signal;
    an emission light waveform correction unit that receives a pulsed reference signal generates, based on a correction timing pulse interlocked with a rising edge or a falling edge of the pulsed reference signal, the correction signal having a level different from that of the pulsed reference signal, and supplies the correction signal to drive the laser device to emit an emission light waveform having a shape corrected to become close to that of a rectangular wave, and
    a correction timing generation portion that generates, based on a timing signal that indicates each power level pattern of the emission light waveform, the correction timing pulse that defines a timing for generating the correction signal and supplies the generated correction timing pulse to said emission light waveform correction unit.

2. The laser driving apparatus according to claim 1, wherein said laser device and said driving unit are connected to each other by a transmission member.

3. The laser driving apparatus according to claim 1, further comprising:
    a level information storage portion that stores level information according to power level patterns of the emission light waveform; and
    a changeover portion that changes over and reads out the level information from said level information storage portion at a timing corresponding to a light emission pattern,
    wherein the changeover portion supplies the level information read out from said level information storage portion as the pulsed reference signal to said emission light waveform correction unit.

4. The laser driving apparatus according to claim 1, further comprising:
    a first pulse generation part that detects an edge of a first transmission signal whose edge represents information that defines a changeover timing between repetitions of a space and a mark or that defines an acquisition timing of a reference pulse indicative of a changeover timing between the space and the mark to generate the reference pulse;
    a second pulse generation part that detects an edge of a second transmission signal whose edge represents information that defines an acquisition timing of a changeover pulse indicative of a changeover timing between divided power levels of emission light waveforms of the space and the mark to generate the changeover pulse;
    an emission light waveform generation unit that outputs reference level information which is level information of a position of the reference pulse from within the power level information of the emission light waveforms for each reference pulse, and that outputs different level information following the reference level information in order for each changeover pulse; and
    a storage portion that stores setting information that defines a recording waveform controlling signal pattern that indicates the power level information of the emission light waveform for driving said laser device with the power level of the emission light waveforms of the space and the mark; and
    wherein the reference level information that is level information of the position of the reference pulse from within the power level information of the emission light waveforms of the space and the mark is read out for each reference pulse, whereafter different information following the reference level information is read out in order for each changeover pulse and then supplied as the reference signal to said emission light waveform correction unit.

5. The laser driving apparatus according to claim 1, wherein said driving unit is configured from a current outputting type digital-analog converter.

6. The laser driving apparatus according to claim 1, wherein said correction timing generation portion includes a delay setting part configured to set a delay amount from a reference edge of the timing signal and a pulse width setting part configured to set a pulse width which indicates an active period of the correction signal, and sets the delay amount and the pulse width in accordance with the shape of the emission light waveform of said laser device to generate the correction timing pulse.

7. The laser driving apparatus according to claim 1, wherein said correction timing generation portion includes a reference timing selection part configured to select one of the power level patterns of the emission light waveforms as a reference timing in accordance with the shape of the emission light waveform of said laser device, and generates the correction timing pulse based on the selected reference timing.

8. The laser driving apparatus according to claim 1, wherein said emission light waveform correction unit includes a correction level information storage portion configured to store information of a correction level and a driving level changeover portion configured to carry out changeover between the level of the reference signal and the correction level stored in the correction level information storage portion, and the changeover between the level of the reference signal and the correction level is carried out based on the correction timing pulse to generate the correction signal.

9. The laser driving apparatus according to claim 1, wherein said emission light waveform correction unit includes a correction amount information storage portion configured to store information of a correction amount and an injection changeover portion configured to inject the correction amount stored in said correction amount information storage portion into the level of the reference signal, and the correction amount is injected into the level of the reference signal based on the correction timing pulse to generate the correction signal.

10. The laser driving apparatus according to claim 9, wherein said injection changeover portion changes an injection direction of the correction amount in accordance with the shape of the emission light waveform.

11. The laser driving apparatus according to claim 1, wherein said laser driving apparatus includes a plurality of systems of such emission light waveform correction units to correct abnormality at a plurality of places of the shape of the emission light waveform of said laser device so that the shape of the emission light waveform becomes close to that of a rectangular wave.

12. The laser driving apparatus according to claim 11, wherein the plural systems of emission light waveform correction units individually include correction timing generation portions each configured to generate the correction timing pulse which defines a timing for generating the correction signal based on a timing signal which indicates the corresponding power level pattern of the emission light waveform and supply the generated correction timing pulse to said emission light waveform correction unit, and a correction level information storage portion configured to store information of the correction level and an injection changeover portion configured to inject the correction amount stored in said correction amount information storage portion into the level of the reference signal are used commonly to the individual systems of the emission light waveform correction units.

13. The laser driving apparatus according to claim 12, wherein said injection changeover portion changing an injection direction of the correction amount in accordance with the shape of the emission light waveform.

14. A laser driving method, comprising the steps of:

generating a correction signal having a level different from that of a pulsed reference signal;

supplying the correction signal to a driving unit that drives a laser device with a current value in accordance with the level of the correction signal, based on a correction timing pulse interlocked with a rising edge or a falling edge of the pulsed reference signal, to emit an emission light waveform having a shape corrected to become close to that of a rectangular wave;

generating, based on a timing signal that indicates each power level pattern of the emission light waveform, the correction timing pulse that defines a timing for generating the correction signal; and supplying the generated correction timing pulse to said emission light waveform correction unit.

15. An optical apparatus, comprising:

a laser device;

a driving block that drives said laser device with a current value in accordance with a level of a correction signal;

a first transmission member that connects said laser device and said driving block;

an emission light waveform correction unit that receives a supply of a pulsed reference signal, generates, based on a correction timing pulse interlocked with a rising edge or a falling edge of the pulsed reference signal, the correction signal having a level different from that of the pulsed reference signal, and supplies the correction signal to said driving block to emit an emission light waveform having a shape corrected to become close to that of a rectangular wave;

an optical member that guides a laser light emitted from said laser device;

an emission light pattern information outputting block that outputs information that defines an emission light waveform pattern of said laser device;

a second transmission member that is interposed between a first incorporation section in which said laser device, driving block, emission light waveform correction unit, and optical member are incorporated and a second incorporation section in which said emission light pattern information outputting block is incorporated and that transmits a signal; and a correction timing generation portion that generates, based on a timing signal that indicates each power level pattern of the emission light waveform, the correction timing pulse that defines a timing for generating the correction signal and supplies the generated correction timing pulse to said emission light waveform correction unit.

16. An optical unit, comprising:

a laser device;

a driving block that drives said laser device with a current value in accordance with a level of a correction signal;

a first transmission member that connects said laser device and said driving block to each other;

an emission light waveform correction unit that receives a supply of a pulsed reference signal, generates, based on a correction timing pulse interlocked with a rising edge or a falling edge of the pulsed reference signal, the correction signal having a level different from that of the pulsed reference signal, and supplies the correction signal to said driving block to emit an emission light waveform having a shape corrected to become close to that of a rectangular wave;
an optical member that guides laser light emitted from said laser device, and
a correction timing generation unit that generates, based on a timing signal that indicates each power level pattern of the emission light waveform, the correction timing pulse that defines a timing for generating the correction signal and that supplies the generated correction timing pulse to said emission light waveform correction unit.

17. A pulse current generation circuit, comprising:
an outputting circuit that drives a load with a current value in accordance with a level of a correction signal; and
a driving signal correction unit that receives supply of a pulsed reference signal, generates, within a fixed period interlocked with a rising edge or a falling edge of the pulsed reference signal, the correction signal having a level different from that of the pulsed reference signal, and supplies the correction signal to said outputting circuit to emit an emission light waveform having a shape corrected to become close to that of a rectangular wave; and
a correction timing generation unit that generates, based on a timing signal that indicates each power level pattern of the emission light waveform, the correction timing pulse that defines a timing for generating the correction signal and that supplies the generated correction timing pulse to said emission light waveform correction unit.

18. A laser driving apparatus, comprising:
driving means for current driving a laser device with a current value in accordance with a level of a correction signal; and
emission light waveform correction means for receiving a pulsed reference signal, generating, based on a correction timing pulse interlocked with a rising edge or a falling edge of the pulsed reference signal, the correction signal having a level different from that of the pulsed reference signal, and supplies the correction signal to said driving means to emit an emission light waveform having a shape corrected to become close to that of a rectangular wave; and
a correction timing generation means for generating, based on a timing signal that indicates each power level pattern of the emission light waveform, the correction timing pulse that defines a timing for generating the correction signal and supplying the generated correction timing pulse to said emission light waveform correction unit.

* * * * *